US006851086B2

(12) United States Patent
Szymanski

(10) Patent No.: US 6,851,086 B2
(45) Date of Patent: Feb. 1, 2005

(54) TRANSMITTER, RECEIVER, AND CODING SCHEME TO INCREASE DATA RATE AND DECREASE BIT ERROR RATE OF AN OPTICAL DATA LINK

(76) Inventor: Ted Szymanski, 210 Glendonwynne Road, Toronto, Ontario (CA), M6P 3G3

(*) Notice: Subject to any disclaimer, the term of this patent is extended or adjusted under 35 U.S.C. 154(b) by 831 days.

(21) Appl. No.: 09/821,758

(22) Filed: Mar. 30, 2001

(65) Prior Publication Data

US 2002/0053062 A1 May 2, 2002

Related U.S. Application Data

(60) Provisional application No. 60/193,380, filed on Mar. 31, 2000.

(51) Int. Cl.[7] .............................................. H03M 13/00

(52) U.S. Cl. ..................................... 714/781; 714/786

(58) Field of Search ........................... 398/116; 375/142; 714/751, 795, 781, 796; 370/244; 371/40

(56) References Cited

U.S. PATENT DOCUMENTS

| | | | |
|---|---|---|---|
| 4,486,739 A | | 12/1984 | Franaszek et al. .......... 340/347 |
| 4,777,635 A | | 10/1988 | Glover ........................ 371/40 |
| 5,068,854 A | | 11/1991 | Chandran et al. .......... 371/37.1 |
| 5,383,204 A | | 1/1995 | Gibbs et al. ................ 371/37.7 |
| 5,432,630 A | * | 7/1995 | Lebby et al. ................ 398/116 |
| 5,524,218 A | | 6/1996 | Byers et al. ................ 395/309 |
| 5,579,426 A | | 11/1996 | Li et al. ........................ 385/88 |
| 5,581,566 A | | 12/1996 | St. John et al. ............ 371/37.6 |
| 5,606,725 A | | 2/1997 | Hart ............................ 455/5.1 |
| 5,754,563 A | | 5/1998 | White ........................ 371/376 |
| 5,943,361 A | * | 8/1999 | Gilhousen et al. .......... 375/142 |
| 6,031,644 A | | 2/2000 | Utsumi ....................... 359/110 |
| 6,058,499 A | | 5/2000 | Sim ........................... 714/755 |
| 6,070,074 A | | 5/2000 | Perahia et al. ............. 455/430 |
| 6,148,423 A | | 11/2000 | Le Mouel et al. .......... 714/708 |
| 6,438,723 B1 | * | 8/2002 | Kalliojarvi .................. 714/751 |
| 6,507,927 B1 | * | 1/2003 | Kalliojavi ................... 714/795 |
| 6,683,855 B1 | * | 1/2004 | Bordogna et al. .......... 370/244 |

OTHER PUBLICATIONS

Seroussi, G. "A Systolic Reed–Solomon Encoder", IEEE Transactions on Information Theory, vol. 37, No. 4, Jul. 1, 1991, pp 1217–1220.

Neifeld, Mark, A. et al., "Parallel Error Correction Using Spectral Reed–Solomon Codes", Journal of Optical Communications, vol. 18, No. 4, Aug. 1, 1997, pp 144–150.

Toyoo Takata et al., "An Error Control System with Multiple–Stage Forward Error Corrections", IEEE Transactions on Communications, vol. 38, No. 10., Oct. 1, 1990, pp. 1799–1809.

International Searching Authority, "PCT International Search Report for PCT/CA01/00410", Jan. 15, 2002 (date of mailing), p1–2.

ITU–T, Telecommunication Standardization Sector of ITU, G.975, "Series G: Transmission Systems and Media, Digital Systems and Networks—Digital Transmission Systems—Digital Sections and Digital Line System—Optical Fibre Submarine Cable Systems—Forward Error for Correction for Submarine Systems", Oct. 2000, 19 pages.

(List continued on next page.)

Primary Examiner—David Ton

(57) ABSTRACT

Transmitters, receivers, and coding schemes to increase data rate and decrease bit error rate of an optical data link are disclosed. Data is transmitted across the link with a less than nominal bit error rate (BER), by encoding the data using a forward error correction (FEC) code or by requesting retransmission of transmitted packets in error. Data is transmitted at a speed that introduces errors at a rate that is in excess of the nominal BER but that may be corrected using the FEC code or retransmission so that the data may be received with less than the nominal BER. The data rate is increased as the link operating speed is increased beyond the overhead required by the FEC codes or retransmission. High speed FEC encoders and decoders facilitating such transmission are disclosed.

84 Claims, 34 Drawing Sheets

Pipelined majority logic decoder.

OTHER PUBLICATIONS

Lin, Shu, and Costello, Daniel J. Jr., "Error Control Coding Fundamentals and Applications" Prentice–Hall, 1983, Chapter 7 (Majority–Logic Decoding for Cyclic Codes) pp 184–222, Chapter 8 (Finite Geometry Codes) pp 223–256, and Chapter 15 (Automatic–Repeat–Request Strategies) pp 458–497.

Neifeld, Mark, A. et al., "Error Correction for Free–Space Optical Interconnects: Space–Time Resource Optimization", Applied Optics, vol. 37, No. 2, Jan. 1998, pp 296–307.

Szymanski, Ted, "Bandwidth Optimization of Optical Data Links by Use of Error–Control Codes", Applied Optics, vol. 39, No. 11, Apr. 2000, pp 1–15.

Szymanski, Ted, "Error and Flow Control in Terabit Intelligent Optical Backplanes", IEEE Journal of Selected Topics in Quantum Electronics, vol. 5, No. 2, Mar./Apr. 1999, pp 339–352.

Szymanski, Ted, et al., "Terabit Optical Local Area Networks for Multiprocessing Systems", Applied Optics, vol. 37, No. 2, Jan. 1998, pp 264–275.

* cited by examiner 44 feedback shift register

FIG. 11. Pipelined majority logic decoder.

TRANSMITTER, RECEIVER, AND CODING SCHEME TO INCREASE DATA RATE AND DECREASE BIT ERROR RATE OF AN OPTICAL DATA LINK

CROSS-REFERENCE TO RELATED APPLICATIONS

This application claims benefits from US Provisional Patent Application No. 60/193,380 filed Mar. 31, 2000, the contents of which are hereby incorporated by reference.

FIELD OF THE INVENTION

The present invention relates to data transmission, and more particularly to a data transmitter and receiver using an encoding/decoding scheme that allows for the reduction of received errors and therefore facilitates operation of an optical data link at increased speeds and reduced bit error rates. The transmitter and receiver can be integrated onto a single integrated circuit to control a high bandwidth optical data link.

BACKGROUND OF THE INVENTION

Optical data links between computers are becoming more popular as optical technologies mature. However, there is a noticeable absence of "intelligence" that is included in existing optoelectronic devices that deal with data transmission and reception at the physical layer. Typically, existing data links operate at a nominal clock rate of typically 1 GigaHertz (GHz) with a nominal Bit Error Rate (BER) of typically $10^{-12}$, i.e., one bit error per $10^{12}$ bits transmitted. One example of such a requirement specification is described in the standard "High Performance Parallel Interface" (HIPPI) in the document "Information Technology—High-Performance Parallel Interface—6400 Mbit/s Optical Specification (HIPPI-6400-OPT), Working Draft T11.1/Project 1249-D/Rev 1.6", available from the National Committee for Information Technology Standardization. Another relevant document is "Information Technology—High-Performance Parallel Interface—Mechanical, Electrical and Signaling Protocol Specification (HIPPI-PH)", available from the National Committee for Information Technology Standardization. This standard specifies that receivers need not detect errors, and that retransmissions can be requested by an upper-layer protocol.

Other examples of optical data links are described in the IEEE Journal of Selected Topics in Quantum Electronics (JSTQE), which published a special issue on "Smart Photonic Components, Interconnects and Processing", Vol. 5, No. 2, (which was printed sometime after Apr. 21, 1999), which is hereby incorporated by reference. The special issue contains papers describing integrated optoelectronic integrated circuits for several applications.

A parallel optical datalink is described by A. Neyer et al, "Plastic-Optical-Fiber-based parallel Optical Interconnects", JSTEQ, pg. 193. They describe a parallel 8×8 fiber datalink between two integrated circuits. A free-space optical datalink is described by D. A. Louderback et al, "Modulation and Free-Space Link Characteristics of Monolithically Integrated vertical cavity lasers and Photodetectors with Microlenses", JSTQE pg. 157. They describe the process on integrating Vertical cavity Lasers and photodetectors onto CMOS integrated circuits. A parallel link is described by H. Kosada "Smart Integration and Packaging of 2-D VCSEL's for High Speed Parallel Links", JSTQE pg. 184. This paper describes integration and packaging of 2 dimensional arrays of Vertical Cavity Surface Emitting Lasers (VCSELs) and photodetectors. An optoelectronic crossbar switch is described by Walker et. al., "Design and Construction of an Optoelectronic Crossbar Switch Containing a Terabit per second Free-Space Optical Interconnect", JSTQE pg. 236. This paper describes integration of detectors and optical modulators onto a silicon substrate. An optoelectronic computing system is described by McArdle et al, "Optoelectronic Parallel Computer Using Optically Interconnected Pipelined Processing Arrays", JSTQE pg. 250. The devices which are optically interconnected perform logical data processing on the data that passes through them. An optical switch is described by Krishnamoorthy et al, "The AMEBA Switch: An Optoelectronic Switch for Multiprocessor Networking Using Dense-WDM", JSTQE pg. 261. The switch uses multiple quantum well diodes which have been flip chip bonded onto a CMOS substrate; these diodes can act as both detectors and modulators of externally supplied laser beams. This switch is intended to interconnect multiple processors. The above are hereby incorporated by reference.

The aforementioned papers represent the state-of-the-art in "smart photonic components", i.e., components which merge processing with optical transmission technologies. Such technologies include VCSELs and Photodetector Arrays (PDs) which can be flip chip bonded onto CMOS integrated circuits, as described in D. A. Louderback et al, JSTQE pg. 157. One common drawback with all of the aforementioned papers is the lack of error control processing at the lowest level of the protocol hierarchy, i.e., in the CMOS integrated circuits closest to the optical sources and detectors. The prevailing view of the integrated optoelectronics community is that any error control is not required at the lowest levels of the communication hierarchy. The prevailing view of the optical datalink community (i.e., HIPPI) is that any "significant" level of error control is not required at the lowest levels of the communication hierarchy, where a significant level of error control is defined as a requirement of a Bit Error Rate of between $10^{-20}$ and $10^{-30}$. These BERs are approx. one billionth of the raw BERs specified by standards such as HIPPI. Typically, all significant error control processing is migrated up to a higher level of the protocol stack, where it may be performed by software in an "off-line" manner, well after the data has been received.

Schemes used to encode data to allow for the subsequent detection and correction of bit errors are well known and understood. S. Lin and D. J. Costello, "Error Control Coding", Prentice Hall 1983, the contents of which are hereby incorporated by reference describes a variety of such schemes (hereafter "Lin & Costello"). These are typically used for general reliability in the transfer and storage of data and to communicate data across an imperfect channel that may introduce errors into transmitted data.

For example, parity and cyclic redundancy checks ("CRC"s) are often used for error detection ("ED"). Alternatively, forward error correction ("FEC") schemes may be used for the detection and correction of errors within received data. Known (n,k) FEC codes use a n bit vector to encode k actual data bits, while being to able to detect and correct at least some errors within the k data bits.

Most existing FEC schemes, however, are ill suited to the detection and correction of errors at very high speeds. Thus, such schemes are typically not used in optical communications systems, and particularly not at lower layers of any protocols used in optical systems. Primarily, this is because the existing schemes are computationally complex and can therefore not be executed at extremely high speeds typical of such systems. Present hardware implementations of FEC encoders and decoders for such schemes can require large numbers of transistors.

Moreover, conventional wisdom further suggests that use of such FEC codes detracts from available bandwidth across a data link. That is, as error correction/detection codes are added, a higher percentage of nominally available bandwidth is used for overhead, rather than for actual data. As such, conventional error detection schemes used with optical systems typically strive to be simple, adding minimal overhead.

Recent research, as for example detailed in Neifeil and Kostuk, Error Correction For Free Space Optical Interconnects: Space-Time Resource Optimization, Applied Optics, Volume 37, No. 2, January 1998 however, has shown that it may be possible to increase the effective bandwidth of an optical or similar link, by operating the link at a rate higher than its rated bandwidth and compensating for newly introduced errors using Reed-Solomon ("RS") FEC codes. Specifically, as will be appreciated by those of ordinary skill in the art, the rated data rate of a typical link is designed so that the link may be used up to a rated data rate with a nominal raw bit error rate (BER), in the absence of any error correction. Typically, as the link is operated at a higher data rate, the raw BER also increases. So, properly chosen FEC codes could compensate for the increased raw BER. At present, however, operation of high speed links at increased speeds is only a theoretical possibility as the suggested FEC schemes cannot be processed at these increased speeds required by optical links.

In particular, Neifeld and Kostuck demonstrated theoretically data rate improvements by a factor of 2 to 8, although some of the improvement was due to the use of a larger number of optical sources and detectors. If the number of transmitters and receivers is kept fixed, to isolate the effect of the Reed-Solomon code only, the increase in the data rate will be strictly less than 2 and 8 respectively. A hardware implementation of a RS code is described in M. A. Neifeld, and S. K. Sridharan, Parallel Error Correction using Spectral Reed-Solomon Code, Journal of Optical Communications, 17, pp. 525–531, 1997. They demonstrate that 1 cm×1 cm of silicon area is required to process a 77 Gigabit per second (Gbps) datalink, yielding a BER of $10^{-6}$ on the processed data stream.

Therefore, to process a 1 Terabit per second (Tbps) data link using the technique of Neifeild and Kostuck will require 13 separate ICs (1 Tbps/77 Gbps=13). To process a 10 Terabit per second data link will require 130 of these FEC decoder ICs. It is physically impossible to get 10 Terabits of data off of a photodetector array integrated circuit, and into 130 ICs to perform error correction, due to physical constraints on the packaging of the integrated circuit. Integrated circuit packaging constraints are discussed in the "Microelectronics Packaging Handbook", Ed. R. Tummala and E. Rymaszewski, Van Nostrand Reinhold, New York, which is hereby incorporated by reference. Current integrated circuit packages are restricted to have several hundred or thousand electrical I/O pins, which can be clocked at typically less than 1 GHz each, for a total electrical Input/Output bandwidth of less than a few Terabits per second (Tbps). Furthermore, even if it was possible to remove 10 Tbps of data from a photodetector array integrated circuit and process this data over a large number of electronic processing integrated circuits, the BER on the processed data stream will be approx. $10^{-6}$, which is very high.

Conventional FECs such as RS codes typically also require a large amount of time to decode. Attempts to speed up the FEC process have had limited success. Gibbs et. al. U.S. Pat. No. 5,383,204 describes one approach to speed up the Reed Solomon FEC, and illustrates how to reduce the number of clock steps to decode the RS code from approx. 2,300 to 1,100. In many applications such as high speed computer communications, a delay of 1,100 steps would be intolerable.

The existing ED and FEC schemes are inadequate for the next generation of very high capacity optical datalinks, using for example medical Fiber Image Guides to transports hundreds or thousands of optical bits. Fiber Image Guides are described in Yao Li U.S. Pat. No. 5,579,426, "Fiber Image Guide Based Bit-Parallel Computer Interconnect". Consider an optical data link where 1,024 bits of data arrive at every clock tick, with a 10 GHz clock rate, for a total data rate of 10 Terabits per second. Such data links do not exist in real systems. This data rate is several orders of magnitude beyond the data rates of existing optical interconnections.

Furthermore, conventional wisdom suggests that use of Error Detection codes and retransmissions detracts from available bandwidth across a data link.

Accordingly, a new transmission method using relatively computationally simple coding schemes is desirable, that may be used in optical and similar systems, in order to increase the effective bandwidth available on a given link, or to decrease the effective BER on the processed data, or preferably both.

SUMMARY OF THE INVENTION

Therefore, it is an object of the present invention to allow operation of a data link at an increased data rate, while maintaining a specified low BER.

Advantageously, the invention allows a data link to be operated at increased bit rates of between ten and potentially one hundred times as great as with conventional links, when thermal noise is a dominant source of bit errors. The invention can allow a data link to be operated at substantially increased bit rates compared with conventional links, when thermal noise is not a dominant source of bit errors. Moreover, transmitters and receivers embodying the invention may be implemented simply and inexpensively.

In accordance with an aspect of the present invention, there is provided a high-speed pipelined forward error correcting (FEC) encoder, for encoding k bit blocks of data into n bit blocks. Each of the n bit blocks includes one of the k bit blocks of data and (n−k) parity bits. This encoder includes Q latches (Q≧3); and Q−1 combinational logic circuits. Each of the combinational logic circuits is interconnected between two of the latches, to receive an input of at least k bits from an upstream one of the latches, and provide an output of n bits to a downstream one of the latches. Each output includes (n−k) output bits representing the (n−k) parity bits in various stages of computation. Each of the combinational logic circuits is arranged to compute the (n−k) output bits in accordance with a defined generator polynomial. The defined generator polynomial is identical for each of the combinational logic circuits.

In accordance with another aspect of the present invention, there is provided a method of encoding k bit blocks of data into n bit blocks. Each of the n bit blocks comprising one of the k bit blocks of data and (n−k) parity bits. The method includes providing the k bits to a first latch; feeding the k bits through Q−1 pipeline stages, with each of the pipeline stages, receiving at least k bits; computing (n−k) output bits representing the (n−k) parity bits in various stages of computation, in accordance with a defined generator polynomial, with the defined generator polynomial being identical for each of the pipeline stages; latching its (n–k) output bits; and providing its (n–k) output bits.

In accordance with yet another aspect of the present invention, there is provided a high-speed pipelined forward error correcting encoder, for encoding k bit blocks of data into n bit blocks. Each of the n bit blocks includes one of the k bit blocks of data and (n–k) parity bits. The encoder includes Q latches, $Q \geq 3$; and Q–1 combinational logic circuits. Each of the combinational logic circuits is interconnected between two of the latches, to receive an input of at least the k data bits from an upstream one of the latches, and provide an output including the k data bits and at least one additional bit representing the (n–k) parity bits in various stages of computation, to a downstream one of the latches. The Q–1 combinational logic circuits are arranged to compute the (n–k) parity bits in Q–1 stages.

In accordance with another aspect of the present invention, a method of transmitting data across a data link with a less than nominal bit error rate (BER), includes encoding the data using a pipelineable BCH forward error correction (FEC) code. Forward error correctable data is transmitted within a bit stream across the link at a speed that introduces errors at a rate that is in excess of the nominal BER but that allows for correction of errors so that the data may be received with less than the nominal BER.

In accordance with another aspect of the present invention, there is provided a transmitter for transmitting data across a data link with a less than nominal bit error rate (BER). The transmitter includes a forward error correcting (FEC) encoder for encoding the data using a pipelineable majority logic decodable code to form forward error correctable data; and an output stage for outputting this data within a bit stream across the link at a speed that introduces errors into the stream at a rate that is in excess of the nominal BER but that allows for correction of errors within the data so that it may be received with less than the nominal BER.

In accordance with another aspect of the present invention, there is provided, a pipelined FEC decoder for decoding k data bits from an n-bit block of bits, encoded with an (n,k) FEC code. The decoder includes Q latches ($Q \geq 3$) and Q–1 combinational logic circuits. Each of the combinational logic circuits is interconnected between two of the latches, to receive an input of at least k bits representing the k data bits in various stages of decoding from an upstream one of the latches. Each circuit provides an output including k bits to a downstream one of the latches. The Q–1 combinational logic circuits are arranged to decode the k data bits in Q–1 stages.

In accordance with yet another aspect of the present invention, there is provided, a pipelined FEC decoder for decoding a k-bit datablock from an n-bit datablock encoded with an (n,k) majority-logic decodable FEC code. The decoder includes Q stages of latches and Q–1 combinational logic circuits. Each latch has n data bits. Each of the combinational logic circuits is interconnected between two of the latches, to receive an input of at least k bits representing the k data bits in various stages of decoding from and provide an output comprising k bits. Each of the Q–1 combinational logic circuits includes a majority logic gate; As well, the Q–1 combinational logic circuits are arranged to decode the k data bits in Q–1 stages.

In accordance with an additional aspect of the present invention, there is provided a pipelined FEC decoder for decoding a k-bit datablock from an n-bit datablock encoded with an (n,k) majority-logic decodable FEC code. The decoder includes: Q stages of latches, and Q–1 combinational logic circuits. Each of the latches has n data bits. Each of the combinational logic circuits is interconnected between two of the latches, to receive an input of at least k bits representing the k data bits in various stages of decoding, and provide an output including k bits to a downstream one of the latches. If the Q–1 combinational logic circuits were connected in series without the latches they would form at least one majority logic gate.

In accordance with yet another aspect of the present invention, there is provided an optical communications system comprising a transmitter; a receiver and an optical link communicatively coupling the transmitter to the receiver. The transmitter, includes a forward error correcting (FEC) encoder for encoding data using a pipelineable BCH error correcting code to form forward error correctable data; an output stage for outputting the forward error correctable data within a bit stream across the link. The output stage operates at a power and a speed in excess of a first nominal rate, so that errors are introduced in the stream and received at the receiver at a BER that is in excess of a nominal BER. The receiver includes a pipelined FEC decoder, operable to correct errors within the forward error correctable data from the receiver using the BCH error correcting code, so that the data may be received with less than the nominal BER, and at a data rate above the first nominal rate. This increases the capacity of the optical link at the operating power of the transmitter.

In accordance with another aspect of the present invention, there is provided an optical transmitter including a buffer for buffering received data; a packet former for encoding data from the buffer into packets; an error detection (ED) encoder adding error detection codes to the packets, an electrical to optical (E/O) generator in communication with the ED encoder to receive data from the ED encoder and produce at least one optical output signal corresponding thereto for transmission across an optical link and receipt as at least one received optical signal. The error detection codes allowing detection of at least one error in a packet. The optical generator operates at a clock rate in excess of a nominal clock rate, and at a power level that causes errors to be introduced into the at least one received optical signals that are in excess of a first bit error rate (BER). A controller is in communication with the buffer to cause retransmission of the retransmission blocks within the buffer in response to retransmission requests, so that data may be received at a data rate in excess of the nominal clock rate with less than a second BER.

An optical transmitter comprising an input for receiving data to be transmitted, comprising a buffer for buffering received data; a packet former for encoding data from the buffer into packets, a plurality of error detection (ED) encoders adding error detection codes to the packets; at least one electrical to optical (E/O) generator in communication with the plurality of encoders to receive data from the encoders and produce at least one optical output signal corresponding thereto for transmission across an optical link and receipt as at least one received optical signal. The error detection codes allow detection of at least one error in a packet. The optical generator(s) operates at a nominal clock rate and at a power level that causes errors to be introduced into the received optical signal(s) that are in excess of a first bit error rate (BER). A controller is in communication with the buffer to cause retransmission of packets within the buffer in response to retransmission requests, so that data may be received with less than a second BER, at a data rate in excess of the nominal clock rate.

In accordance with another aspect of the present invention, there is provided an optical receiver comprising an optical to electrical (O/E) regenerator, for receiving an optical stream from a transmitter and generating a corresponding electrical stream; an error detection (ED) decoder for decoding data from the electrical stream generating a decoded data stream, and detecting errors in the decoded stream; a retransmission request controller in communication with the ED decoder for generating retransmission requests for requesting retransmission of retransmission blocks to be retransmitted by the transmitter within the optical stream. The regenerator, the decoder, the retransmission request controller are formed on a single integrated circuit.

In accordance with another aspect of the invention, an optical receiver includes an optical to electrical (O/E) regenerator for receiving an optical stream from a transmitter and generating a corresponding electrical stream. The optical stream containing bit errors at a first bit error rate (BER). The optical receiver includes a pipelined error detection (ED) decoder for decoding data from the electrical stream, generating a decoded data stream, and detecting errors in the decoded data stream. A retransmission request controller is in communication with the ED decoder and generates retransmission requests for requesting retransmission of retransmission blocks to be retransmitted by the transmitter within the optical stream, so that data may be received from the optical stream with a second BER, less than the first BER.

In accordance with another aspect of the invention, an optical transmitter includes an input for receiving data to be transmitted; a buffer for buffering received data; a packet former for encoding data from the buffer into retransmission blocks, an error detection (ED) and an encoder adding error detection codes to the retransmission blocks. The ED codes allow detection of at least one error in a retransmission block. A forward error correction (FEC) encoder further adds forward error correction codes to the retransmission blocks including the ED codes. The FEC codes allow detection and correction of at least one error in a retransmission block. An electrical to optical (E/O) converter in communication with the FEC encoder receives the retransmission blocks including the ED codes and the FEC codes from the FEC encoder and produces an optical output corresponding thereto. A controller in communication with the buffer causes retransmission of the retransmission blocks in response to retransmission requests.

In accordance with another aspect of the present invention, an optical transmitter includes an input for receiving data to be transmitted; a buffer for buffering received data; a controller; a packet former for encoding data from the buffer into retransmission blocks, a pipelined error detection (ED) encoder adding error detection codes to the retransmission blocks, a forward error correction (FEC) encoder adding forward error correction codes to the retransmission blocks including ED codes; an electrical to optical (E/O) generator in communication with the FEC encoder to receive retransmission blocks from the FEC encoder including FEC and ED codes and to produce at least one optical output signal corresponding thereto for transmission across an optical link and receipt as at least one received optical signal. The error detection codes allow detection of at least one error in a retransmission block. The FEC codes allow detection and correction of at least one error in a retransmission block. The optical generator operates at a clock rate that causes errors to be introduced into the received optical signal that are in excess of a first bit error rate (BER). The controllers, in communication with the buffer causes retransmission of the retransmission blocks in response to retransmission requests, so that data may be received with less than a second BER.

In accordance with another aspect of the present invention, an optical receiver includes an optical to electrical (O/E) regenerator, for receiving an optical stream from a transmitter and generating a corresponding electrical stream; a forward error correction (FEC) decoder for decoding data from the electrical stream generating a first decoded data stream, an error detection (ED) decoder for decoding data from the first decoded data stream generating a second decoded data stream; a retransmission request controller in communication with the ED decoder for generating retransmission requests for requesting retransmission of retransmission blocks to be retransmitted by the transmitter within the optical stream.

In accordance with yet another aspect of the present invention, an optical receiver includes an optical to electrical (O/E) regenerator, for receiving an optical stream from a transmitter and generating a corresponding electrical stream, the optical stream containing bit errors at a first bit error rate (BER); a forward error correction (FEC) decoder for decoding data from the electrical stream and generating a decoded data stream, an error detection (ED) decoder for decoding data from the first decoded data stream; a retransmission request controller in communication with the ED decoder for generating retransmission requests for requesting retransmission of retransmission blocks to be retransmitted by the transmitter within the optical stream, so that data may be received from the optical stream at a second BER, less than the first BER.

In accordance with yet another aspect of the present invention, an opto-electronic switch is formed on an integrated circuit substrate. The switch includes a plurality of optical receivers, each of the optical receivers comprising an optical regenerator in communication with a pipelined FEC decoder for decoding a received data stream; a plurality of optical transmitters, each of the transmitters includes an optical generator and a pipelined forward error correcting code (FEC) encoder, for encoding an output datastream to include FEC codes. An electric switch fabric is in communication with the plurality of receivers and the plurality of transmitters, to switch FEC decoded data from selected ones of the receivers to selected ones of the transmitters, for transmission as FEC encoded data.

Other aspects and features of the present invention will become apparent to those of ordinary skill in the art, upon review of the following description of specific embodiments of the invention in conjunction with the accompanying figures.

BRIEF DESCRIPTION OF THE DRAWINGS

In figures which illustrate by way of example, embodiments of the present invention:

FIG. 25a illustrates the number of packet retransmission attempts versus link frequency.

FIG. 25b illustrates the effective data rate versus link frequency.

FIG. 25c illustrates the Packet Error Rate (PER) versus link frequency.

FIG. 26a illustrates the effective data rate versus link frequency.

FIG. 26b illustrates the Packet Error Rate (PER) versus link frequency.

FIG. 27a illustrates the effective data rate versus link frequency.

FIG. 27b illustrates the Packet Error Rate (PER) versus link frequency.

FIG. 28a illustrates the effective data rate versus link frequency.

FIG. 28b illustrates the Packet Error Rate (PER) versus link frequency.

FIG. 29a illustrates the effective data rate versus link frequency.

FIG. 29b illustrates the Packet Error Rate (PER) versus link frequency.

FIG. 30a illustrates the effective data rate versus link frequency.

FIG. 30b illustrates the Packet Error Rate (PER) versus link frequency.

FIG. 31a illustrates the effective data rate versus link frequency.

FIG. 31b illustrates the Packet Error Rate (PER) versus link frequency.

FIG. 32a illustrates the effective data rate vs. link frequency.

FIG. 32b illustrates the Packet Error Rate (PER) vs. link frequency.

DETAILED DESCRIPTION

Figure 1:
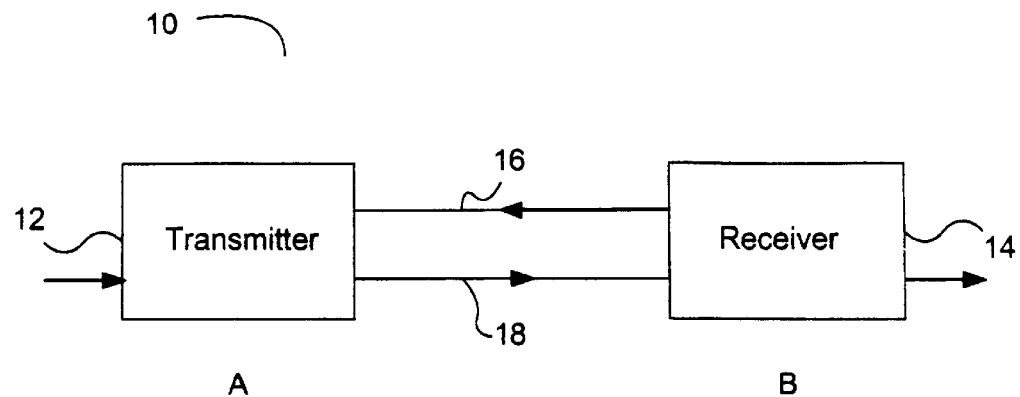
FIG. 1 is a simplified block schematic diagram of a communications system, exemplary of an embodiment of the present invention.

FIG. 1 illustrates a communications system 10, exemplary of an embodiment of the present invention. System 10 includes exemplary transmitter 12 at A and receiver 14 at B, coupled by forward data link 16, and optionally by reverse data link 18. Preferably system 10 is an optical communications system. As such, transmitter 12 and receiver 14 may be optical transmitters exemplary of embodiments of the present invention. Forward and reverse links 16, 18 are preferably fibre optic links connecting transmitter 12 and receiver 14. As will become apparent forward link 16 carries traffic from transmitter 12 to receiver 14, while reverse link 18 may carry traffic from receiver 14 to transmitter 12. As will be appreciated by those of ordinary skill, forward link 16 and reverse link 18 may be formed on a single physical link, and may for example be separate channels of a wavelength division multiplexed fibre link. Most preferably, forward link 16 may be a bit parallel fiber ribbon, as described for example by IBM, Motorola, Hewlett Packard or Infineon. Alternatively, forward link 16 may be a Fiber Image Guide as described in the U.S. patent by Y. Li. Fiber Image Guides can transport dense 2 dimensional arrays of optical signals. As will become apparent, system 10 could, for example, be used as conventional communications system, or as a data link of another system such as a computing system. For example, system 10 may represent a high bandwidth link between the I/O systems of two computers, allowing them to transfer Gigabits of data per second. Alternatively, system 10 could represent two terminals attached to a transparent optical network linking many terminals, and using wavelength division multiplexing (WDM) to support communications between many terminals simultaneously.

For clarity of description, only a transmitter from A to B has been illustrated. A similar transmitter at B transmitting to A and a corresponding receiver at A may exist and has not been illustrated.

Figure 2:
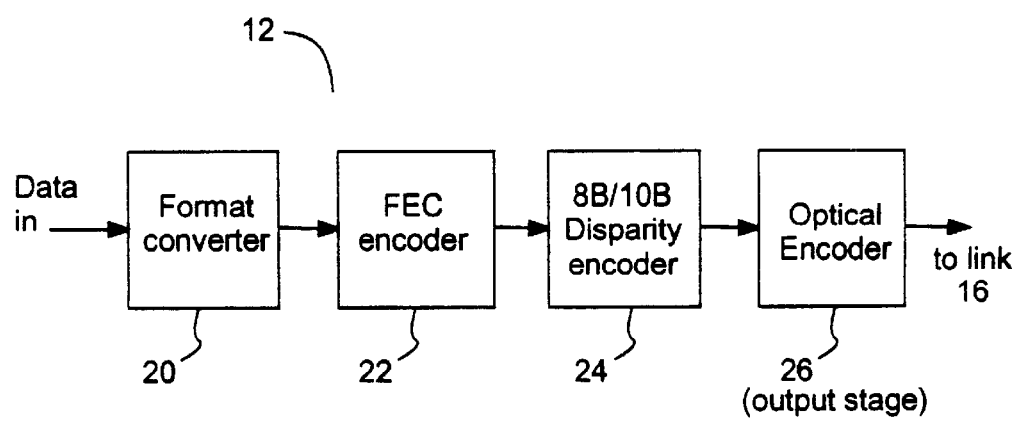
FIG. 2 is a simplified block diagram of an exemplary transmitter for use in the system of FIG. 1.

A simplified block diagram of a first exemplary transmitter 12 is illustrated in FIG. 2. As illustrated, transmitter 12 preferably includes a format converter 20 communicatively coupled to a pipelined FEC encoder 22 coupled to a disparity encoder 24 coupled to an output stage 26. Output stage 26 is preferably a digital electrical-to-optical (E/O) generator. Output stage 26 may include an amplification stage and one or more laser diodes, used to generate an optical signal to be carried by link 16. Optionally, there may be an additional format converter (not shown) located between 22 and 24.

As will become apparent, FEC encoder 22 of transmitter 12 preferably generates encoded vectors of data at the GigaHertz clock rates, as may be necessary when transmitter 12 is used with a very high speed link, such as bit parallel optical data links or a very high speed bit-serial optical data links.

FEC encoder 22 may use any one of number of existing encoding techniques. However, existing encoding techniques generally are unable to efficiently encode data at these rates. For example, it has been recognized that known "cyclic codes" can be efficiently processed using bit-serial processing. Bit-serial algorithms process one bit per clock cycle, typically requiring many clock cycles to complete a task. Cyclic codes are described in Lin & Costello, pages 85–140. A special class of cyclic codes called BCH codes are described on pages 141–183.

However, the throughput of typical hardware implementations of such cyclic codes are generally limited by the bit-serial nature of the processing; bits are processed one bit per clock cycle. In addition in such typical implementations, the processing to be performed per clock cycle can be quite large. As a result, such circuits introduce propagation delays attributable to tens or possibly hundreds of logic gates, resulting in a slow clock. The combination of a large number of serial steps in conjunction with a slow clock can result in a low throughput.

Figure 3:
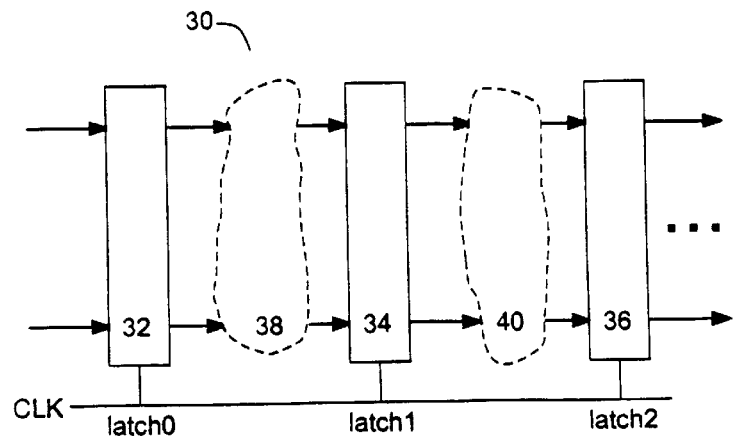
FIG. 3 is a simplified block diagram generically illustrating a pipelined circuit.

In order to encode data at the desired rates, FEC encoder 22 is preferably formed as a pipelined computational circuit 30 as generically illustrated in FIG. 3. As understood by those of ordinary skill in the art, such a pipelined computational circuit 30 preferably includes a plurality of latches such as latch0 32, latch1 34, and latch2 36. A pipelined circuit may be formed using three or more such latches. Circuit 30 can accept a single new bit parallel operand per clock transition, and propagates computed latch outputs at each clock transition in order to generate a new result per clock transition. A pipelined circuit 30 will store several partially computed results internally within its latches. Operands may thus remain within a pipelined circuit for several clock cycles before being computed and ejected. Circuit 30 of FIG. 3 thus accepts new operands at latch0 32 upon each clock transition, and presents these at its outputs several clock transitions later. Combinational logic 38 interconnects latch0 32 with latch1 34. Latch1 34, in turn, accepts the new operands from latch0 32 as modified by combinational logic 38 on the next clock transition. Outputs of latch1 34 similarly propagate to latch2 36 by way of combinational logic 40. As will be appreciated, the maximum operating speed of a pipelined circuit is governed by the longest delay through the combinational logic interconnecting latches, such as latch0, latch1 and latch2. This is typically referred to as the "critical path" for the combinational logic circuit.

Figure 4:
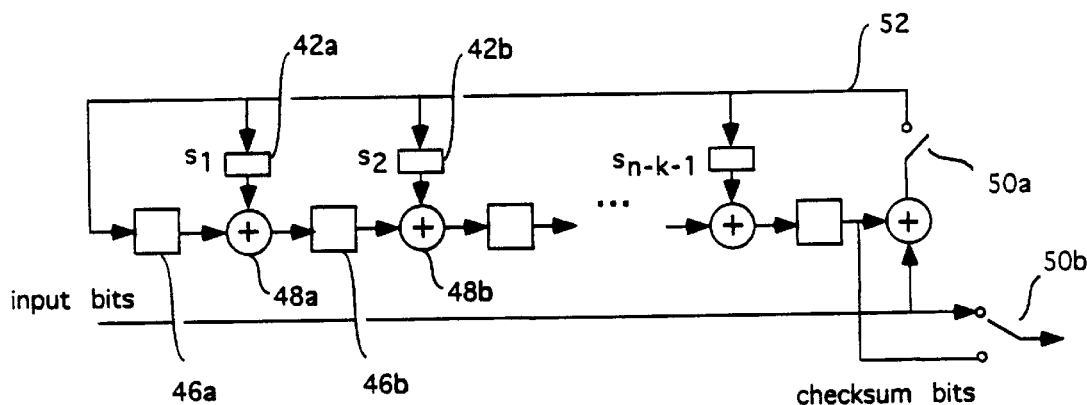
FIG. 4 is a simplified block diagram generically illustrating a bit-serial encoding circuit for a cyclic code.

Cyclic codes, however, also lend themselves to being implemented as pipelined circuit. This may be better understood with reference to FIGS. 4 and 5. FIG. 4 illustrates the general structure of a bit-serial encoder for an (n,k) cyclic code with generator polynomial $g(X)=1+g_1 X+g_2 X^2+ \ldots +g_{n-k-1}X^{n-k-1}+X^{n-k}$. Any switch $s_i$ 42 can be omitted from FIG. 4 if the coefficient $g_i$ in the generator polynomial is 0; i.e., if the coefficient $g_i$ is 0 then switch $s_i$ 42 represents an open-switch; if the coefficient $g_i$ is 1 then switch $s_i$ 42 represents a wire or closed switch. If a switch $s_i$ 42 is open, then the XOR gate beneath it performs no function and it can be replaced by a wire as well. The feedback shift register 44 consists of (n−k) one bit latches 46 and several XOR gates 48 (or modulo-2 adders). To encode a k bit data vector, the k input bits are entered bit-serially into the feedback shift register 44, one bit per clock tick, from the left. The gate 50a is enabled so that the data is fed back into the feedback shift register 44 via feedback connection 52. The gate 50b is enabled so that the unencoded data bits are also output. After the last bit has been entered, the (n−k) bits left in the feedback shift register 44 represent the checksum or parity bits. The gate 50a is disabled to break the feedback connection 52, the gate 50b is set to select the checksum bits, and the checksum bits are then shifted out of the feedback shift register 44. The bit-serial encoder requires n clock cycles to encode a k bit data vector, yielding an n bit encoded vector. Note that n,k=(n,k). FIG. 4 is an example of a Linear Feedback Shift Register (LFSR).

Figure 5:
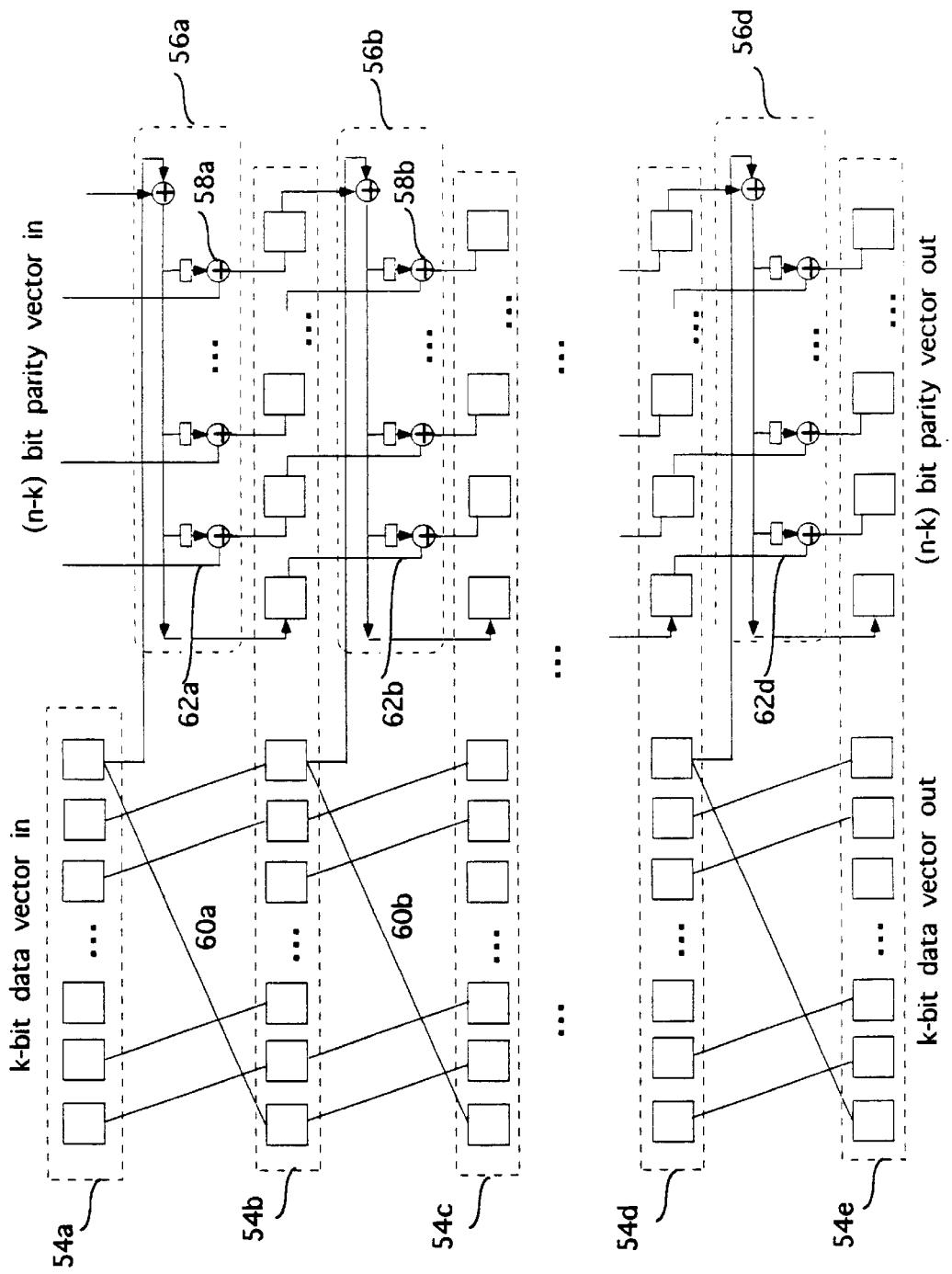
FIG. 5 is a simplified schematic of an exemplary pipelined FEC encoder, for use in the transmitter of FIG. 2.

In contrast, FIG. 5 illustrates a proposed pipelined encoder for the same (n,k) cyclic code. The k data bits enter the circuit in parallel from the top. The circuit has k+1 sets of pipeline latches 54. Pipeline latch 0 54$a$ stores the initial k bit vector to be encoded. Pipeline latches i 54$b$–54$e$ ($1 \leq i \leq k$) store the k bit vector to be encoded in the leftmost k bits, and the (n–k) parity bits, in various stages of computation, in the rightmost (n–k) bits, of the n bit latch. The circuit has combinational logic blocks 56 in between adjacent pairs of pipeline latches 54. A pipeline latch 54 and the combinational logic block 56 following it constitute a pipeline stage. Each pipeline stage i processes bit i of the input vector ($0 \leq i < k$). The (n–k) parity bits in in the rightmost (n–k) bits of a pipeline latch i 54 in FIG. 5 represent the contents of the feedback shift register 44 shown in FIG. 4, after the i-th bit has been loaded in ($0 \leq i < k$). In FIG. 5, during each clock transition data moves from pipeline latch i to pipeline latch i+1 in an appropriate manner, for $0 \leq i < k$. When moving from pipeline latch i to pipeline latch i+1, the k data bits in leftmost positions of pipeline latch i are circularly shifted one bit position to the right by wires 60 connecting the two pipeline latches. The rightmost bit of these k bits in latch i 54$a$ is therefore mapped to the leftmost bit position of these k bits in latch i+1 54$b$. Similarly, the (n–k) bits in in the leftmost (n–k) positions are processed by the combinational logic 56 and circularly shifted one bit position to the right by wires 62 connecting the (n–k) parity bits in pipeline stage i 56 to the (n–k) parity bits in the successive pipeline stage. As should be apparent, this circuit contains no feedback connections: in every clock transition data moves forward from pipeline latches i to pipeline latches i+1.

As will now be appreciated, this pipelined circuit operates on numerous independent data vectors simultaneously, and each pipeline latch 54 has a partially computed result. After the data passes through the k pipeline stages and is residing in pipeline latch k 54$e$ the data processing is complete, and an encoded vector is ejected from the circuit in a bit parallel manner.

The pipelined circuit is ideally suited to encode a large number of data vectors, with a very high throughput. Suppose the pipeline is initially empty. Unencoded vectors enter the circuit from the top, one vector per clock cycle. Valid data starts exiting from the pipeline after k clock cycles. Thereafter, a valid encoded vector is ejected per clock cycle, until the pipeline is empty.

The critical path of a pipelined circuit can be defined as the slowest path through combinational logic between two pipeline stages. In FIG. 5 the critical path corresponds to a single 2-input XOR gate 58. Assume an exemplary CMOS integrated circuit technology with for example a 0.35 micron minimum feature size. A typical 2-input XOR gate may have a delay of 0.3 nanoseconds, a 2-input AND or OR gate may have a delay of 0.1 nanoseconds. Assume the pipeline latches (54,56) have a setup and hold time and a propagation delay of 0.1 nanoseconds, which must be included in every critical path calculation. Assuming the delay of the 2-input XOR gate is 0.3 nanoseconds, the critical path is approx. 0.4 nanoseconds and this circuit can be clocked at approx. 2.50 GHz, i.e., in the steady state a newly encoded vector is ejected from the pipeline every 0.4 nanoseconds. These estimates hold for a typical 0.35 micron CMOS technology. Using a smaller CMOS technology, i.e., a 0.18 micron technology, the gate delays should decrease by a factor of approximately 2 or 4, enabling faster operation.

The number of pipeline latches 54 in the pipeline of FIG. 5 can be adjusted to a desirable value. It is possible to remove appropriate pipeline latches 54, so that the combinational logic between adjacent pipeline latches 54 performs more processing and incurs a greater delay. This approach can be employed to "slow-down" a pipeline when necessary to interface to a slower link, and it also saves hardware latches 54. For example, in FIG. 5 it is possible to remove all odd numbered pipeline latches, except the first and last stages. The two combinational logic blocks immediately before and after a removed pipeline latch must be interconnected in an appropriate manner, so as to perform the desired processing. In this manner, a k stage pipeline implementing a pipelined (n,k) cyclic encoder, can therefore be transformed to a k/m stage pipeline, for integer m.

FEC encoder 22 is further preferably formed to encode relatively small groups of bits, since FEC codes generally become difficult to decode for large numbers of bits. Moreover, as will be appreciated, not all known FEC codes may be decoded using pipelined combinational circuits. The well known Reed-Solomon codes can be encoded using a digit-serial circuit as shown in FIG. 4, with the exception that the switches si 42 are replaced by a multiplier that multiplies a field element from GF($2^m$) by a fixed element from the same field, as discussed in Lin and Costello on page 173. Furthermore, the XOR gates 48 in FIG.4 are replaced by an adder that adds two elements from GF($2^m$). Therefore, the proposed pipelined cyclic encoder in FIG. 5 can also be used to encode RS codes, when the same substitutions are implemented. However, RS codes are difficult to decode, often requiring a variable number of steps in time. For example, U.S. Pat. No. 5,383,204 describes a RS decoder which takes 2,300 steps to decode 110 bytes, which was further reduced to 1,100 steps. A pipelined RS decoder would however be expensive to construct and would incur considerable delay.

FEC codes that can be implemented using a simple pipelined computational circuit will be referred to as pipelinable FEC codes. Advantageously, use of such codes and associated circuits allows FEC codes to be operated at extremely high speeds, incurring predictable delays.

Since the FEC codes and associated FEC encoder 22 are preferably fully pipelined, they generate a vector of encoded data per clock cycle in the steady state. As such FEC encoder 22 preferably has a relatively small latency; the total time required to encode an k-bit data vector is of the order of k clock cycles for a k stage pipeline. More importantly, once the first encoded vector leaves the pipeline, a new encoded vector will leave the pipeline in every clock cycle, until the pipeline is emptied. This delay is much shorter than the hundreds or potentially thousands of clock cycles required for the decoding of more complex Reed-Solomon codes. Furthermore, because each stage of the pipeline is a relatively small circuit requiring a relatively small number of transistors and VLSI real estate, a pipelined encoder can be implemented on a modern integrated circuit with relatively low hardware cost. The cost of the proposed pipelined encoders is likely negligible for a modern integrated circuit. In addition, because the amount of processing within each stage is relatively small, the critical path delays in the circuits are small, resulting in a fast clock rate. Hence the delay of the proposed pipelined encoders is likely negligible for a modern integrated circuit. For more complex cyclic codes which perform more processing in a single clock cycle, additional pipeline stages can be added to keep the critical path within any pipeline stage to a desired value, thereby ensuring a fast clock rate.

Cyclic codes represent large family of codes with many subsets. For example, single error detecting Hamming codes can be achieved using cyclic codes. So, for example, a cyclic (7,4) single error detecting Hamming code can be achieved using a generator polynomial $G(X)=1+X+X^3$. There are many other types of Hamming codes which can be encoded using the pipelined cyclic encoder.

Similarly, the binary primitive BCH codes are a subset of cyclic codes with very good error correction capability. These BCH codes are specified by their generator polynomials, and a table enumerating the generator polynomials for all such codes of lengths up to 1023 bits is included in Lin & Costello, Appendix C, page 583–598.

There are a few small BCH codes which are very effective for use in high speed data links, and in FEC encoder 22. For example, (15,11), (15,7) and (15,5) BCH codes can detect and correct up to 1, 2, and 3 bit errors in a 15 bit code word respectively. The (31,16) and (31,11) BCH codes can detect and correct up to 3 and 5 bit errors in a 31 bit code word respectively. All of these codes and other cyclic codes can be encoded in hardware with exceptionally high throughput using a pipelined FEC encoder. The notation (n,k,t) will occasionally be used to denote a (n,k) code which can correct up to t bit errors in the n bit encoded vector. Hence, the (15,5,3) notation refers to a (15,5) BCH code which can correct up to 3 bit errors.

Referring to FIG. 2, now as will be appreciated, format converter 20 preferably takes as input a data stream and formats it into n bit data vectors, compatible with FEC encoder 22. That is format converter takes a bit (or parallel bit) stream and provides a k bit parallel output provided to FEC encoder 22. Preferably, format converter 20 provides k bits each clock transition, so that a k bit data vector may be loaded into FEC encoder 22 at each clock cycle of the clock driving FEC encoder 22. Similarly, n output bits, representing the encoded input data, may be unloaded from FEC encoder 22, one or more clock cycles later. As will be appreciated, FEC encoder 22 may include a plurality of pipelined FEC bit-parallel encoders of FIG. 5, operating in parallel to achieve a higher throughput. As such, multiple groups of k bit data vectors may be encoded simultaneously.

There is an alternative embodiment of FEC encoder 22. FEC encoder 22 may consist of a plurality of bit-serial cyclic encoders of FIG. 4. For example, to encode a k bit vector, FEC encoder 22 may contain k bit serial encoders from FIG. 4 operating in parallel. In this embodiment, it takes n clock cycles to encode a set of n k-bit data vectors. Therefore, data bits cannot be supplied to FEC continuously, as n−k clock cycles will be required to empty the plurality of bit-serial encoders.

Referring to FIG. 2, output of FEC encoder 22 is provided to an output stage 26 that preferably provides an optical signal(s) representing the digital output of FEC encoder 22 to optical link 16. Optionally, a disparity encoder 24 may be interposed between the output of FEC encoder 22 and output stage 26. In addition, optionally another format converter 20 (not shown) may be interposed between FEC encoder 22 and output stage 26. As understood by one of ordinary skill, disparity encoder 24 may add overhead to the output of FEC encoder 22 so as to reduce the DC component of the output of encoder 24. Disparity encoders break up long strings of 0's and 1's, so that over any short period of time, the number of 1's transmitted is very close to the number of 0's transmitted. Suitable disparity encoders that may be used as disparity encoder 24 are, for example, detailed in U.S. Pat. No. 4,486,739, Byte oriented DC balanced 8B/10B partitioned block transmission code, the contents of which are hereby incorporated by reference.

Alternatively, a disparity encoder can consist of an LFSR with a generator polynomial chosen to generate a pseudorandom set of bits, as shown in FIG. 4.

As will be appreciated, the optical signals at output stage 26 in FIG. 2 may be output as a serial or parallel optical stream. As will be appreciated, in synchronous operation, the bit rate of the output of optical encoder governs the operating frequency of FEC encoder 22, and therefore limits the rate at which data should be provided to converter 20.

For example, if link 16 is a 10-bit parallel fiber ribbon operating at a clock frequency of 10 GHz, the aggregate data rate is 100 Gbps. FEC encoder 22 should generate encoded data at approximately the same rate. Assuming FEC 22 encodes a (31,16) BCH code, to achieve a data rate of 100 Gbps the FEC clock rate should be approx. 100 Gbps/31 bits=3.23 GHz. Disparity encoder 24 may consume some link bandwidth, which may lower the data rate by 10% or 20%. If link 16 is a 1,024 bit data link with a clock rate of 10 GHz, using for example 2 dimensional optical transmissions over fiber image guides, the aggregate data rate is 10 Terabits per second. In this case, a plurality of pipelined FEC encoders 22 can be used to encode the data at such high throughputs.

Figure 6:
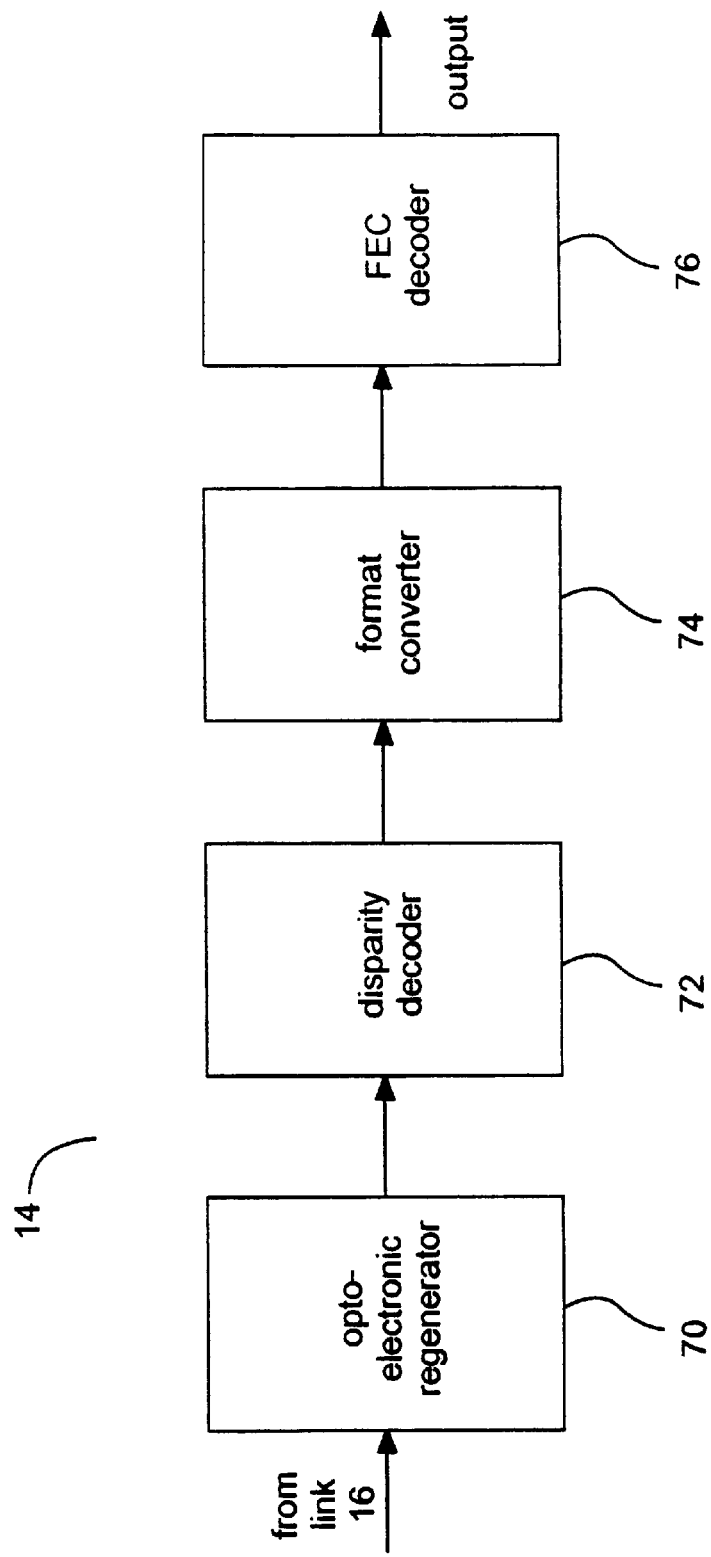
FIG. 6 is a simplified block diagram of an exemplary receiver for use in the system of FIG. 1.

An exemplary complementary receiver 14 is illustrated in FIG. 6. As illustrated, receiver 14 includes an optoelectronic (O/E) regenerator 70 that receives an optical stream from transmitter 12 by way of link 16 (FIG. 1), and regenerates equivalent electric signals. These signals are then provided to FEC decoder 76, optionally by way of disparity decoder 72 and format converter 74. Optoelectronic regenerator 70 is preferably a conventional optical photodetector or photodetector array. Photodetector arrays for parallel fiber ribbons are manufactured by Infineon, Germany. Photodetector arrays are also described in the JSTQE issue, Vol. 5, No. 2. Metal-Semiconductor-Metal (MSM) photodetectors are often used as photodetectors. Reversed-biased PIN diodes are also used as photodetector arrays. Signals from these detectors are usually amplified by electronic amplifiers to regenerate digital electronic signals, which can be sampled. Typical Detectors and amplifiers are described by Woodworth et al in the JSTQE Issue, page. 146, entitled "1 Gb/s Integrated Optical Detectors and Receivers in Commercial CMOS Technologies". Disparity decoder 72, if used, may be a disparity decoder complementary to disparity encoder 24 used at transmitter 12 (FIGS. 1, 2). Again, suitable disparity decoders are detailed in U.S. Pat. No. 4,486,739. If necessary, an optional, format converter 74 may convert output of disparity encoder 72 to for suitable input vectors to FEC decoder 76. For example, for an (n,k) FEC decoder, format converter 74 may provide n bit vectors of encoded data to the inputs to FEC decoder 76.

Decoding of FEC codes is generally considerably more complex than encoding of FEC codes. In fact, for many complex FEC codes the decoding process takes a variable number of steps, with a varying degree of computation per step. Hence, it is generally difficult to obtain high throughput FEC decoders with low hardware cost.

FEC decoder 76 is also preferably a pipelined electronic circuit, complementary to FEC encoder 22. It will now be established that a pipelined decoder for certain classes of BCH codes exist.

Figure 7:
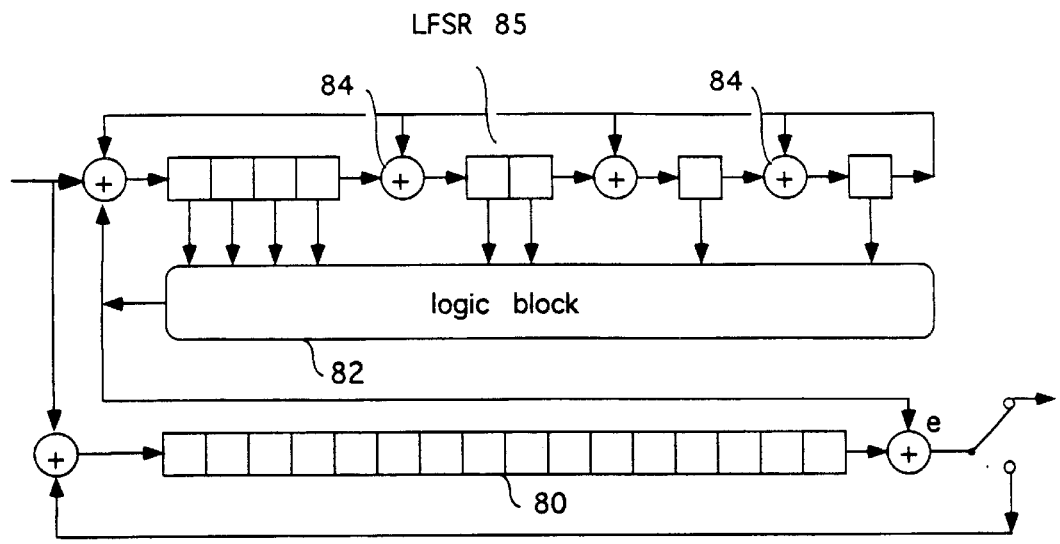
FIG. 7 is a simplified block diagram illustrating a conventional bit-serial cyclic FEC decoder circuit.

FIG. 7 illustrates the general structure of a bit-serial cyclic decoder, applied to a BCH (15,7) code that may be used in FEC decoder 76. Decoders for other cyclic codes are similar, however, the pattern of XOR gates 84 in the linear feedback shift register 85 is determined by the generator polynomial. The decoder also consists of a shift register 80 for storing the vector to be decoded. Exemplary logic within the "logic block" 82 can be determined from the generator polynomial; several techniques are described in Lin and Costello. In some special cases, the logic block 82 contains only combinational logic gates, In other cases, the logic block may contain smaller LSFRs. These conventional bit-serial decoders can be pipelined, following the technique illustrated for pipelining the encoders in FIG. 5. However, if the logic block 82 in FIG. 7 contains LSFRs, in the pipelined version there will have to be 2 clocks; one for clocking data between the pipeline latches 0 . . . K, and another clock for clocking the LSFRs while the pipelined data remains unmoved.

Figure 8:
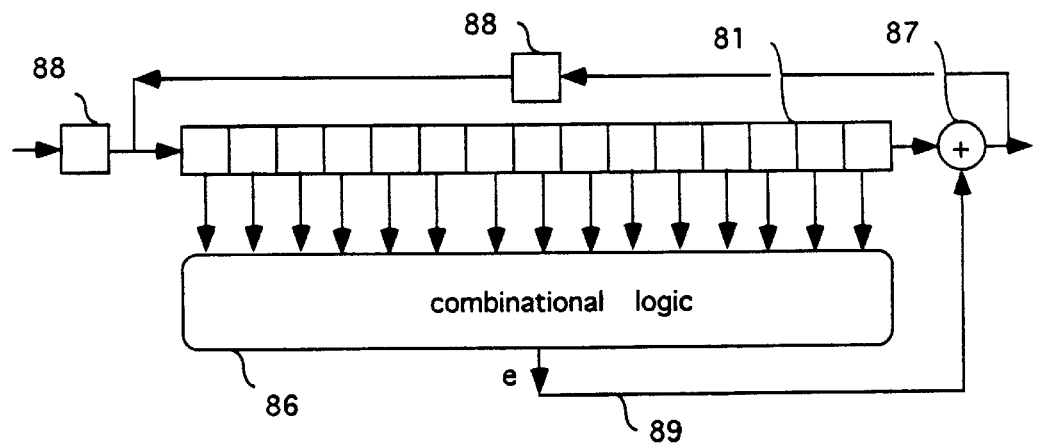
FIG. 8 is a simplified block diagram illustrating a conventional bit-serial majority logic cyclic FEC decoder.

Special classes of BCH codes can also be decoded so that the logic block in FIG. 7 contains only combinational logic (i.e., no internal memory elements) and "majority logic gates", i.e., no LSFRs are contained. An m-input majority logic gate generates a logic 1 output when greater than m/2 of its inputs are logic 1. Hence, a majority logic gate can be implemented using adders and a comparator. In these special cases of BCH codes, the logic blocks of FIG. 7 contain only combinational logic. FIG. 8 illustrates a bit-serial majority logic decoder for a (15,7) BCH cyclic code, which can correct 1 or 2 errors in the 15 bit code word. It consists of a shift register 81 for storing the vector to be decoded, a combinational logic block 86, an XOR gate 87 for correcting a bit of the vector if the error signal e on wire 89 is asserted, and several switches 88 for controlling to flow of the data. Bits are decoded one-by-one as they shift out of the shift register 81 on the right hand side, and pass through XOR gate 87, according to the error signal e on wire 89.

Figure 9:
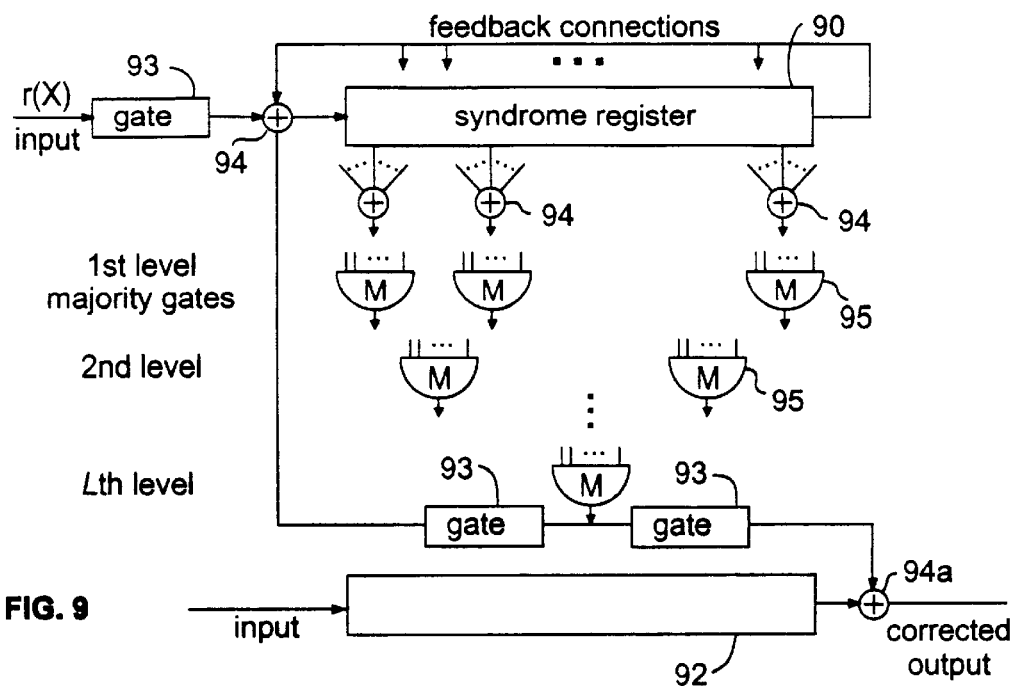
FIG. 9 illustrates a conventional Type 1 bit-serial majority logic decoder for applicable cyclic codes.

FIG. 9 illustrates a general Type 1 bit-serial majority logic decoder for applicable BCH codes. The decoder of FIG. 9 contains a linear feedback shift register 90 and a shift register 92 for storing the vector to be decoded. FIG. 9 also contains switches 93 for controlling the flow of data, several XOR gates 94, and several majority logic gates 95. Bits are decoded one-by-one as they shift out of the shift register 82 on the right hand side and pass through XOR gate 94a.

Figure 10:
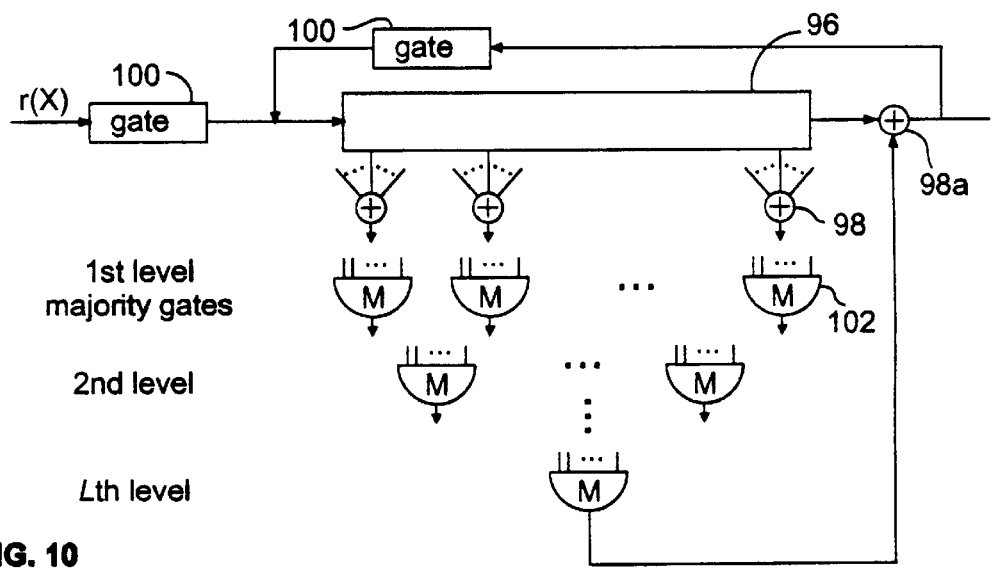
FIG. 10 illustrates a conventional Type 2 bit-serial majority logic decoder for applicable cyclic codes.

FIG. 10 illustrates a general Type 2 bit-serial majority logic decoder for applicable BCH codes. This circuit consists of a shift register 96, XOR gates 98, switches 100 and majority logic gates 102. Bits are decoded one-by-one as they shift out of the shift register 96 on the right hand side and pass through XOR gate 98a. Type 1 and Type 2 bit-serial majority logic decoders are described in Lin and Costello.

Figure 11:
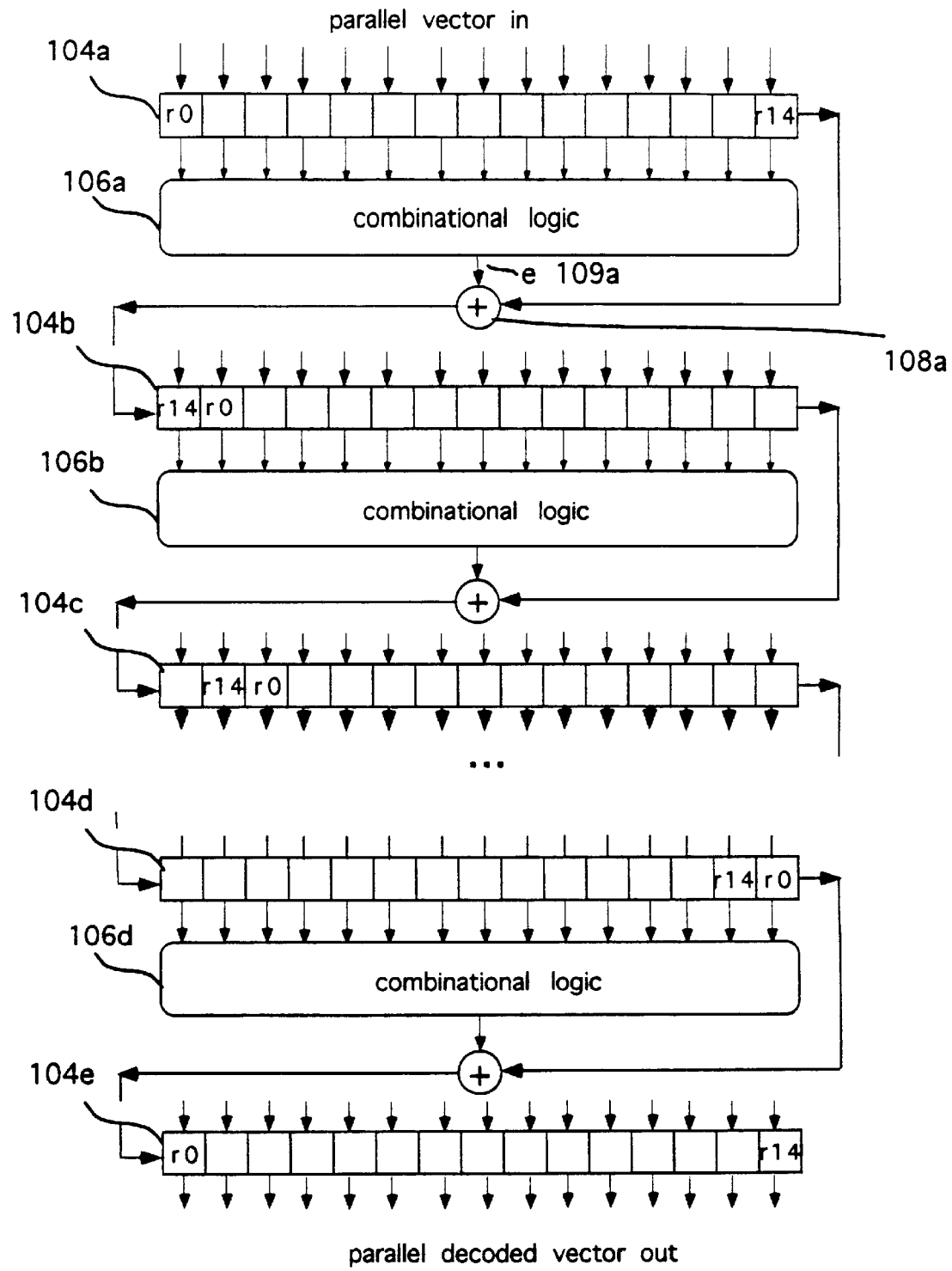
FIG. 11 illustrates an exemplary pipelined decoder for the majority logic decodable BCH codes (simplified block diagram).

An exemplary pipelined decoder for the majority logic decodable BCH codes is illustrated in FIG. 11. The decoder for a (n,k) code consists of n pipeline stages, with n+1 stages of pipeline latches 104. The output of one stage of pipeline latches 104a leads to the inputs of the next stage of pipeline latches 104b, with an appropriate permutation. The rightmost bit in latch 104a is decoded as it passes through XOR gate 108a, under the control of a control signal e 109a determined by the combinational logic 106a. This newly decoded bit is supplied into the leftmost bit position of destination pipeline latch 104b, and the leftmost n−1 data bits in the source pipeline latch i−1 104a are shifted up one bit position to the right and supplied to the remaining n−1 bits of latch i 104b. The wires to implement this permutation are not shown for clarity. However, the positions of two bits labelled r0 and r14 as they move through the pipeline are shown for clarity.

An n stage pipelined majority logic BCH decoder requires n clock cycles to decode a code word of n bits. For example, FIG. 11 can be used to define a pipelined cyclic decoder for the (15,7) BCH code with a very high throughput (where (15,7) represents (n,k)). The decoder is constructed by using n=15 copies of the bit-serial majority logic decoder in FIG. 8 arranged in stages, with all the parallel output bits of one decoder stage fed to the parallel input bits of the next decoder stage, with appropriate connections. The pipelined decoder is a 15 stage pipeline, where each stage processes one bit of the input vector. As will be appreciated by one of ordinary skill, the technique of removing pipeline latches discussed in relation to FIG. 5 can be applied here, to reduce the number of pipeline stages.

Figure 12:
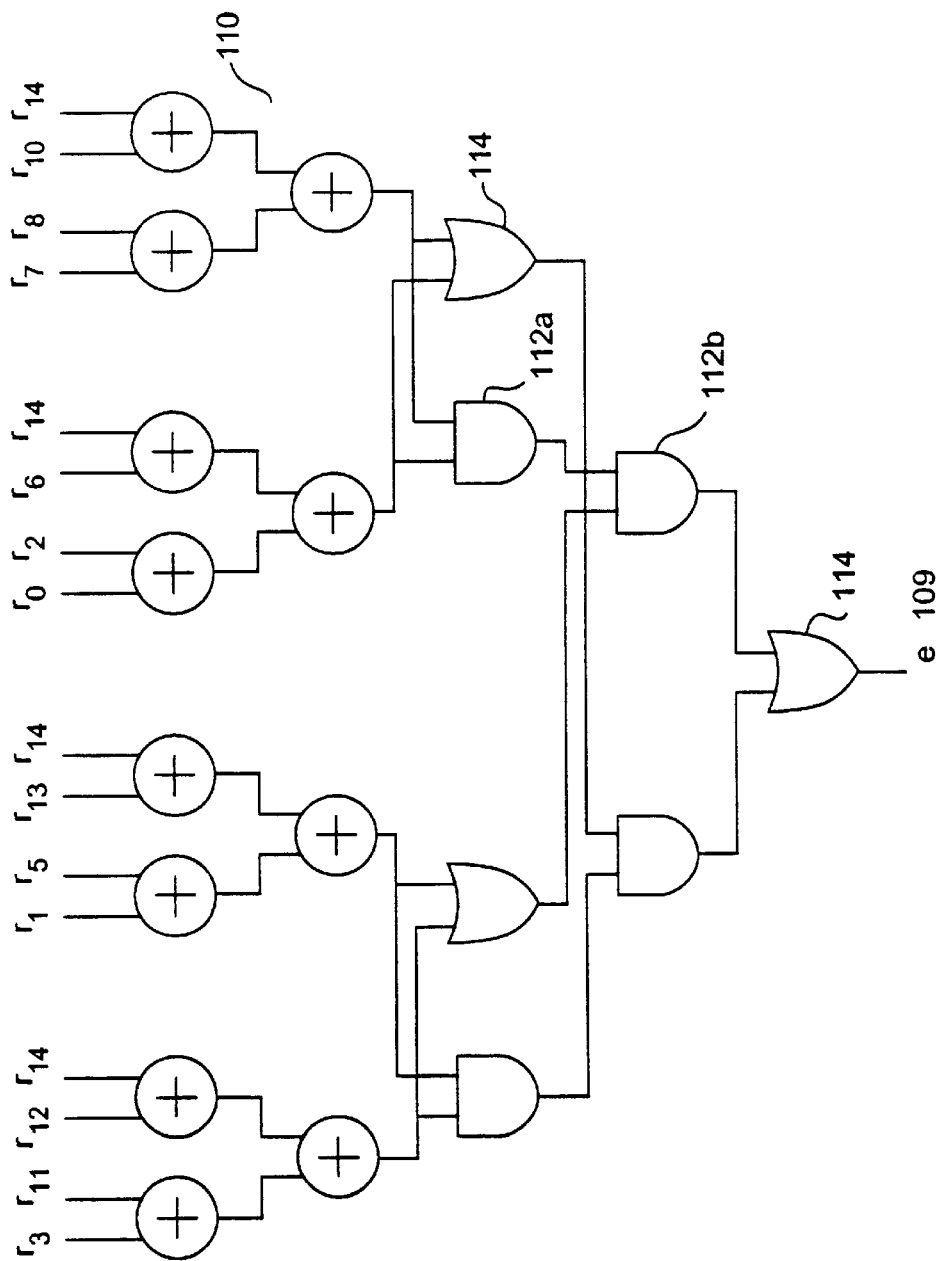
FIG. 12 illustrates the combinational logic for the general type 2 bit-serial majority logic decoder for decoding the (15,7) BCH code.

FIG. 12 illustrates the combinational logic required for decoding the BCH (15,7) code, within the combinational logic block 106 in FIG. 11. The logic includes several 2-input XOR gates referred to collectively as 110, several AND gates 112 and several OR gates 114 to implement a 4-input majority logic gate. The majority logic gate determines a control signal e 109.

Figure 13A:
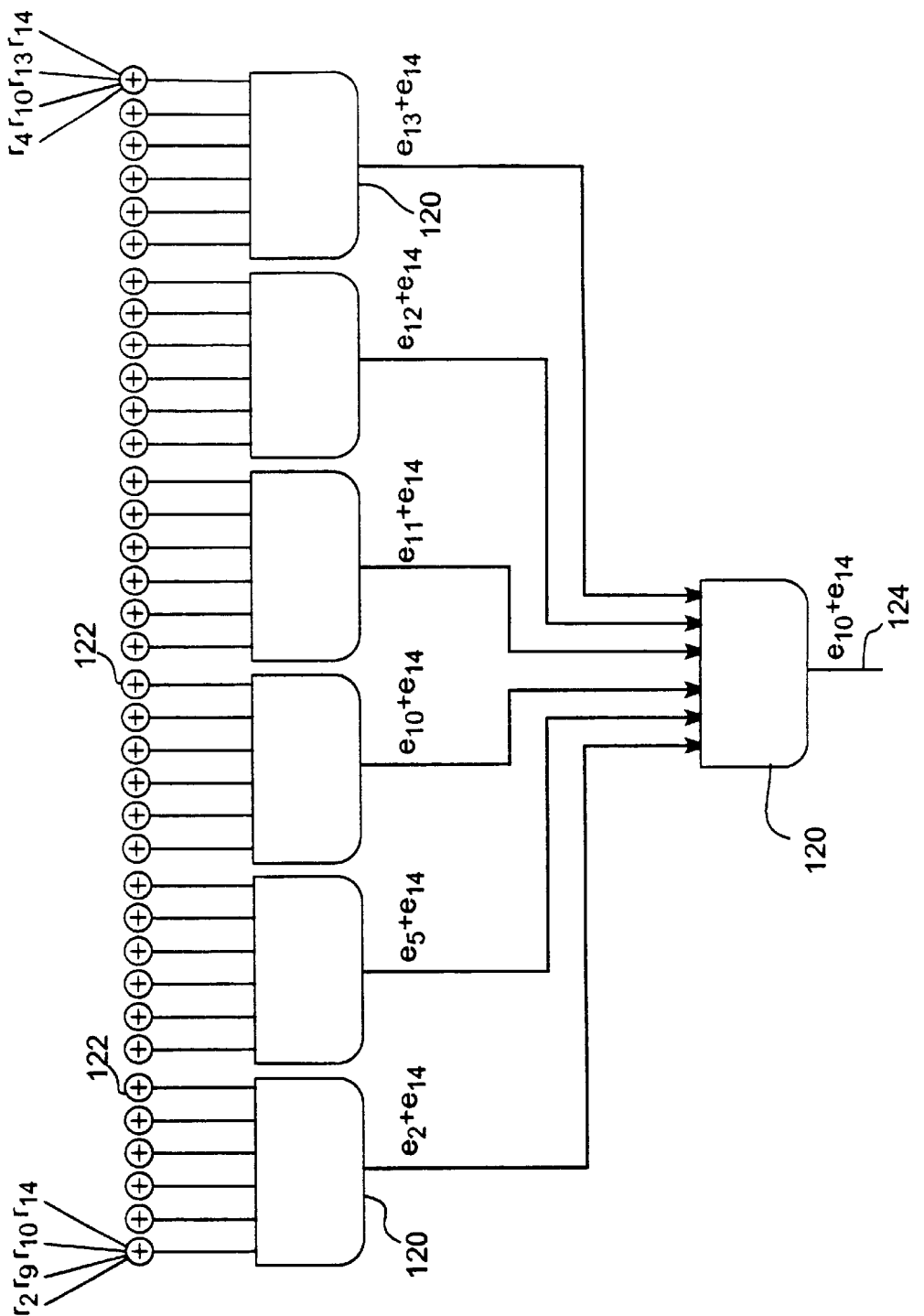
FIG. 13a illustrates exemplary combinational logic for decoding the majority logic decodable BCH (15,5) code.
Figure 13B:
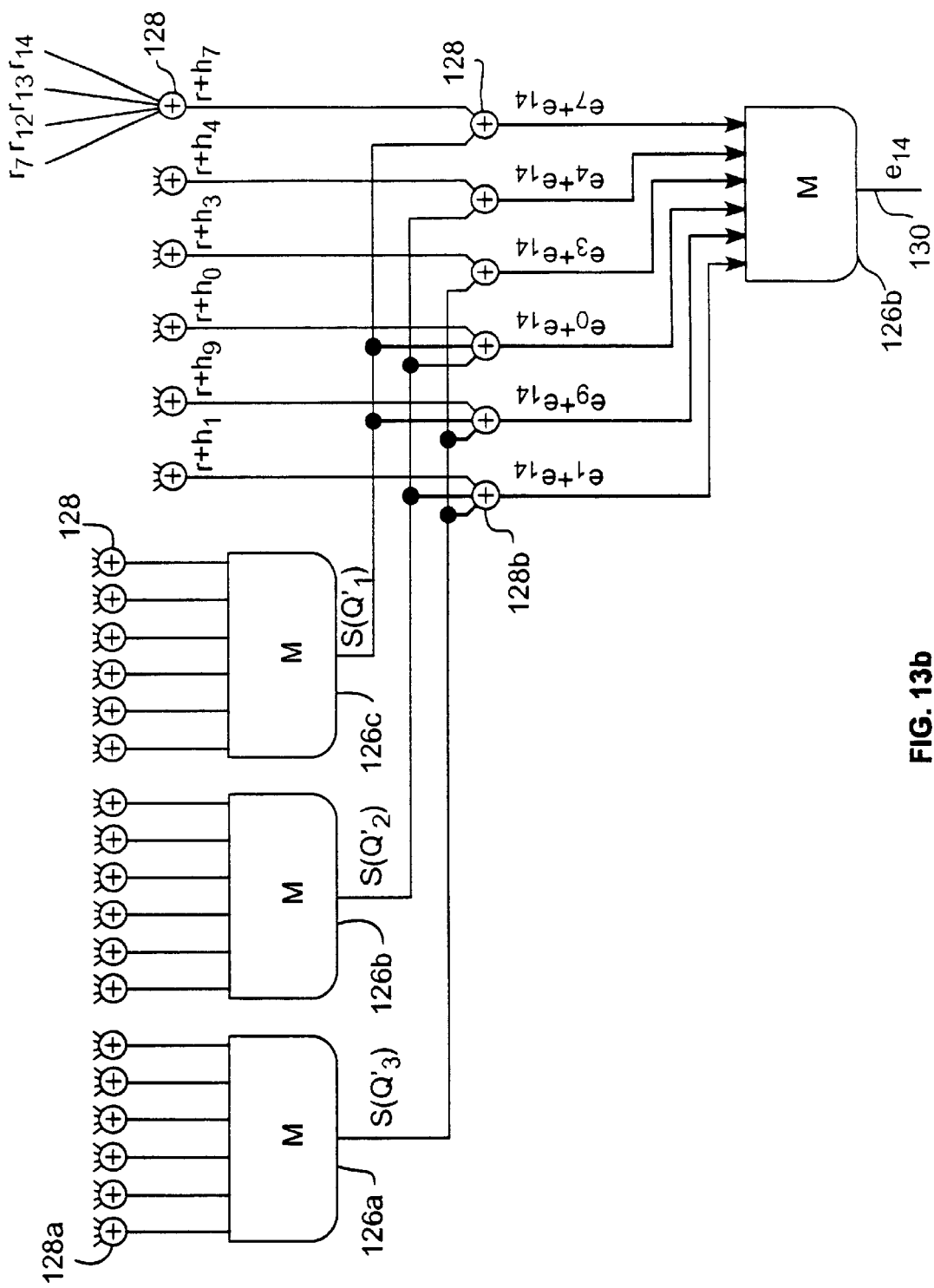
FIG. 13b illustrates alternative exemplary combinational logic for decoding the majority logic decodable BCH (15,5) code.

FIG. 13a and 13b illustrates the exemplary combinational logic required for decoding the BCH (15,5) code. In FIG. 13a, the logic includes several 6-input majority logic gates 120 and several 4-input XOR gates 122. The error signal e appears on wire 124. In FIG. 13b, the logic includes several 6-input majority logic gates 126 and several multi-input XOR gates 128. The error signal appears on wire 130. In FIG. 13b, the critical path corresponds to a 4-input XOR gate 128a, a 6-input majority logic gate 126a, a 3-input XOR gate 128b, followed by a 6-input majority logic gate 126b. This level of processing will incur a delay. If necessary, to speed up the pipeline, additional stages of pipeline latches can be added to partition the combinational logic into subsets which are handled in separate pipeline stages. Hence, a n stage pipeline in FIG. 11 can also be transformed to a n*m stage pipeline for integer m=1, 2, 3, 4, . . . , by adding m−1 new pipeline stages to each combinational logic block 106 of FIG. 11, so as to decrease the critical path.

Figure 14:
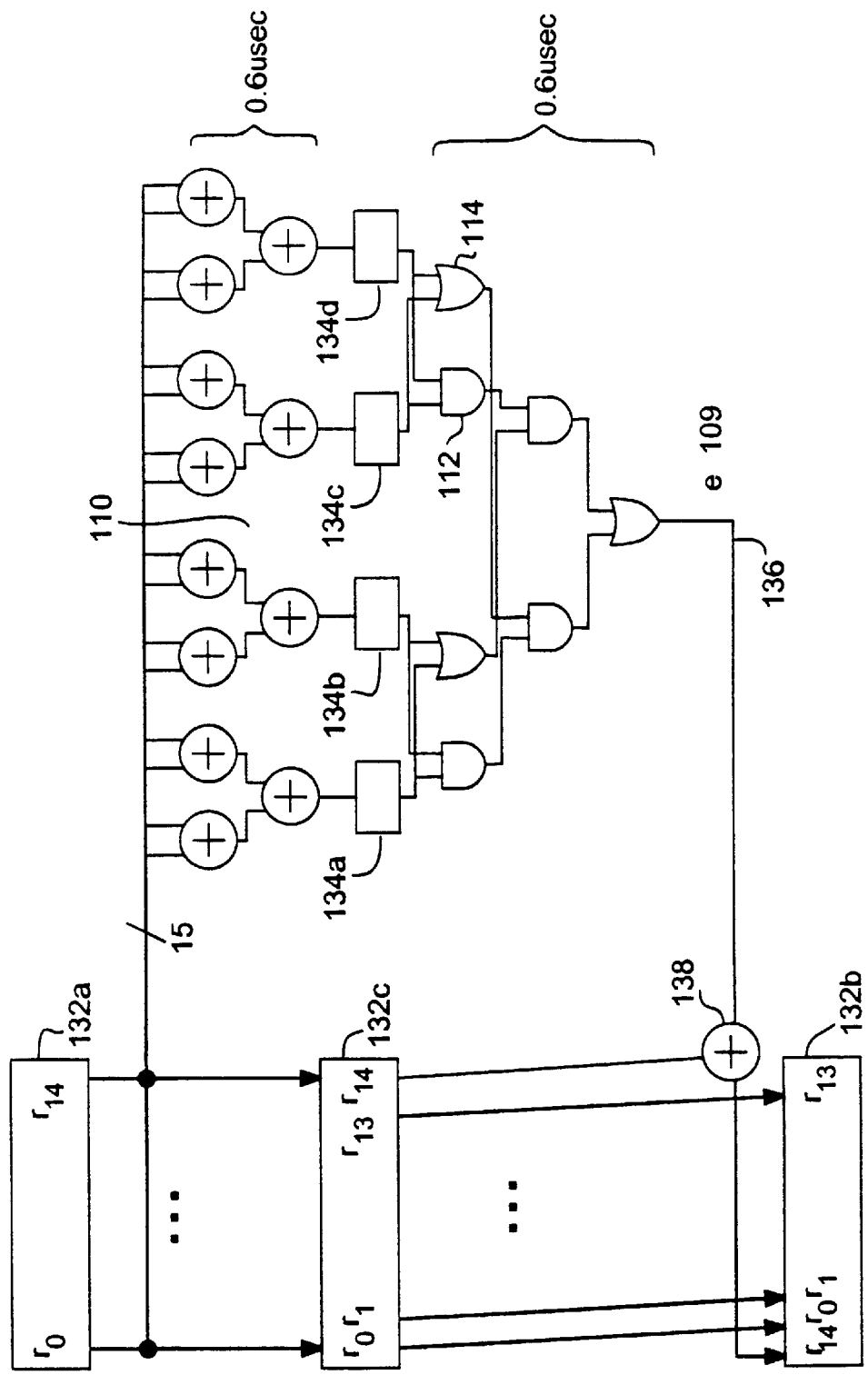
FIG. 14 illustrates exemplary pipelined combinational logic for the majority logic decodable (15,7) BCH code.

For example, FIG. 14 illustrates the exemplary addition of a single pipeline stage to the combinational logic shown in FIG. 12. An extra stage of pipeline latches 132c is interposed between pipeline latches 132a and 132b. Extra latches 134 are interposed in the combinational logic, so reduce the critical path. The error signal appears on wire 136, which decodes one bit through the XOR gate 138. The clock rate of the exemplary pipelined decoder in FIG. 11 can therefore be adjusted by adjusting the number of pipeline stages and the critical path.

Figure 13C:
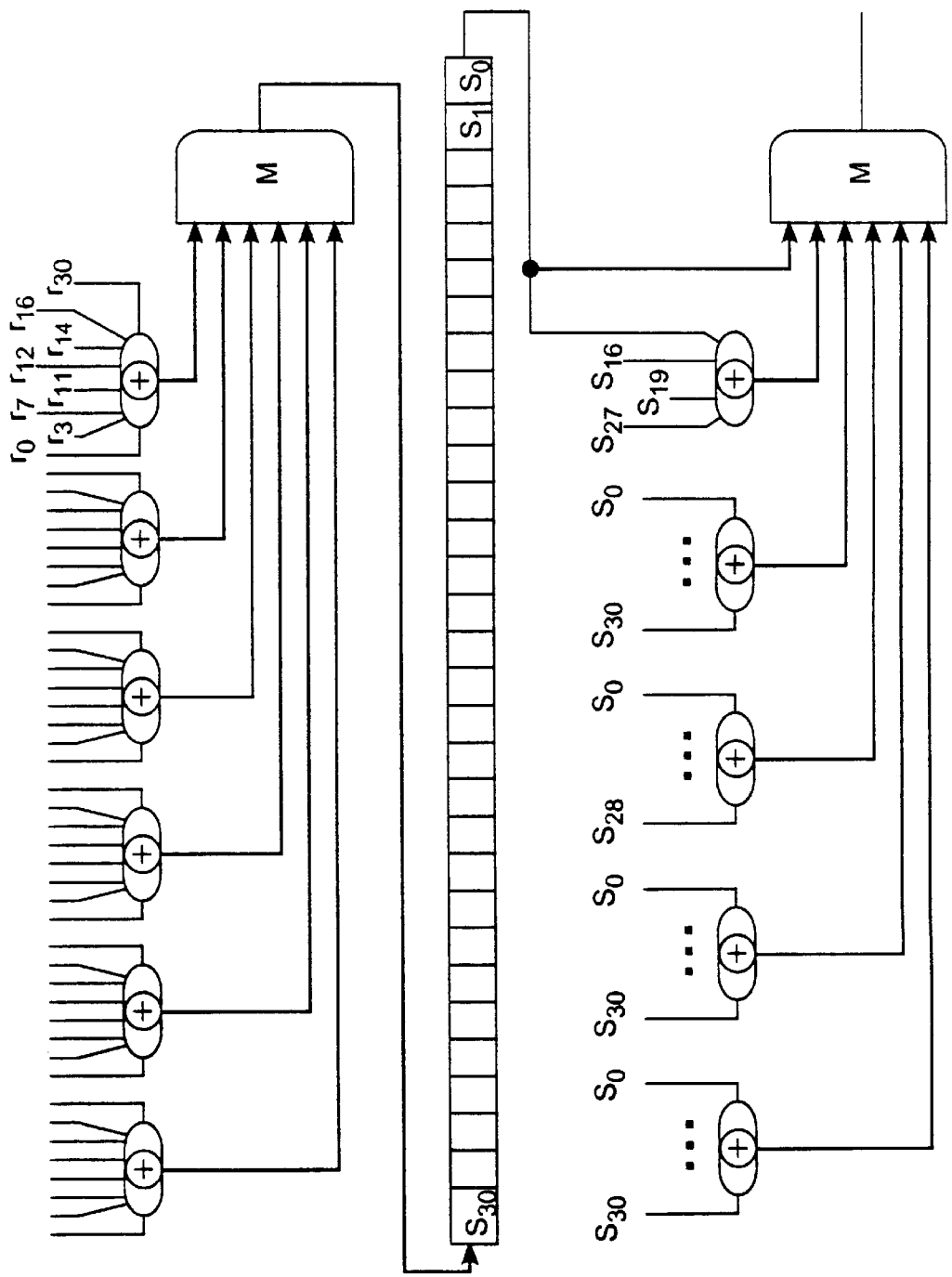
FIG. 13c illustrates exemplary combinational logic and storage elements using sequential code reduction (SCR) for decoding the (31,16) BCH/RM code.

FIG. 13c illustrates exemplary combinational logic and storage latches for decoding a (31,16) BCH code, which is also a Reed-Muller (RM) code. This bit-serial decoder can be pipelined by following the techniques illustrated in FIG. 11.

Each stage of the pipeline in FIG. 11 therefore includes a relatively small circuit requiring a relatively small amount of VLSI real estate, by current integrated circuit capabilities. As illustrated in FIG. 9 and 10, there are other types of majority logic decoders which have a similar structure. There are several other useful codes that can be decoded in a similar manner.

Area Calculations

Consider a pipelined decoder for the (15,5,3) BCH code. The pipelined FEC decoder of FIG. 11 can be used to decode the code. Exemplary combinational logic between pipeline stages is shown in FIG. 13b. It consists of 4 6-input majority logic gates, and less than 30 4-input XOR gates.

Assume an exemplary 0.35 micron CMOS process, where a D flip flop requires 30×30 area, a 4-input XOR gate requires 30×30 area, and where any 2-input gate requires 20×20 area (all units in microns). These values are conservative and over-estimate the area: these values are arbitrary and can be changed.

A 6-input majority logic gate can be made with 2 Full Adders (FA). Each Full Adder requires 7 2-input gates (it can be as low as 5 gates, or as high as 12, depending upon which circuit is used). A 6-input majority logic gate can be made with 2 FAs and 4 2-input logic gates. The area for one 6-input majority logic gate is approx. 7,200 microns^2.

The area for the combinational logic for one pipeline stage is therefore approx. 4×(7,200)+30×(30×30)=55,800 microns squared. The area for 15 D flip flops is approx. 15×30×30 =13,500 microns^2.

The area for the entire FEC decoder is approx. 15 stages× (13,500+55,800)=1,039,500 microns^2. This is approx. 1,000×1,000 microns, or one square millimeter of a silicon integrated circuit.

The delay between a stage can be determined from the critical path. The FAs require 3 gate delays or approx. 3×0.1=0.3 nanoseconds. The 4 logic gates joining the FAs in each majority logic gate add 2 gate delays, or approx. 0.2 nanoseconds. The 4-input XOR gates require approx. 0.3 nanoseconds. The critical path is approx. 0.3+(0.3+0.2)+ 0.1+(0.3+0.2)=1.4 nanoseconds. If we add the D Flip flop overhead, the minimal clock period is approx. 1.5 nanoseconds, and the maximum clock rate is approx. 666 MHz.

This pipelined circuit can be adjusted by increasing or decreasing the number of pipeline stages, as discussed earlier.

Pipelined Linear Block FEC Codes

There are other classes of FECs which can be pipelined to yield high throughput encoders and decoders. Linear block codes are described in Lin and Costello. A (n,k) linear block code encodes a k bit data vector to yield an n bit encoded vector. In fact, the (n,k) cyclic codes, and the BCH codes, are in fact subsets of the more general (n,k) linear block codes. Examples of other linear block codes include the (7,4) single error correcting Hamming code, and the (15,11) single error correcting Hamming codes. These can also be encoded and decoded in a pipelined manner.

Figure 15:
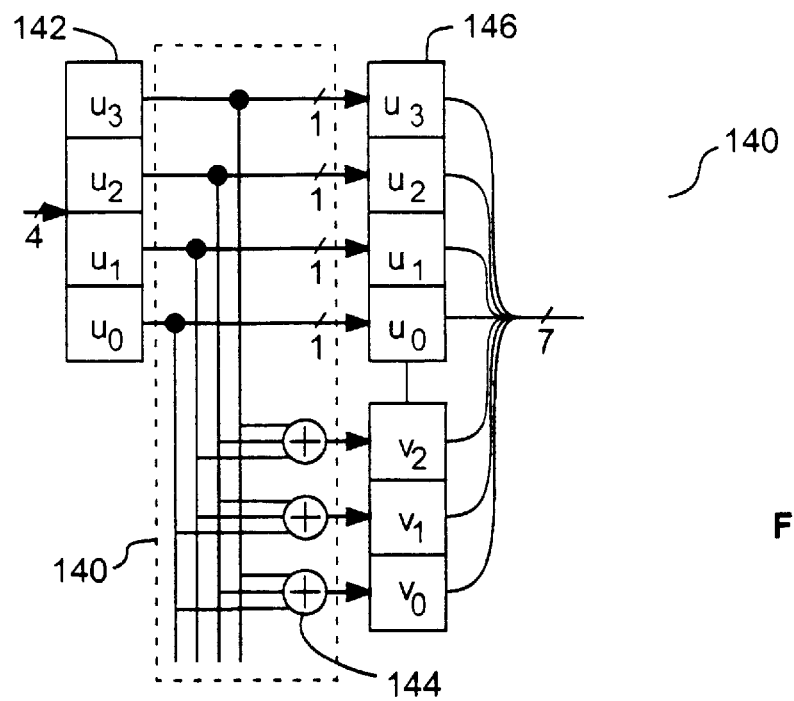
FIG. 15 is a simplified exemplary block diagram illustrating a (7,4) Hamming code FEC encoder circuit, computing parity bits in parallel.

An example FEC encoder 140 which computes the parity bits in parallel and which may be used as FEC encoder 22 is schematically illustrated in FIG. 15. As illustrated, FEC encoder 140 may be a (7,4) Hamming code encoder, as more particularly described in Lin & Costello pg. 84. As illustrated, the (7,4) Hamming encoder of FIG. 15 takes as inputs 4 bits at four bit latch 142, and provides these by way of 3-input XOR gates 144 to seven input latch 146 to produce a 7 bit output. FEC encoder 140 is typically referred to as an unpipelined circuit. As will be appreciated, the maximum operating speed of encoder 140 is governed by propagation delay through XOR gates 144. Moreover, as will be appreciated, a 3-input XOR gate is functionally equivalent to two serially coupled, 2-input XOR gates. Assuming that each 2-input XOR gate introduces a delay of about 0.3 nanoseconds, each 3-input XOR gate may therefore introduce 2×0.03=0.6 nanoseconds of delay. Thus, circuit 140 may operate with a frequency of approx. 1 sec/0.6 ns=1.666 GHz.

Figure 16:
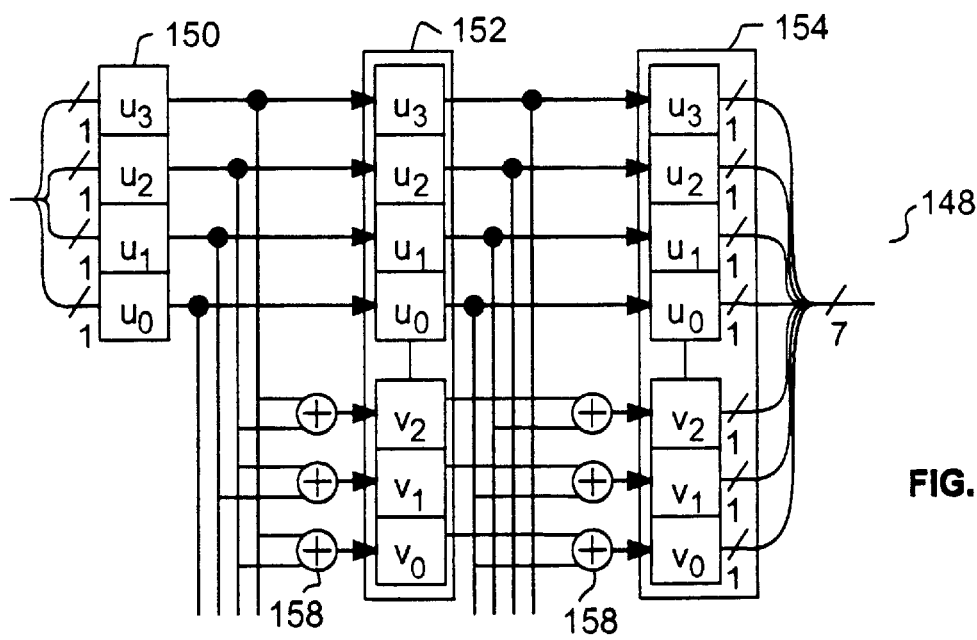
FIG. 16 is a simplified exemplary block diagram illustrating a 2 stage pipeline for the (7,4) Hamming code FEC encoder, computing all parity bits in parallel.

The FEC encoder in FIG. 15 can be pipelined to decrease the critical path and to increase the clock rate, as shown in FIG. 16. Here, FEC encoder 148 uses three sets of pipeline latches 150, 152 and 154. Combinational logic gates 156, are placed between pipeline latches 150 and 152. Combinational logic gates 158, are placed between pipeline latches 152 and 154. The maximum propagation delay between latches, is introduced by single 2-input XOR gates 156 or 158, and is thus ½ as great as that of encoder 140 in FIG. 15. Assuming that each 2-input XOR gate introduces a propagation delay of 0.3 ns, this example pipelined encoder 148 may be operated at 1 sec./0.3 ns=approx. 3.33 GHz, approximately twice the speed of encoder 140 in FIG. 15.

A person skilled in the art should now readily appreciate other pipelined (n,k) FEC encoders usable at FEC encoder 22. For example a (q,1) majority code could be pipelined. For such a code, a single bit is represented by an odd number (q) of bits. Each bit may assume the value of the bit to be encoded, i.e., in a (3,1) code a 0 bit is encoded as 000 and a 1 bit is encoded as 111. Alternatively the bits can have alternating polarities i.e, 010 and 101. At the receiver, those bits in the majority will dictate how the received bits are decoded. The appeal of these codes is their extreme simplicity, although their error correction ability is rather low.

Figure 17:
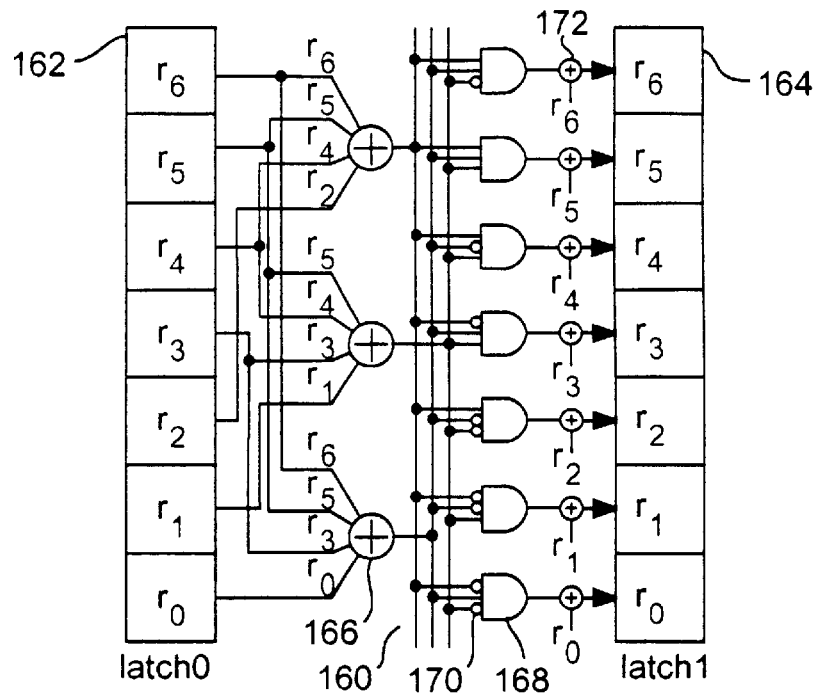
FIG. 17 is a simplified exemplary block diagram of a (7,4) FEC decoder for use in the receiver of FIG. 6, decoding all bits in parallel.
Figure 18:
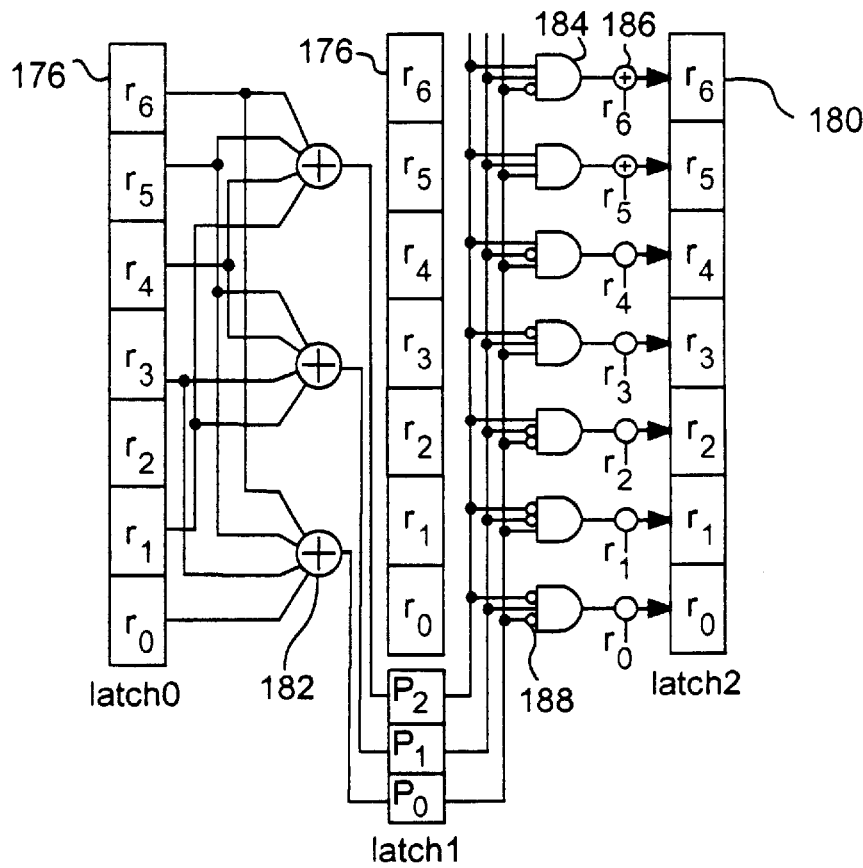
FIG. 18 is a simplified exemplary block diagram of a 2 stage pipelined (7,4) FEC decoder, decoding all bits in parallel.

Exemplary FEC decoders which decode all bits in parallel are illustrated in FIGS. 17 and 18. FIG. 17 illustrates an unpipelined decoder. FIG. 18 illustrates a pipelined decoder with a 2 stage pipeline.

As illustrated in FIG. 17, an example unpipelined FEC decoder 160 is illustrated between two sets of latches 162 and 164. The decoder consists of several 4-input XOR gates 166; several 3-input AND gates 168; several inverters 170 and several 2-input XOR gates 172. The propagation delay between latches is thus attributable to the delay introduced by a 4-input XOR gate; an inverter; a three input AND gate; and a 2-input XOR gate. Assuming that the delays attributable to these components are 0.6 ns; 0.1 ns; 0.2 ns; and 0.3 ns respectively provides a critical path of approx. 1.2 ns and a theoretical maximum operating speed for the circuit of 1 sec/1.2 ns=833 MHz. As will be appreciated, faster speed FEC decoders may be implemented by using pipelining, and simplified interconnecting combinational logic.

FIG. 18 illustrates a two stage pipelined version of the decoder in FIG. 17. In FIG. 18, FEC decoder 174 has three sets of pipeline latches 176, 178 and 180. Combinational logic consisting of 4-input XOR gates 182 is placed between pipeline latches 176 and 178; Combinational logic consisting of several 3-input AND gates 184; XOR gates 186 and inverters 188 is placed between pipeline latches 184 and 186. The maximum propagation delay between stages is thus effected by either four input XOR gates 182 or the combination of AND gates 184 (including inverters, as illustrated) and two input XOR gates gates 186. Again, assuming the delay through a four input XOR gate to be approximately 0.6 ns, and the delay through an inverter, AND gate and two input XOR gate to be approximately 0.1+0.2+0.3=0.6 ns, FEC decoder 174 may be operated at a frequency of about 1/0.6 ns=1.67 GHz. Pipelined FEC decoder 174 therefore operates at approx. twice the clock frequency of the unpipelined FEC decoder in FIG. 17.

Pipelined CRC Error Detection

Error detection (ED) is often accomplished with Cyclic Redundancy Check (CRC) codes. Such codes are described in Lin and Costello. The CRC codes can use the same bit-serial encoders as used for cyclic codes as illustrated in FIG. 4. The CRC codes are specified by their generator polynomials. A typical CRC-16 ED code is given by polynomial $g(X)=X^{16}+X^{15}+X^2+1$; Another typical CRC-16 ED code is $g(X)=X^{16}+X^{12}+X^5+1$; A typical CRC-32 ED code is $g(X)=X^{32}+X^{26}+X^{23}+X^{22}+X^{16}+X^{12}+X^{11}+X^{10}+X^8+X^7+X^5+X^4+X^2+X^1+1$.

CRC codes are often used to encode data for error detection (ED), using for example the bit-serial encoder of FIG. 4. The decoding process is very simple. When codes are used for ED only, there is no need to perform FEC. Hence, the receiver only needs to decode the received data, and compare the remaining parity bits (often referred to as syndrome bits) to 0. In general, an N bit CRC check can detect all but $2^{-N}$ bit errors. Hence, CRC codes can provide good error detection.

There are several schemes that can be used to perform CRC ED in the proposed system. The first proposed approach is to operate an array of bit-serial CRC encoders/decoders, as illustrated in FIG. 4, in parallel. Suppose M bytes of data is prepared for transmission over a link with 8 bits. Traditionally, the M bytes are encoded with a single CRC calculation, which requires 8*M+16=528 clock ticks for a 16 bit CRC. In our first proposed scheme, the data to be transmitted can be partitioned into 8 subsets which are encoded independently. Then 8 bit-serial CRCs can be used to encode the data at the transmitter, and 8 bit-serial CRCs can be used to decode the data at the receiver. Suppose the CRC encoders/decoders have labels 0 . . . 7. As the bytes are supplied to an ED encoder, one byte per clock tick, bit 0 is supplied to CRC encoder 0, etc, and bit 7 is supplied to CRC encoder 7. At the receiver, as bytes are received one byte per clock tick, bit 0 is supplied to CRC decoder 0, etc, and bit 7 is supplied to CRC decoder 7. This approach has the advantage of reducing the time needed to perform CRC by a factor of 8. Rather than encoding the 8M bits with a single 16 bit check sum requiring 8M+16 clock cycles to compute, the data are encoded using 8 sixteen (16) bit checksums, requiring M+16 clock cycles to compute. For M=64 bytes, the traditional CRC scheme requires 528 clock cycles, while the proposed scheme requires 80 clock cycles, a reduction in time by a factor of approx. 8. This scheme will create more checksum bits, which will generally consume link bandwidth, however the optical links we envision have very high data rates, so the increased overhead due to checksums can be tolerated, in order to achieve quicker encoding and decoding.

In many cases, however, it will be desirable to have an exemplary pipelined cyclic encoder/decoder, as illustrated in FIG. 5. The CRC computation (encoding or decoding) can be pipelined using the pipelined circuit of FIG. 5. This circuit generates a newly computed result every clock cycle. The prior paragraph illustrated that to encode 64 bytes, it is advantageous to partition the data into 8 vectors of 64 bits, which need to be encoded. The time available to perform the decoding corresponds to the time required to transmit the 64 bytes. In a 10 fiber link with 8 data bits, clocked at 10 GHz, it requires 6.4 nsec to transmit a 64 byte packet. To keep the link throughput high, a newly encoded packet should be available for transmission as soon as one packet has finished transmission.

It is possible to the use the exemplary pipelined cyclic encoder circuit shown in FIG. 5. This circuit can generate a new vector every 0.4 nanoseconds, which may be faster than necessary for a 10 fiber link. Therefore, in this example it will be advantageous to slow the pipeline down, by removing pipeline stages, as discussed earlier. For example, it is possible to reduce the number of pipeline stages from 64 to approx. 8. The clock rate of this pipelined circuit will decreases, since each pipeline stage performs more work. However, the hardware resources will be reduced, since only 8 pipeline latches are required rather than 64. This scheme will therefore result in a single pipelined circuit which generates vectors at the necessary rate.

Pipelined 2D/3D Parity

In computer communications, where rapid response time is very important, the time required to perform a CRC may be intolerable. Hence, it is desirable to use faster ED coding schemes, even if the schemes are less efficient in terms of the number of checkbits generated. One attractive coding scheme is the 2D or 3D parity check. In the 2D scheme, the data bits are arranged (logically) in a 2D array. For example, 8 bytes can be viewed as an 8×8 array of bits.

The 2D parity computation is easily performed. A parity tree of XOR gates computes the parity (the sum modulo 2) of all the bits in each column. The parity is 0 if the number of 1s in the column is even; it is odd otherwise. The same process is performed for every row and every column, thereby generating a parity bit associated with every row and every column. The parity bit can be saved as it is computed, or it can be inverted and then saved.

The encoded 2D array is transmitted to the receiver. The receiver computes the parity for every row and every column, using the same hardware (a parity tree per row and column). If the computed parity matches the transmitted parity, it is likely that no bit errors occurred. If the computed parities do not match, then some error has occurred.

The 2D parity scheme is easy to compute, however it has poor error detection capability. The 2D parity scheme will be fine for optical datalinks, which have a nominal BER in the range of $10^{-12}$. For such systems, the probability of bit errors are extremely remote; when they do happen they will likely happen in isolation and can be detected by a 2D parity scheme.

However, 2D parity schemes will not be attractive for the proposed data links, which operate at relatively high BERs in order to realize a data rate increase. Our mathematical analysis has shown that 2D codes will not yield significant ED for our purposes; too many bit errors will pass through undetected, and the final BER will be excessively high. Therefore, a 3D parity scheme can be employed. The 3D parity scheme can be viewed as a 2-Level ED scheme.

The data to be encoded is logically arranged in a 3D array, i.e., 8×8×8 bits. It is instructive to view 2D 8×8 arrays of bits as "planes" of data within a 3D cube. A parity calculation is performed on every row, on every column, and on every vector in the Z axis (depth). The parity calculations can be performed with parity trees.

This 2-Level ED scheme has an attractive feature. Each 2D plane of data can be decoded for ED as it is received, independently of the other planes, using the 2D parity check bits which are available with the plane of data. The 2D parity check will detect many errors, but it will also let many errors pass through undetected. However, once all 2D planes have been received, a final 3D parity check is performed. The 3D parity check detects many hard-to-find error patterns and reduces the probability of undetected bit errors substantially.

The 3D parity scheme is well suited for bit parallel transmission over fiber image guides. Consider a link transmitting 1,024 bits at a 10 GHz clock rate. The 1,024 bits can be organized as a 16×8×8 3D array, or a 16×16×4 3D array. The ED encoding and decoding times are equivalent to approx. the delay of a parity tree, which is 4 XOR gate delays in this example. The parity calculations can be pipelined, so that they can be performed at sufficiently fast clock rates.

Figure 19A:
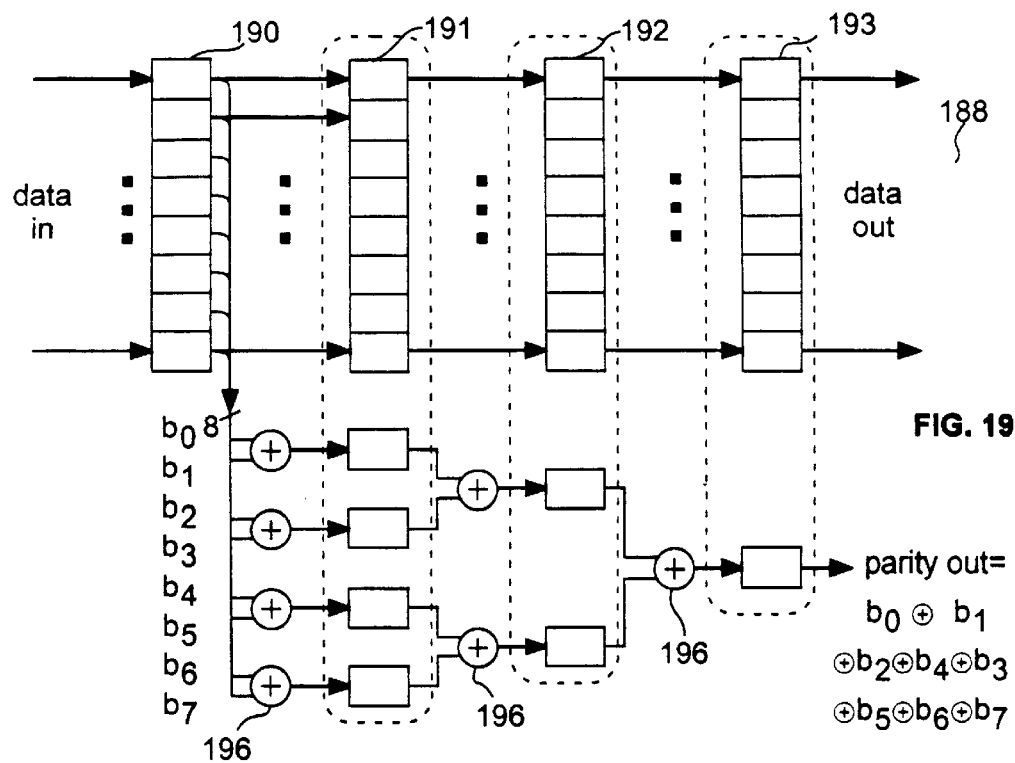
FIG. 19a illustrates an exemplary Error Detection encoder/decoder circuit using a pipelined circuit to compute the parity bit for one dimension of data bits.

An exemplary circuit 188 for computing a 1 dimensional parity on a stream of bytes is shown in FIG. 19*a*. It consists of a 4 pipeline latches 190, 191, 192 and 194. Several XOR gates collectively referred to by 196 are arranged in a parity tree computation, over 3 pipeline stages. Bytes enter the circuit every clock cycle, and exit on the 4th clock cycle, with a parity bit. Circuit 188 can be extended to compute a 2D parity on an 8×8 array of bits, by increasing the capacity of the latches to store a 2D array of bits, and by adding extra pipelined parity trees as needed.

Figure 19B:
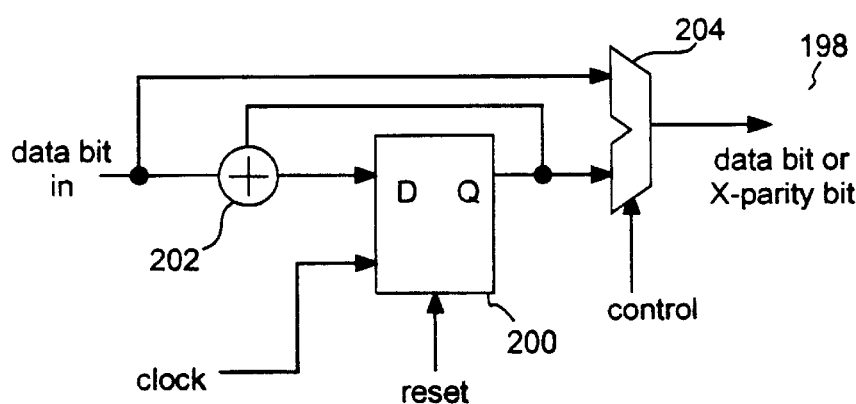
FIG. 19b illustrates an exemplary Error Detection encoder/decoder circuit used to compute a parity check bit on a stream of bits.

An exemplary circuit 198 for computing the parity of a bit stream which arrives over several clock cycles is shown in FIG. 19b. It consists of a D Flip-Flop latch 200 which stores a partially computed parity over the bits which have already passed through the circuit, which is initially 0. As a new data bit enters, it is XORed with the partially computed parity bit in XOR gate 202, and the result becomes the new partially computed parity bit. After all data bits are processed, the multiplexer 204 control is asserted causing the parity bit to be output.

Parity computing circuits 188 and 198 can be used in various combinations, to compute 2D parity checks, 3D parity checks, or higher dimensional parity checks, over streams of incoming bits. These circuits operate at exceptionally fast clock rates, with minimal hardware overhead and with minimal computing delay. As such, they are may be very useful for bit-parallel optical datalinks which require rapid encoding and decoding, such as optical datalinks in computer interconnects. Such circuits could for example encode 1,024 bits per clock cycle at a fast clock rate required by future generations of optical interconnects based upon fiber image guides.

Link Operation

As will become apparent, transmitter 12 in FIG. 1 is operated so that the data is transmitted across link 16 at a speed that introduces errors into a transmitted data stream at a rate in excess of a desired nominal BER, but that still allows for correction of errors within the stream using FEC encoder 22 and decoder 66 so that transmitted data may nevertheless be received with less than or equal the nominal BER.

Figure 20:
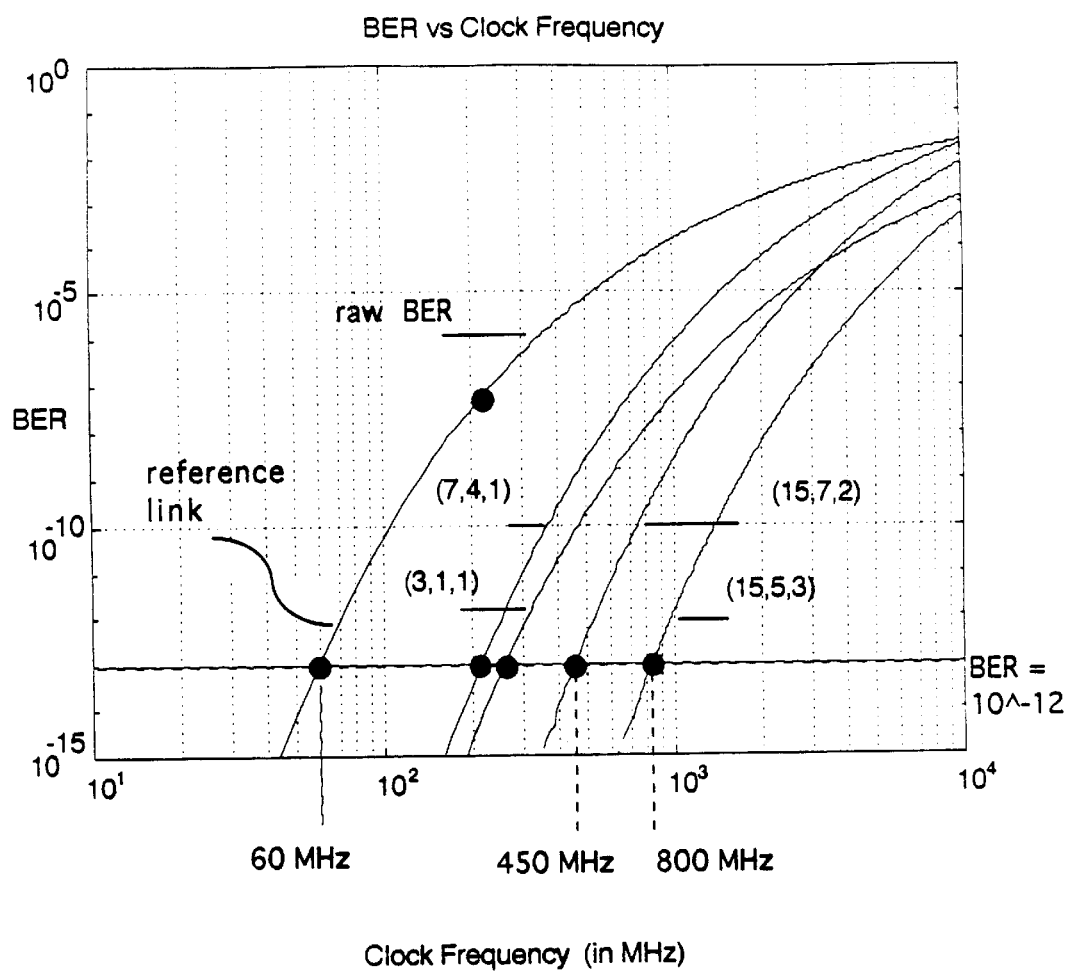
FIG. 20 illustrates the relationship between raw BER vs. operating speed for an exemplary link, and also the final BERs vs. operating speed using several pipelined FECs. This graph illustrates the performance of FEC alone.

FIG. 20 illustrates the raw bit error rate (raw BER) for a regular link versus the clock frequency. Also shown are the final BERs versus clock frequency for a link using various small pipelinable FEC codes. Bit errors at higher speeds, and therefore increased bit error rates, are introduced for numerous reasons. (1) Poor alignment between the VCSELs and the fiber, or the fiber and the photodetectors, can degrade the power of optical signals. (2) Nonuniform power over 1D or 2D large arrays of optical bits can result in some optical bits with lower power and higher noise levels. (3) In free-space data links, optical crosstalk between bits will increase the noise level and decrease the Signal-to-Noise Ratio (SNR). (4) Laser modal noise can contribute to noise at high frequencies. (5) Dispersion and inter symbol interference can contribute to noise at very high frequencies, usually in excess of 100 GHz. (6) Clock jitter can contribute to noise. All of these phenomena will increase the noise level, lower the SNR and increase the bit error rate, and all can be partially compensated for by employing error correcting schemes on the optical datalink. In all photodetectors with limited optical signal power, thermal noise will be a dominant cause of bit errors. Thermal noise is due to the random motion of electrons within the resistors of the high gain photodetectors. Regardless of the source of noise, the proposed FEC and ED schemes will reduce the BER and facilitate improved link performance.

In the following graphs, the BER is determined from an approximate mathematical model. The assumptions behind the mathematical model can be changed, however we have observed that the relative positions of these curves remain relatively constant.

For a typical link, characterized in FIG. 20 to achieve a BER of $10^{-12}$ without using any FECs (i.e. a "raw" link), the clock frequency must be approx. 60 MHz. This frequency is illustrated by the bold dot, at the intersection of the horizontal line denoting a BER of $10^{-12}$, and the "raw BER" curve representing a typical link without any FEC. We now explore the use of the small pipelinable FECs to improve the link performance. For comparison purposes, the "Reference Data Link" is defined as the basic link operating at a clock rate of 60 MHz with a BER of $10^{-12}$, as shown in FIG. 20.

Using the (7,4) Hamming code, the clock frequency can be increased to approx. 220 MHz while meeting the same final BER on the decoded data, denoted by the second bold dot from the left. This increase in clock frequency does not translate directly into an increase in the data rate of the link, since the (7,4) coding scheme only transmits 4 bits of end user information for every 7 bits transmitted. The effective data rate, using the (7,4) coding scheme, is 220 MHz*(4/7)=125.7 MHz, approximately twice the data rate of the unencoded link reference system. This increase in datarate is significant, given that the hardware required to implement the (7,4,1) FEC encoders and decoders is negligible.

Similarly, using the (3,1) code, the clock frequency can be increased to approx. 250 MHz while meeting the same final BER on the decoded data (denoted by the third bold dot from the left). The data rate using this scheme is 250 MHz*(1/3)=83 MHz.

Likewise, using the (15,7) code, the clock frequency can be increased to approx. 450 MHz while meeting the same final BER of $10^{-12}$ on the decoded data. This is denoted by the second bold dot from the right. The data rate using this scheme is 450 MHz*(7/15)=210 MHz, an improvement over the unencoded link by a factor of 3.5 (210 MHz/60 MHz).

Using the (15,5) code, the clock frequency can be increased to approx. 800 MHz while meeting the same final BER of $10^{-12}$ on the decoded data. The data rate using this scheme is 800 MHz*(5/15)=267 MHz, an improvement over the unencoded link by a factor of 4.45.

These increases in datarate are significant, given that the hardware required to implement these pipelinable FEC encoders and decoders is negligible.

As will be appreciated, increased bit errors may also be introduced by operating the link using less power for the optical output stage 26 in FIG. 2, while maintaining the same operating frequency. Reduced power consumption will enable the use of larger arrays of optical transmitters, which may otherwise be prohibitive in terms of power consumption.

Referring to FIG. 2, In operation, data is received at format converter 20; converted to an appropriate format for the input of FEC encoder 22; passed to FEC encoder 22, where suitable FEC codes are added; and then passed to optical output stage 26 by way of optional disparity encoder 24. As noted, output stage 26 is operated at a rate and power at which errors are introduced into the raw data stream passed along link 16. However, output stage 26 is operated at a rate so that the FEC codes used to encode the data can form corrected data having better than a nominal bit error rate after decoding. The nominal BER can be chosen depending on the nature of the link, and depending on the desired use of the data. So, for example, the link characterized in FIG. 20, could be operated a link frequency of 220 MHz using a decoder implementing the (7,4) Hamming Code, detailed above. As illustrated in FIG. 20, operation of the link at this bit rate causes the link to operate at a raw bit BER of approximately $10^{-7}$ (determined from the raw BER curve operating at a clock frequency of 220 MHz, i.e., the uppermost dot). The FEC however, allows data on the link to be received with a final BER after FEC decoding of about $10^{-12}$. Similarly, the link could be operated at up to 800 MHz (at a raw BER of $10^{-4}$) while still conveying the data with a final BER of $10^{-12}$ after FEC decoding.

Retransmission Schemes

In FIG. 1, when a feedback path 18 from the receiver 14 to the transmitter 12 exists, the possibility of using error detection (ED) codes and retransmission protocols as a means to achieve a specified BER on the decoded data stream at the receiver exists. There are several examples of such retransmission schemes, generally called Automatic Repeat Request (ARQ) protocols. However, these schemes are generally viewed as decreasing the throughput performance of the link. For example, to quote from S. Wicker (Error Control Systems for Digital Communication and Storage, 1995, Prentice Hall, Englewoods Cliffs, N.J., 07632): "If a feedback path is available to the decoder, retransmission requests become a possibility. Retransmission requests provide a powerful means of improving reliability performance at a cost of a reduction in throughput".

The use of retransmissions alone to increase the data rate or throughput of a link has not previously been explored, and is contrary to the prevailing view as illustrated by Wicker. In this section the use of retransmissions alone as a means of improving the link datarate is established, as an alternative to the use of FECs. The throughout improvements due to retransmissions alone are quite surprising, and contrary to the conventional view as stated by Wicker above.

Figure 21:
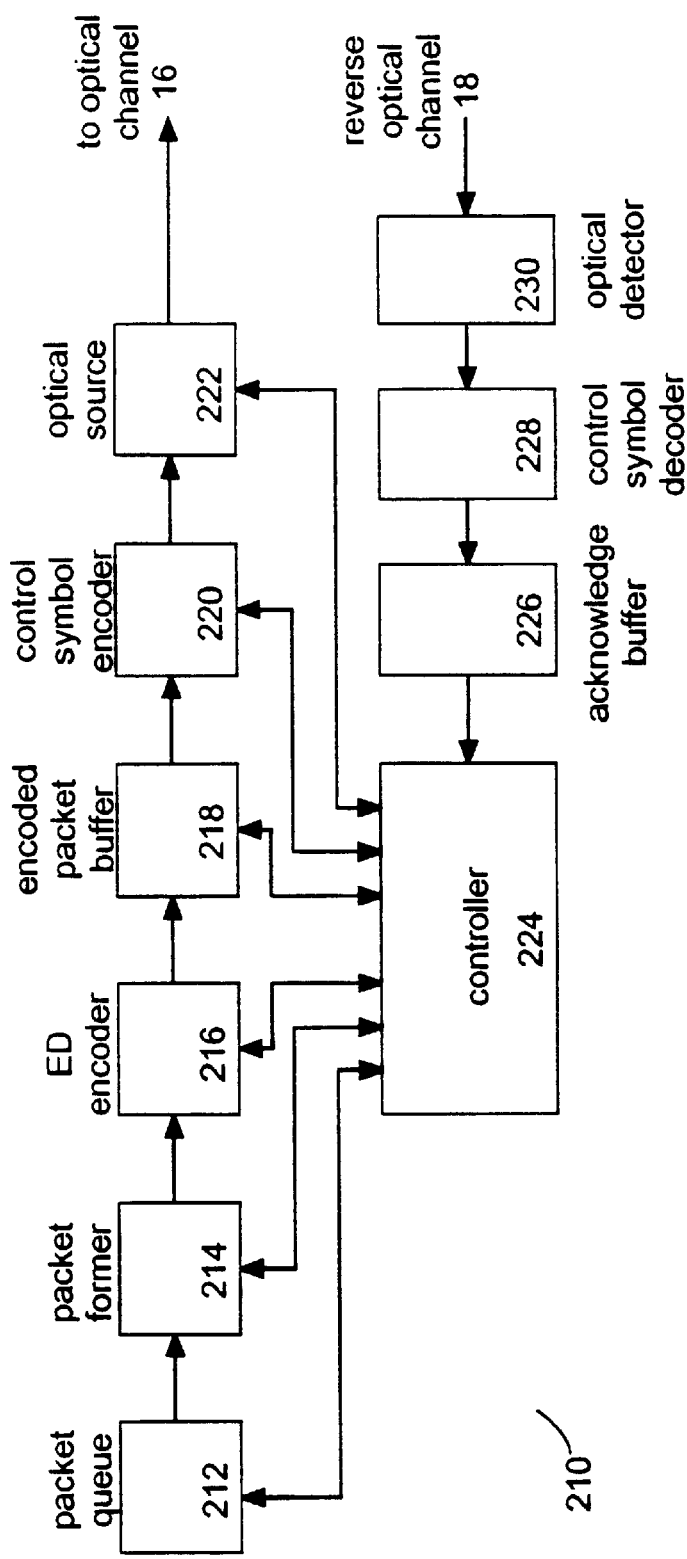
FIG. 21 is a simplified block diagram of a second exemplary transmitter 210 for use in the system of FIG. 1, which uses retransmissions.

FIG. 21 illustrates a second exemplary transmitter 210, that may be used as transmitter 12 in FIG. 1. Transmitter 210 uses a new approach to improve the data rate of the channel, when compared to first exemplary transmitter 12 in FIG. 2, namely the use of retransmissions alone.

Exemplary transmitter 210 includes a packet queue 212 communicatively coupled to a (preferably fixed size) packet former 214, which is coupled to an error detection code (ED) encoder 216, which is coupled to an encoded packet buffer 218, which is coupled to a control symbol encoder 220, which is coupled to an optical source 222, coupled to forward optical channel 16. A packet controller 224 is further coupled by control lines to components 212, 214, 216, 218 and 220. The controller 224 is in further communication with a reverse channel 18 (FIG. 1), by way of an acknowledge buffer 226, a control symbol decoder 228, and an optical detector 230.

Figure 22:
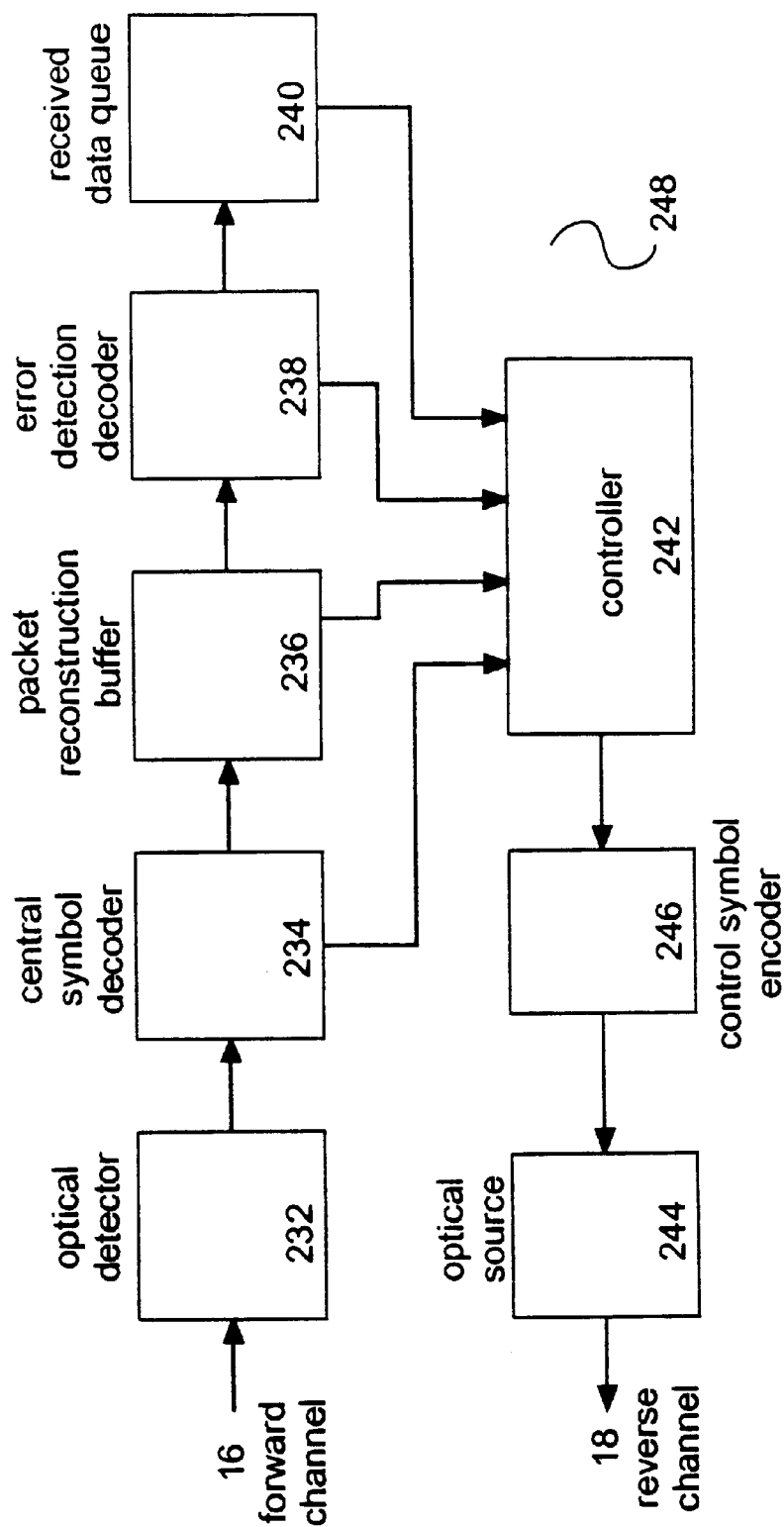
FIG. 22 is a simplified block diagram of a second exemplary receiver 248 for use in the system of FIG. 1.

An example complementary receiver 240 is illustrated in FIG. 22. Receiver 240 preferably includes an optical detector 232, in communication with a control symbol decoder 234, coupled to a packet reconstruction buffer 236, coupled to a error detection code (ED) decoder 238, coupled to a received data queue 240. The positions of the packet buffer 236 and ED decoder 238 may optionally be interchanged if preferable. An ARQ controller 242 is in communication with said components 234, 236, 238 and 240.

Operation of Stop-and-Wait Transmitter

Data is transmitted in packets, which may be of any size but will be of preferable size 64 bytes in the ensuing discussion. This size is suitable for low delay computer communications. Referring to the exemplary transmitter 210 in FIG. 22, the packet controller 224 will signal the packet former 214 to form a new packet for transmission when there is data in the packet queue 212.

The packet former 214 preferably selects a fixed number of bytes of payload data from queue 212, and adds overhead identifier in the form of a unique packet sequence number, which can be used to identify the packet, and arranges these bytes. Typically the i-th packet to be transmitted is assigned sequence number (i modulo X). If X=256 the sequence numbers are in the range of 0 . . . 255 and can be encoded in a single byte. The ED encoder 216, in turn, processes the packet formed at packet former 214 and adds error detection checksum bits to the packet. The error detection schemes to be performed by ED encoder 216 will be described in a separate section.

After a packet is encoded with error checksum bits, it is stored in encoded packet buffer 218. When the packet is enabled for transmission by the controller 224, the packet is supplied to the control symbol encoder 220, which prepends special control symbols to identify the transmission. Typically, a Start-Of-Packet (SOP) control symbol is prepended to the start of the packet, and an End-Of-Packet (EOP) control symbol is appended at the end of the packet. The control symbol encoder can optionally be the 8B/10B disparity encoder described earlier (U.S. Pat. No. 4,486,739), which has the ability to send data bytes and well as special control bytes, in a byte stream which is DC balanced. Alternatively, the control symbol encoder could reserve certain bit patterns for control symbols, and replace the occurrence of the same bit patterns in the data by a control sequence followed by appropriate data.

The packet controller 224 has 3 states, ID-idle, TX-transmitting packet, and WA—waiting for acknowledgment. The packet controller is initially in the idle state. It enters the Transmitting state when it detects the presence of data in the packet queue 212, and for several clock cycles the controller 224 manages the movement of the packet through the packet former 214, ED encoder 216, encoded packet buffer 218, control symbol encoder 220 and optical source 222, by asserting appropriate control signals. Once the packet is transmitted, the controller 224 enters the waiting state, and waits until either a successful acknowledgment or unsuccessful acknowledgment is received. The acknowledgments are transmitted from the receiver 240 in FIG. 22 to the transmitter 210, over the reverse optical channel 18, using special control symbols ACK and NACK. Each symbol is followed by a packet sequence number, which specifies which specific packet is being acknowledged. The controller 224 also sets a timer when the packet is transmitted. If an acknowledge is not received when the timer expires, the controller 224 will enter the transmitting state and enable the packet to be retransmitted, after which it enters the waiting state again. The controller 224 can be implemented using a finite state machine, with state transitions specified in a memory-based lookup table.

Operation of Stop-and-Wait Receiver

In the exemplary receiver 248 in FIG. 22, the optical detector 232 monitors the signals from the optical channel 16. The signals being received are forwarded from the optical detector 232 to the control symbol decoder 234. The control symbol decoder 234 corresponds to the control symbol encoder in the transmitter. The control symbol decoder 234 can optionally be the 8B/10B disparity decoder described earlier, which has the ability to receive data bytes and well as special control bytes, in a stream which is DC balanced. Alternatively, the control symbol decoder 234 could reserve certain bit patterns for control symbols, and process the data stream to recover the original data stream, while retaining the ability to receive control symbols.

The controller 242 is notified of the arrival of an incoming packet when the control symbol decoder 234 detects the SOP control symbol which precedes the first byte of the packet. When a packet is detected, the data is forwarded to the packet reconstruction buffer 236. The reconstruction buffer 236 reassembles a packet of typically 64 bytes. The end of packet is signaled by the EOP control symbol which follows the last byte of the packet. The control symbol decoder will detect the EOP and signal the controller 242. Once the packet is reassembled in the reconstruction buffer 236, the controller 242 enables the packet to be passed from buffer 236 to the ED decoder 238 which performs error detection processing. The controller 242 is signaled the status of the ED processing. If no bit errors are detected, the data is forwarded to the received data queue 240, and the controller 242 will send a control symbol ACK to the transmitter, notifying the transmitter of the successful status of the reception. If bit errors are detected, the data is rejected and the controller 242 will send a control symbol, NACK to the transmitter, notifying the transmitter of the negative status of the reception. The controller 242 will use the optical source 244 to send the acknowledgment, over the reverse channel 18.

It will later be shown that ED can be performed on partially received packet data, while the data is being received. In this case, the locations of the buffer 238 and the ED decoder 236 can be exchanged.

While the preceding discussion has mentioned optical detectors and optical sources, clearly the sources and detectors need not be optical; they may be electrical or radio-frequency sources and detectors.

Selective-Repeat Scheme

The preceding description applies to a "Stop-and-Wait" ARQ system. Once a packet is transmitted, no further transmission occurs until the transmission is acknowledged. This scheme generally leads to suboptimal performance, since the link is idle wait the transmitter is waiting for an acknowledgment.

A more efficient scheme is the "Selective-Repeat" ARQ scheme. In this scheme, a transmitter may have up to Y packet transmissions pending acknowledgments before it stops transmission.

Figure 23:
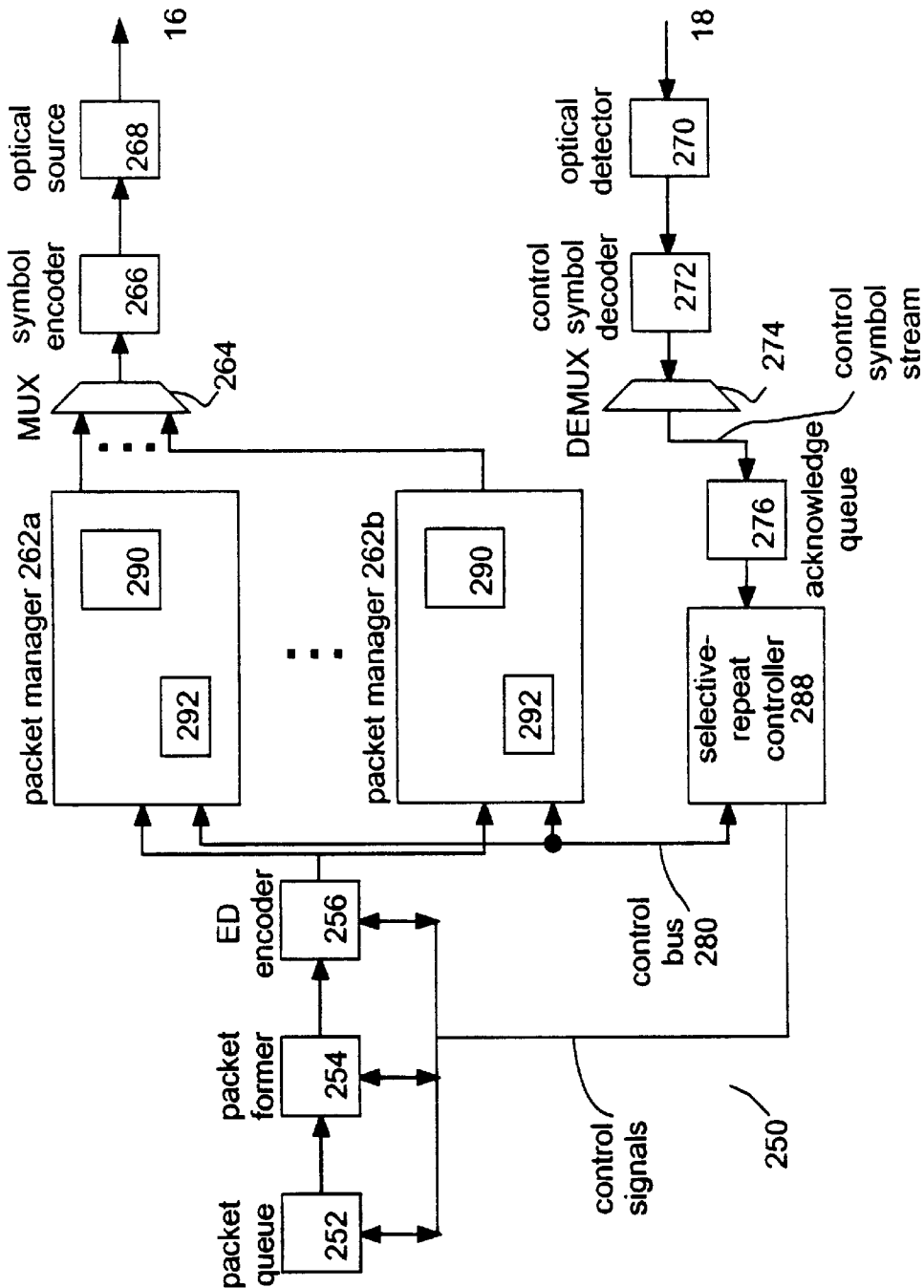
FIG. 23 is a simplified block diagram of an exemplary transmitter 250 for use in the system of FIG. 1.
Figure 36:
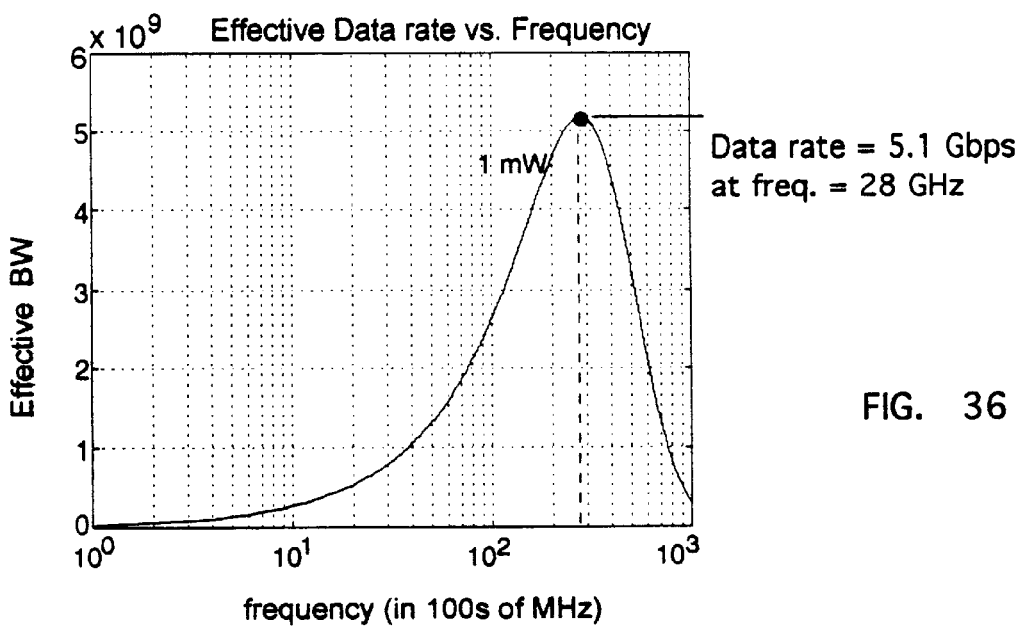
FIG. 36 illustrates link performance vs. link frequency, for the link in FIG. 35, where the retransmittable packet is further subdivided into smaller retransmittable subsets, with 2 levels of error detection code.

An exemplary transmitter 250 for the selective repeat (SR) scheme is shown in FIG. 23. An exemplary receiver 170 for the selective repeat scheme is shown in FIG. 36. The transmitter 250 consists of a packet queue 252, a packet former 254, an ED encoder 256, a plurality of "packet manager modules" 262a–262b, a multiplexer 264, a control symbol encoder 266, and an optical source 268. The transmitter 250 also includes an optical detector 270 coupled to reverse channel 18, a control symbol decoder 272, a demultiplexor 274, an acknowledge queue 276, and a SR-controller 278. There is a control bus 280 passing control signals between the packet managers 262a–262b and the Selective-Repeat controller 288.

Each packet manager 262 contains a encoded packet buffer 298 and a local controller 292.

Figure 24:
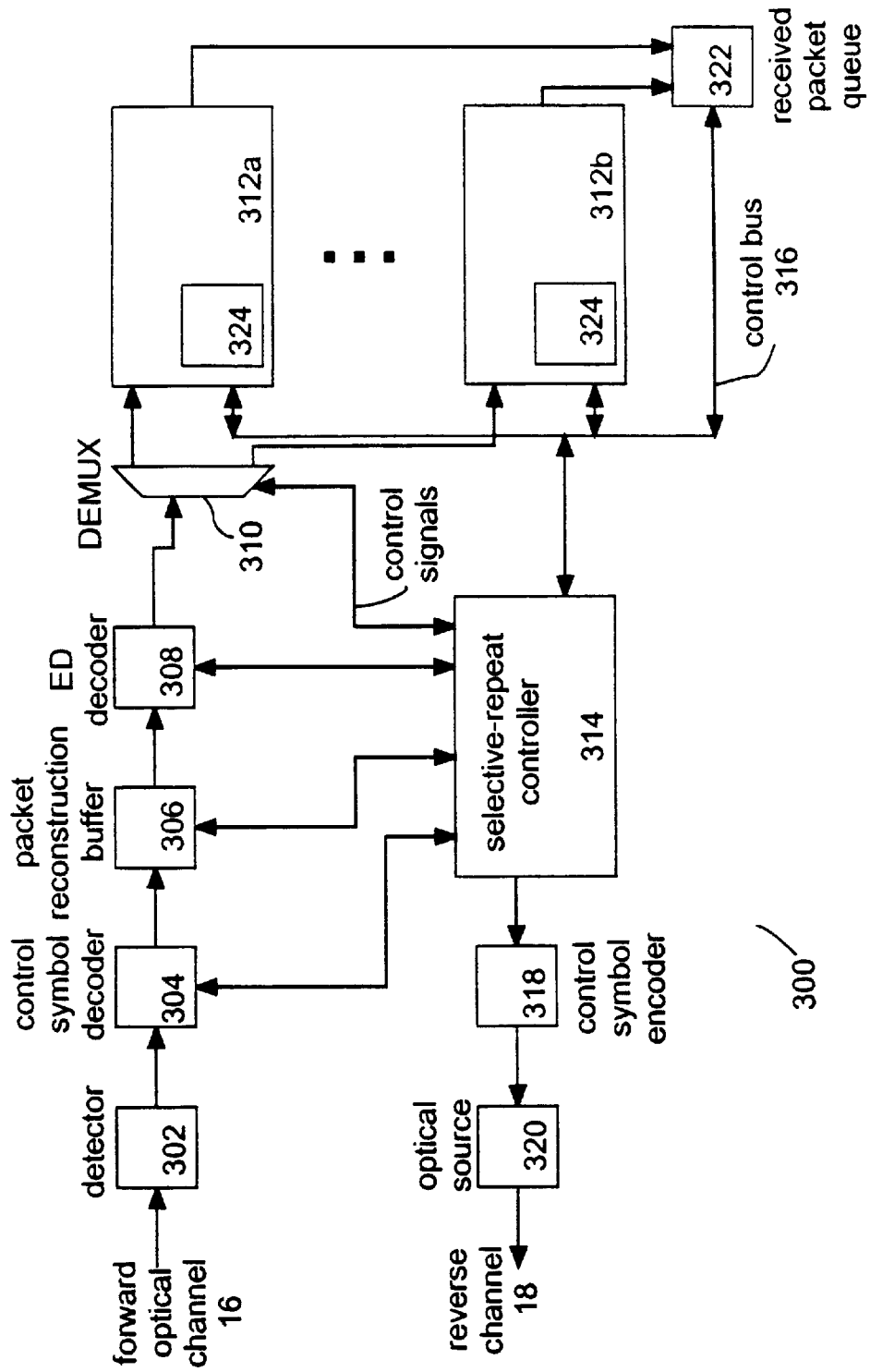
FIG. 24 is a simplified block diagram of an exemplary receiver 300 for use in the system of FIG. 1.

An exemplary receiver 300 for the selective repeat scheme is shown in FIG. 24. It consists of an optical detector 302 coupled to forward optical channel 16, a control symbol decoder 304, a packet reconstruction buffer 306, an ED decoder 308, a demultiplexor 310, a plurality of RX packet managers 312a–312b, an Selective-Repeat-controller 314, and control bus 315 for control signals between controller 314 and RX packet managers 312. Exemplary receiver 300 also contains a control symbol encoder 318 and an optical source 320, coupled to the reverse optical channel 18.

Operation of Selective-Repeat Transmitter

Referring to FIG. 23, the operation of transmitter 250 is similar to the operation of the transmitter 210 in FIG. 21. The Selective-Repeat controller 288 maintains a state table to record the status of each packet manager 262a–262b. When there is data to transmit in the packet queue 252, and if there is an idle packet manager 262, the idle packet manager 262 is signaled to transmit the packet, by controller 288, over control bus 280. Transmission is suspended only when there is no data to transmit, or when all packet managers 262 are in the waiting state, waiting for acknowledgments.

The Selective-Repeat controller 288 maintains a state table of data, which records the state of each packet manager 262, and the sequence number of the packet associated with each non-idle packet manager, if any. The optical detector 270 monitors the signals on the reverse optical channel 18, and forwards the electrical signals to the control symbol decoder 272. The control symbol decoder 272 processes the signals and signals the SR controller 288 when a control symbol is detected, through demultiplexor 274. The acknowledgment is forwarded to the acknowledge queue 276.

When an acknowledgment is received by the Selective-Repeat controller 288, the packet sequence number associated with the acknowledgment is examined. The Selective-Repeat controller 288 then determines which packet manager 262 should be notified, by examining the state table, and sends the appropriate control signals to the packet manager 262 over the control bus 280. If an ACK is received the appropriate packet manager 262 is signaled to clear its buffer and enter the idle state. If an NACK is received, the appropriate packet manager 262 is signaled to enter the transmitting state, at the appropriate time. The SR controller 288 may receive ACKs and NACKs from the reverse optical channel 18 at the acknowledge queue 276 at different times. The Selective-Repeat controller 288 arbitrates between several acknowledgments that may be pending, and any new data available for transmission in the packet queue 252. In general, the oldest pending packet should be serviced first, although other service orders can be used. For example, packets may be assigned priorities, which can be used to determine their service order.

Operation of Selective-Repeat Receiver

In FIG. 24, the operation of the exemplary Selective-Repeat receiver 300 corresponds to the operation of the transmitter 250 in FIG. 23.

Referring to FIG. 24, the optical detector 302 monitors the signals from the forward optical channel 16. The signals being received are forwarded from the optical detector 302 to the control symbol decoder 304. The control symbol decoder 304 corresponds to the control symbol encoder in the transmitter. The control symbol decoder 304 can optionally be the 8B/10B disparity decoder described earlier, which has the ability to receive data bytes and well as special control bytes, in a stream which is DC balanced.

The selective repeat controller 314 is notified of the arrival of an incoming packet when the control symbol decoder 304 detects the SOP control symbol which precedes the first byte of the packet. When a packet is detected, the data is forwarded to the packet reconstruction buffer 306. The reconstruction buffer 306 reassembles a packet of typically 64 bytes. The end of packet is signaled by the EOP control symbol which follows the last byte of the packet. The control symbol decoder 304 will detect the EOP and signal the controller 314. Once the packet is reassembled, the controller 314 enables the packet to be passed from buffer 306 to the ED decoder 308 which performs error detection processing. The controller 314 is signaled the status of the ED processing. If no bit errors are detected, the data is forwarded to the received data queue 322, by way of demultiplexor 310, and the controller 314 will send a control symbol, ACK to the transmitter over reverse channel 18, notifying the transmitter of the successful status of the reception. The RX packet managers 312 can be bypassed in this discussion. They will be used later when retransmission of subsets of encoded data is allowed. If bit errors are detected, the data is rejected and the controller 314 will send a control symbol, NACK to the transmitter over reverse channel 18, notifying the transmitter of the negative status of the reception. The selective repeat controller 314 will use the optical source 320 to send the acknowledgment, over the reverse channel 18.

While the preceding discussion has mentioned optical detectors and optical sources, clearly the sources and detectors need not be optical; they may be electrical or wireless sources and detectors. They may include basic "On-Off" signaling, where the presence of a signal is denoted by presence of power, and where the absence of a signal is denoted by the absence of power. Alternatively, they may include modulation schemes, where the for example the presence of a 0 signal or 1 signal is denoted by changes in the phase, frequency, or amplitude of an underlying carrier wave. Schemes such as Binary Phase Shift Keying, Frequency Shift Keying, Differential Phase Shift keying, Amplitude Modulation and Quadrature Amplitude Modulation, can all be used over the forward and reverse links.

Retransmission of Subsets

It will be shown that retransmissions of subsets of a packet, rather than the entire packet, yields performance improvements. Preferably, the subsets may be as small as 8 bytes of data. When a subset of a packet is received in error at a receiver, only that subset is requested for retransmission. Similarly, when a transmitter receives a retransmission request for a subset of a packet, only that subset is retransmitted. The exemplary transmitter 250 in FIG. 23 and the exemplary receiver 300 in FIG. 24 can be modified to implement the retransmission of subsets of packets. In particular, in FIG. 23 the encoded packet buffers 290 are modified to include a plurality of "encoded subset buffers" (not shown). Similarly, in FIG. 24 the decoded packet buffers 324 shown within the RX packet managers 312, are modified to include a plurality of "decoded subset buffers" (not shown). The basic operation of the system remains unchanged.

However, this ability to retransmit entire packets, as well as subsets of a packet, has a large advantage. It allows for the retransmission of small subsets of data, each encoded with a first level of error detection code which generally has fast but weak error detection ability. It also allows for the use of a more lengthy error detection code, spread over many subsets, which is used to detect "hard-to-find" errors. It is appreciated that more sophisticated error detection codes with more checksum bits are needed to detect hard-to-find errors. These more sophisticated codes must be spread over larger blocks of data, to amortize the checksum bits over larger blocks of data, to keep the coding efficiency relatively high. The ability to retransmit entire packets as well as subsets of a packet effectively enables the use of two levels of Error Detection codes: fast ED codes for the small retransmittable subsets, and more sophisticated ED codes spread over collections of subsets, so that the overhead is acceptable. Without using this multi-level coding scheme, the overhead of using a sophisticated ED code over a small block of data may be prohibitive.

Graphical Data

The effective data rate of the links, using retransmissions only to realise a performance gain, can be determined using a mathematical model, and several mathematical approximations. The use of different mathematical approximations may shift the positions of any of the curves, however all curves will tend to shift in the same manner and the general trends and conclusions will hold.

Assume the systems are "thermal noise limited", where the primary source of noise at the receivers is thermal noise in the transistors and thermal noise over the channel. The thermal noise power can be obtained by multiplying the Noise Equivalent Power (NEP) by the square root of the system operating frequency. The noise equivalent power is assumed to be $0.3*1e-9$ W/Hz$^{0.5}$. If a system is not thermal noise limited, it can be made thermal noise limited by reducing the amount of transmitter power available.

Basic ARQ Retransmission with 512 Data Bits and 32 Bit CRC

FIG. 25 illustrates the performance of a link when the Selective Repeat retransmission protocol is used, on a packet with 512 bits of data arranged in 64 bytes, with a 32 bit CRC checksum for Error Detection. In these graphs, we increase the clock frequency of the transmitter, intentionally introducing bit errors into the link. We rely upon the retransmission protocol to detect and correct these bit errors, so that the data can be received with a final Packet Error Rate (PER) of $10^{-12}$ which is acceptable to the user. This approach to realize a performance gain does not require any FECs at all. However, to find the correct operating point one must construct a mathematical model of the system and refer to several graphs, as will be shown.

Figure 25A:
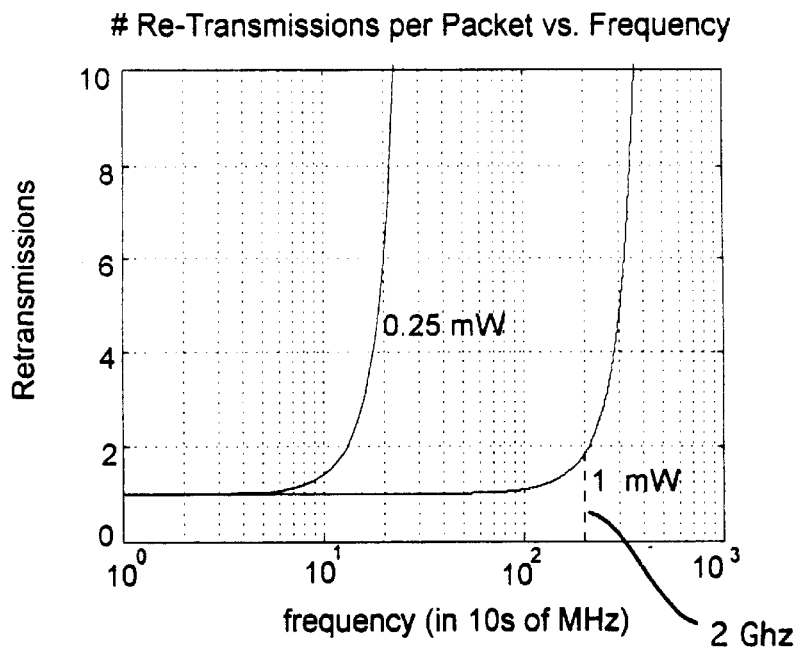
FIG. 25a, 25b, 25c illustrate the link performance vs. frequency retransmissions only.

FIG. 25a illustrates the number of retransmission attempts of a packet versus the transmission frequency. Curves for 2 power levels are shown: 1 milliwatt and 0.25 milliwatt. Observe that at low frequencies there are very few bit errors per packet and most packets are received correctly in their first transmission attempt. As the link frequency increases above 2 GHz for the rightmost curve, the average number of bit errors per packet will exceed 1, so that virtually every received packet has at least one bit error, causing the number of retransmissions to increase rapidly.

Figure 25B:
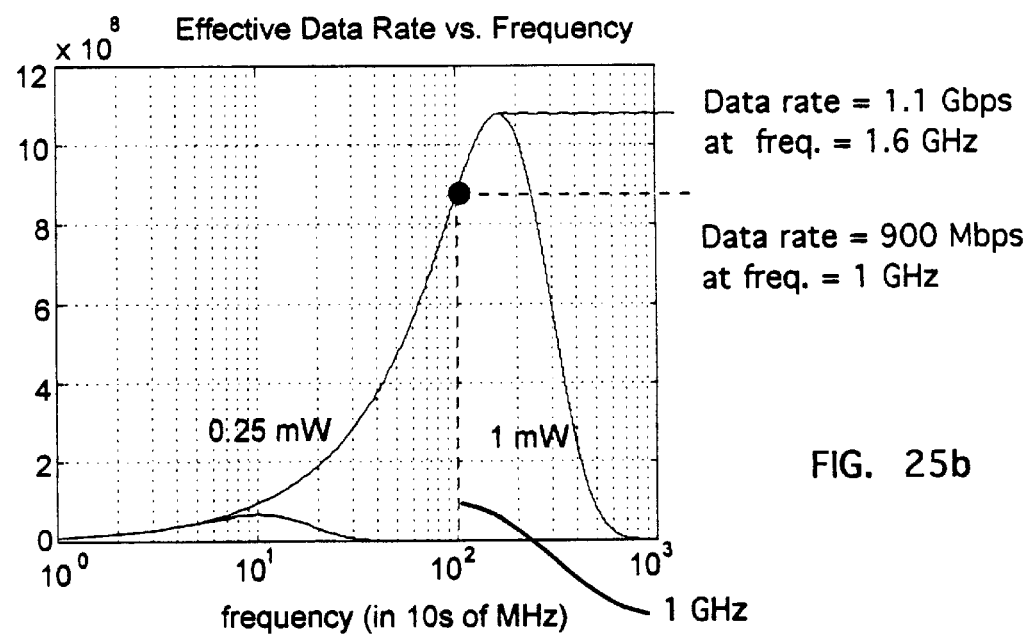

FIG. 25b illustrates the effective link data rate as a function of the transmission frequency. For the rightmost curve, observe that the maximum data rate is approx. 1.1 GHz when the link is operated at a frequency of approx. 1.6 GHz, as indicated at the peak of the curve. The frequency is read off the X-axis to be 1.6 GHz, and the effective data rate is read off the Y-axis to be 1.1 GHz. The difference between these two figures (1.6 GHz–1.1 GHz=0.5 GHz) represents the data rate per second lost to the overhead of the ED codes (32 bits for every 512 data bits), and the data rate lost due to the retransmissions of packets (at the maximum, every packet undergoes approx. 1.08 retransmissions on average). However, this frequency results in an unacceptable PER which exceeds $10^{-12}$, which can be determined from FIG. 25c.

Figure 25C:
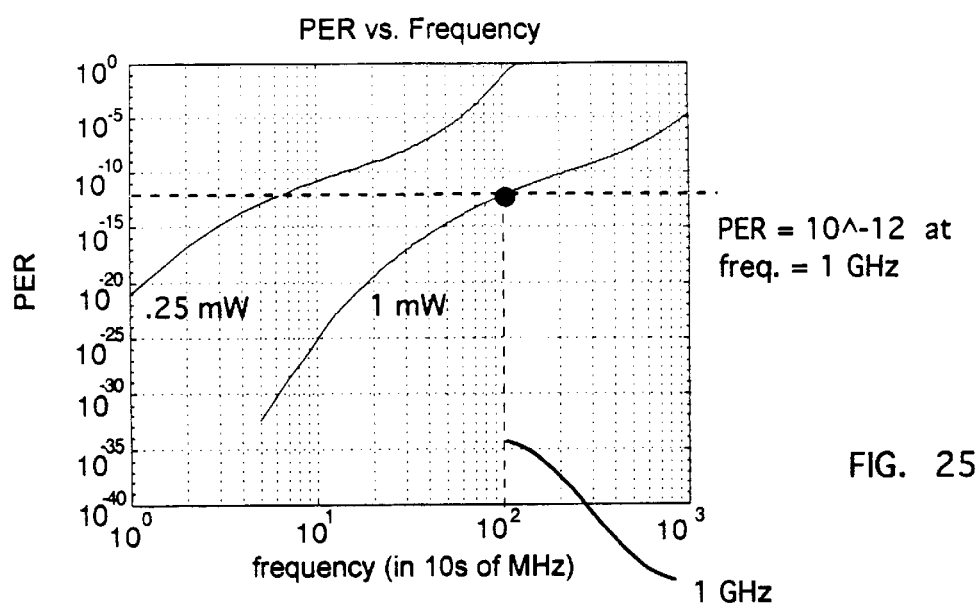

FIG. 25c illustrates the Packet Error Rate (PER) on the decoded and accepted data at the receiver, as a function of link frequency. The horizontal line denotes a PER of $10^{-12}$, our objective. To achieve a specified PER of $10^{-12}$, the 1 mW link can be clocked at approx. 1 GHz, determined by the intersection of the rightmost curve and the horizontal line, and denoted by the bold dot. Having determined the maximum frequency to be 1 GHz to ensure a PER of $10^{-12}$, the effective data rate at this frequency can be found by referring back to FIG. 25b. According to FIG. 25b, the data rate at a link frequency of 1 GHz is approx. 900 MHz, as indicated by the bold dot.

At a 1 GHz operating frequency, mathematical analysis indicates that the signal-to-noise ratio on the channel is approx. 53, the "raw" bit error rate on the channel is approx. $1.4*10^{-4}$, and the average number of retransmissions per packet is approx. 1.08. Hence, the link is operated at a frequency well above the "nominal" frequency where the raw BER is approx. $10^{-12}$. In fact, errors are intentionally introduced at a rate of approx. 100 million ($10^8$) times the nominal rate of $10^{-12}$, by operating the link at this very fast clock rate. This dramatic increase in bit errors is compensated for by using the retransmission protocol alone, without any FEC.

Observe that by using this retransmission technique and operating the link at a raw BER well above the nominal BER, the data rate can be increased dramatically, while maintaining the PER the received data to be below a threshold of $10^{-12}$. The effective data rate is 900 MHz, an increase of approx. 900 MHz/60 MHz=15 times compared to the reference link (the basic link operating at 60 MHz to ensure a BER of $10^{-12}$). In fact, the increase in data rate due to retransmissions alone, exceeds the increase due to the use of FEC alone, as shown in FIG. 20. Retransmissions alone are considerably more effective than FECs alone, for improving link performance.

Basic ARQ with 512 Data Bits, with 8 Subsets and 32 Bit CRC on Each Subset

Figure 26A:
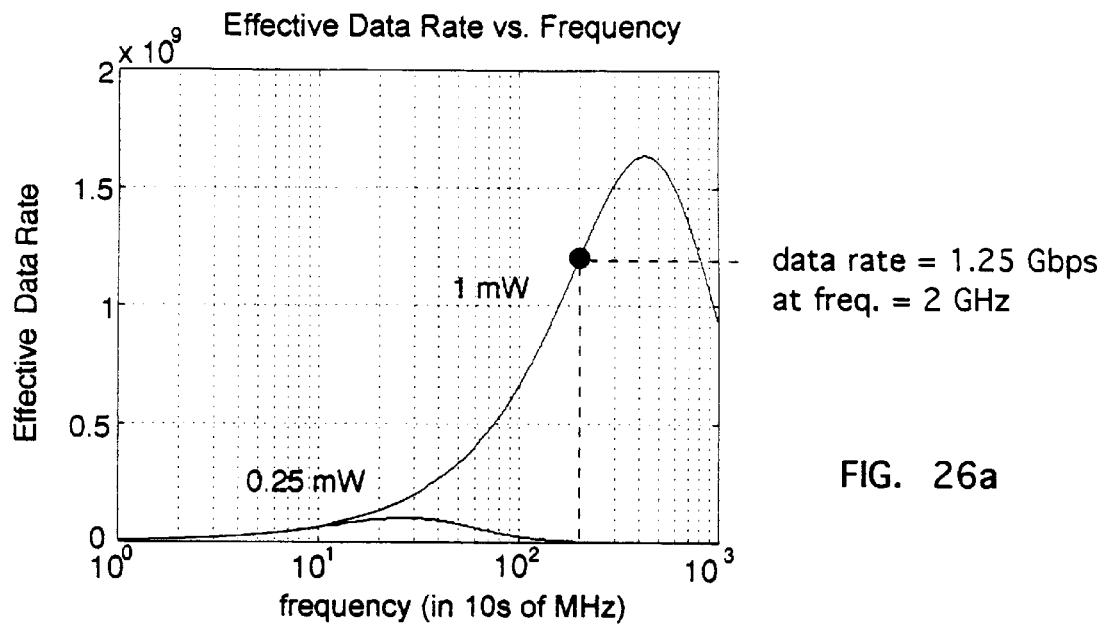
FIG. 26a, 26b illustrate link performance versus frequency, using retransmissions only, where retransmittable data is further partitioned into smaller retransmittable subsets.

The performance can be further improved if we allow for the retransmission of smaller subsets of a packet, rather than the complete packet. In FIG. 26, each 64 byte packet is formatted into 8 subsets, each encoded with a 32 bit CRC checksum. Each subset can be requested for retransmission in isolation, by the selective repeat ARQ protocol. This scheme requires appropriate modifications in the Selective-Repeat controller and packet manager hardware described earlier.

Figure 26B:
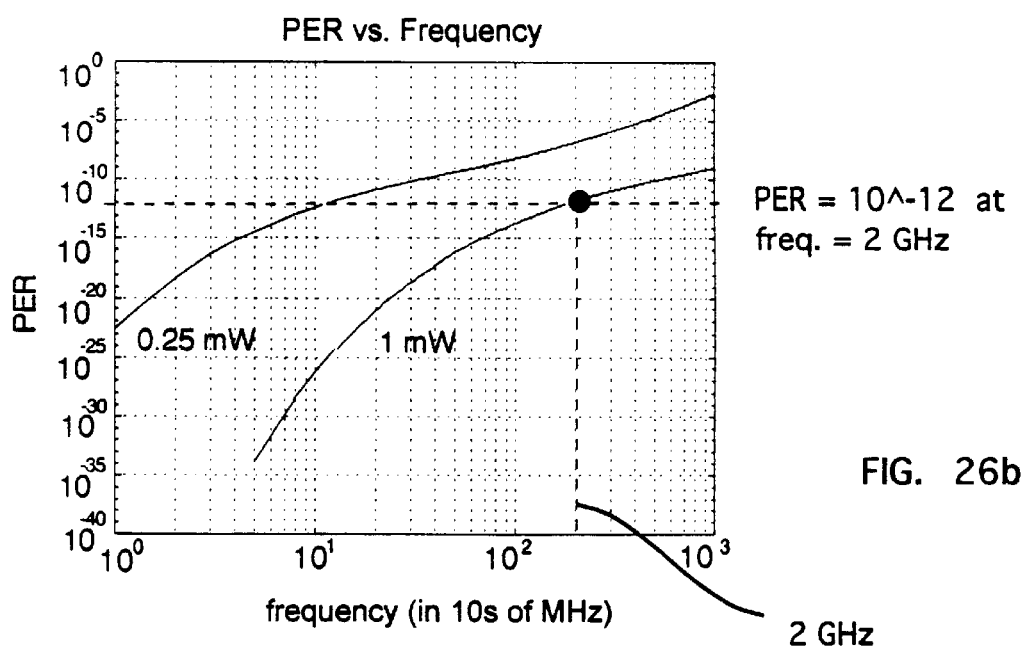

According to FIG. 26*b*, to maintain a specified PER of $10^{-12}$, the maximum clock frequency is approx. 2 GHz, as indicated by the bold dot. At this frequency, the effective data rate is determined by referring back to FIG. 26*a*, and it is approx. 1.25 GHz as indicated by the bold dot. This data rate represents an increase of approx. 20 times compared to the basic link operating at 60 MHz with a BER of $10^{-12}$.

These two graphs (FIG. 25 and 26) establish a powerful alternative to the use of FEC to improve link performance; Retransmissions alone outperform FECs. These graphs indicate that operating a data link at relatively high raw Bit Error Rates (near $10^{-4}$), and using retransmission protocols alone to handle the resulting bit errors, can yield significant data rate performance improvements.

Equivalently, these graphs indicate that operating a data link at relatively high raw Bit Error Rates (near $10^{-4}$), and using retransmission protocols alone to handle the resulting bit errors, can yield significant reductions in the level of transmitter power required to achieve a given data rate.

Combination of Retransmissions and FEC

We now combine the previous two techniques. The first technique used FEC encoding and decoding alone, in combination with operating the link at a relatively high raw BER of approx. $10^{-4}$, to achieve a data rate increase of approx. 2–4 times. The second technique used Retransmission alone, in combination with operating the link at a relatively high raw BER of approx. $10^{-4}$, to achieve a data rate increase of approx. 10–20 times. These two techniques will now be combined.

Basic ARQ with 512 Data Bits, with 32 Bit CRC with (7,4,1) FEC

Figure 27A:
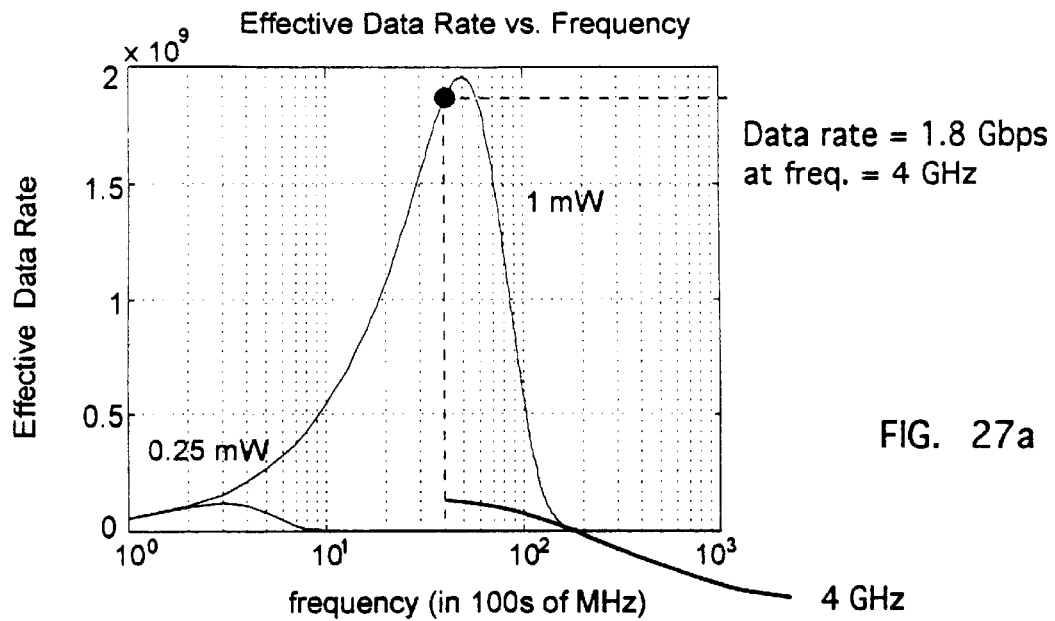
FIG. 27a, 27b illustrate link performance versus frequency, using a combination of retransmissions and (7,4) FECs.

In FIG. 27, each packet is transmitted as a single entity and retransmission requests apply to the complete packet. The transmissions on the channel are encoded using a pipelined (7,4,1) Hamming code which can correct single bit errors in the 7 bit encoded word.

Figure 27B:
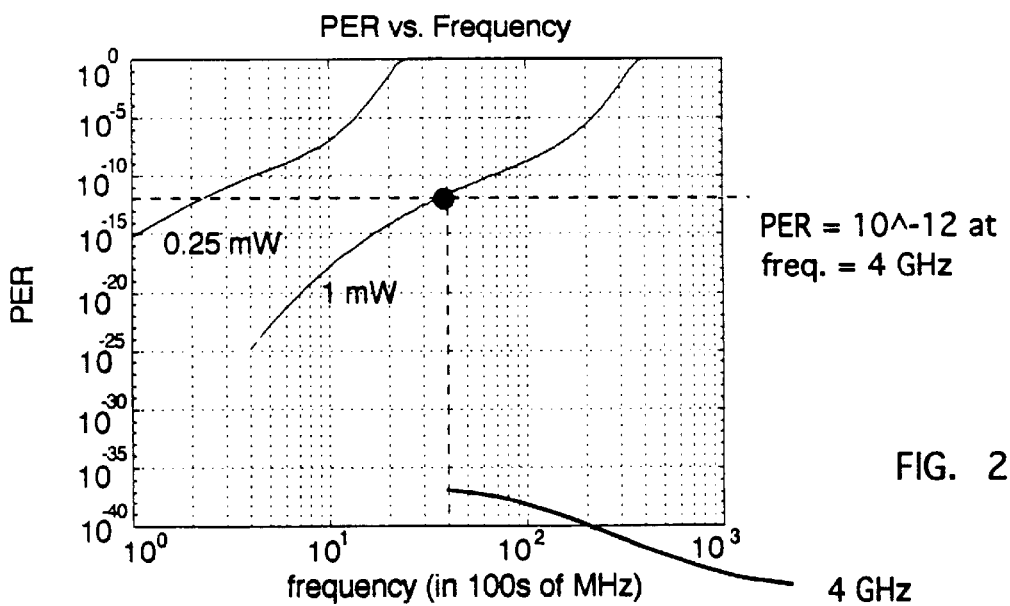

Referring to FIG. 27*b*, to maintain a specified PER of $10^{-12}$, the maximum clock frequency is approx. 4 GHz. According to FIG. 27*a*, at this frequency the effective data rate is approx. 1.8 GHz. At this frequency, the raw BER of the link is approx. 0.005, as determined from FIG. 20. This data rate represents an increase by a factor of 30 when compared to the reference data link.

This graph establishes a powerful alternative to the use of FEC alone, or retransmissions alone, to improve link performance. This graph indicates that operating a data link at relatively high raw Bit Error Rates (near $10^{-4}$), and using retransmission protocols in combination with relatively small and pipelined Forward Error Correcting codes to handle the resulting bit errors, can yield significant data rate performance improvements or transmitter power reductions.

Basic ARQ with 512 Data Bits, with 32 Bit CRC with (15,7,2) FEC

Figure 28A:
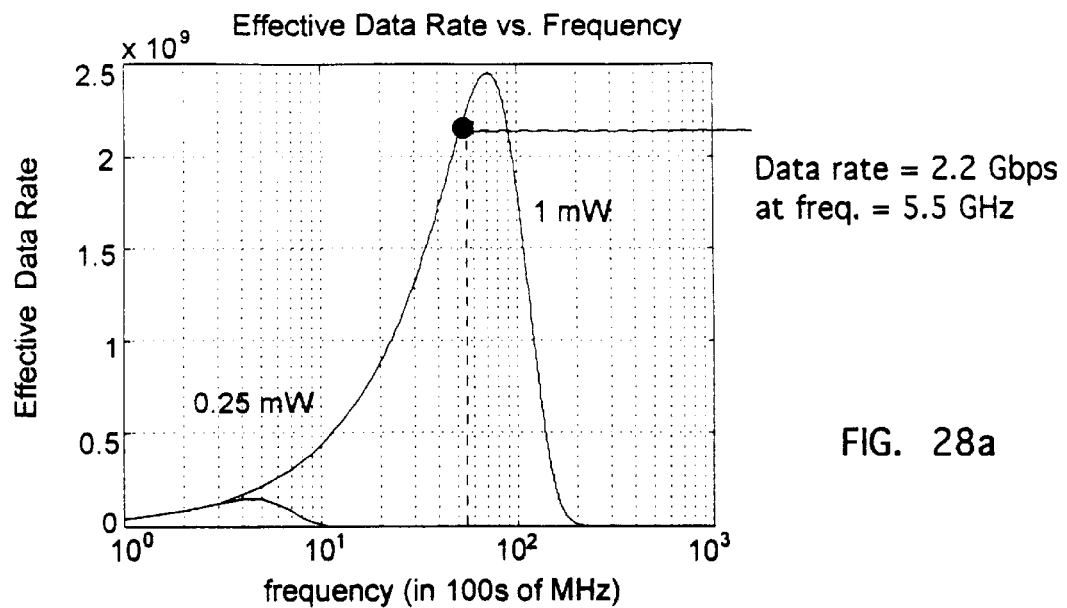
FIG. 28a, 28b illustrate link performance versus link frequency, using retransmissions and (15,7) FECs.
Figure 28B:
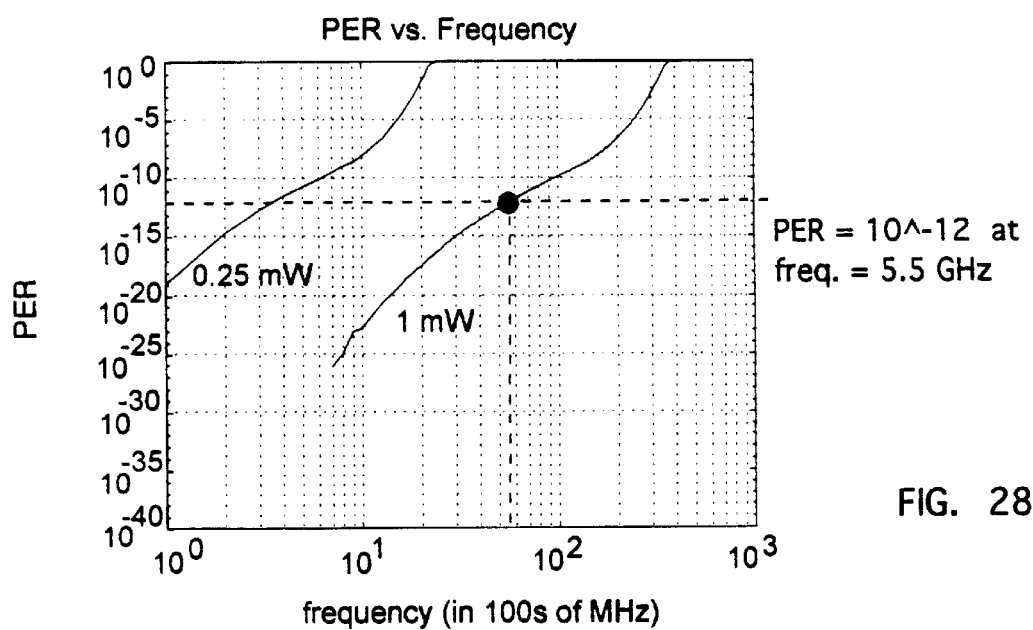

Referring to FIG. 28*b*, to maintain a specified PER of $10^{-12}$, the maximum clock frequency is approx. 5.5 GHz. According to FIG. 28*a*, at this frequency the effective data rate is approx. 2.2 GHz. At this frequency, the raw BER of the link is approx. 0.0075. This data rate represents an increase by a factor of 36 when compared to the reference data link.

Basic ARQ with 512 Data Bits, with 32 Bit CRC with (15,5,3) FEC

Figure 29A:
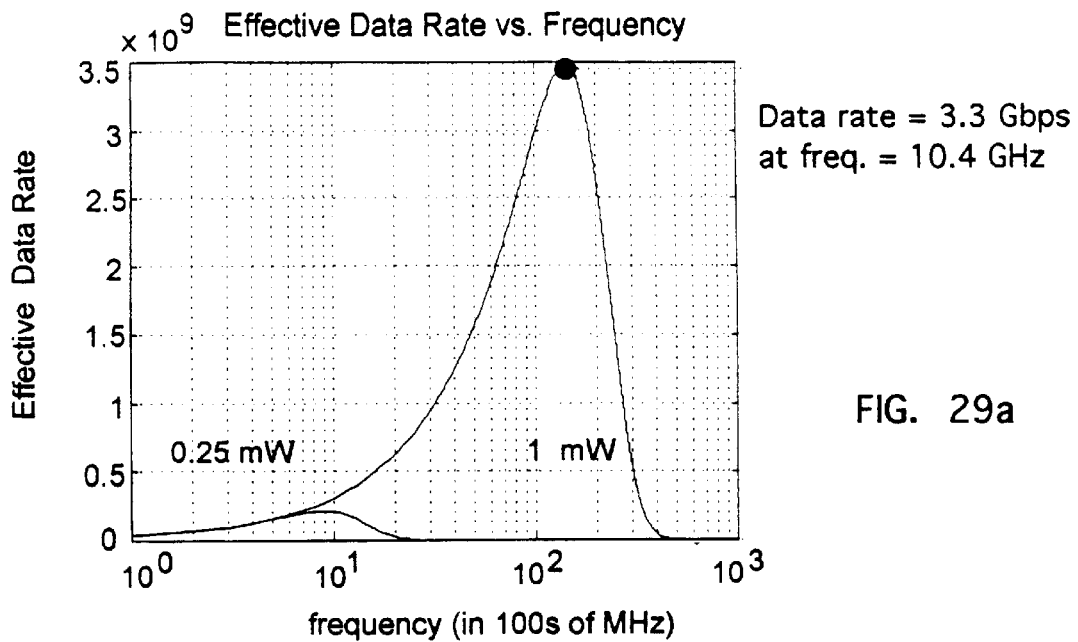
FIG. 29a, 29b illustrate link performance versus link frequency, using retransmissions and (15,5) FECs.
Figure 29B:
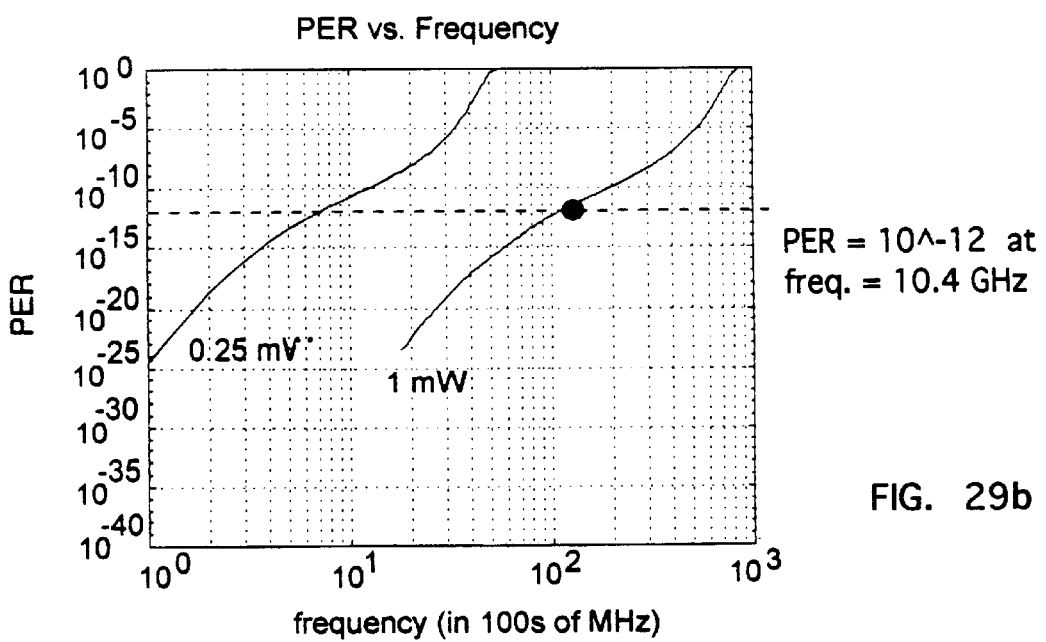

Referring to FIG. 29*b*, to maintain a specified PER of $10^{-12}$, the maximum clock frequency is approx. 10.4 GHz. According to FIG. 29*a*, at this frequency the effective data rate is approx. 3.3 GHz. At this frequency, the raw BER of the link is approx. 0.02, i.e., on average 2 bits out of every 100 bits transmitted will be erroneous. However, the FEC and retransmission protocols will detect and correct most of these bit errors, and the net result is a significant performance improvement. This data rate represents an increase by a factor of 55 when compared to the reference data link.

Basic ARQ with 512 Data Bits, with 32 Bit CRC with (31,16,3) FEC

Figure 30A:
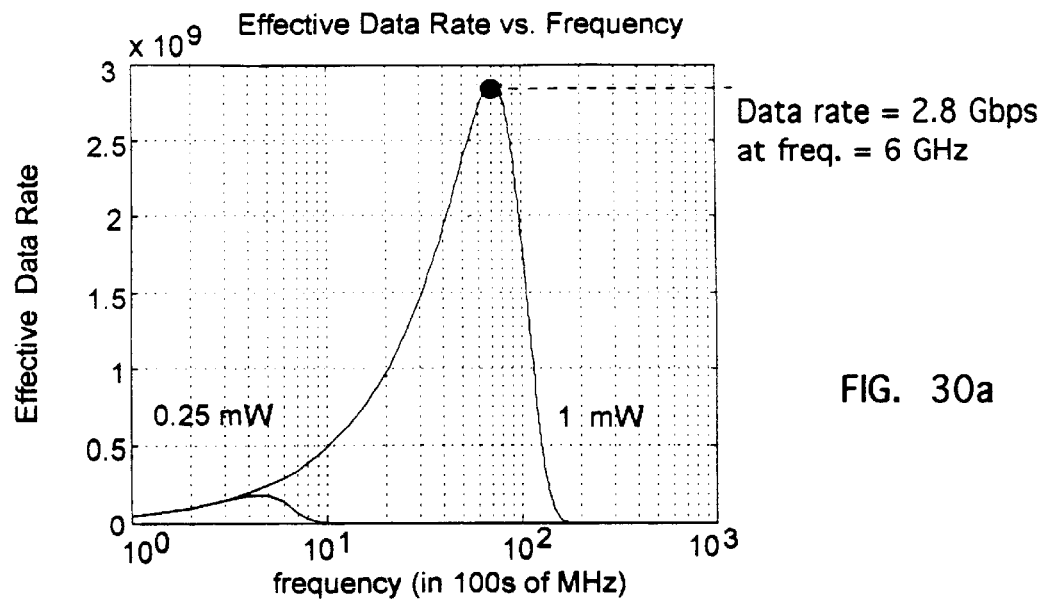
FIG. 30a, 30b, illustrate link performance versus link frequency, using retransmissions and (31,16) FECs.
Figure 30B:
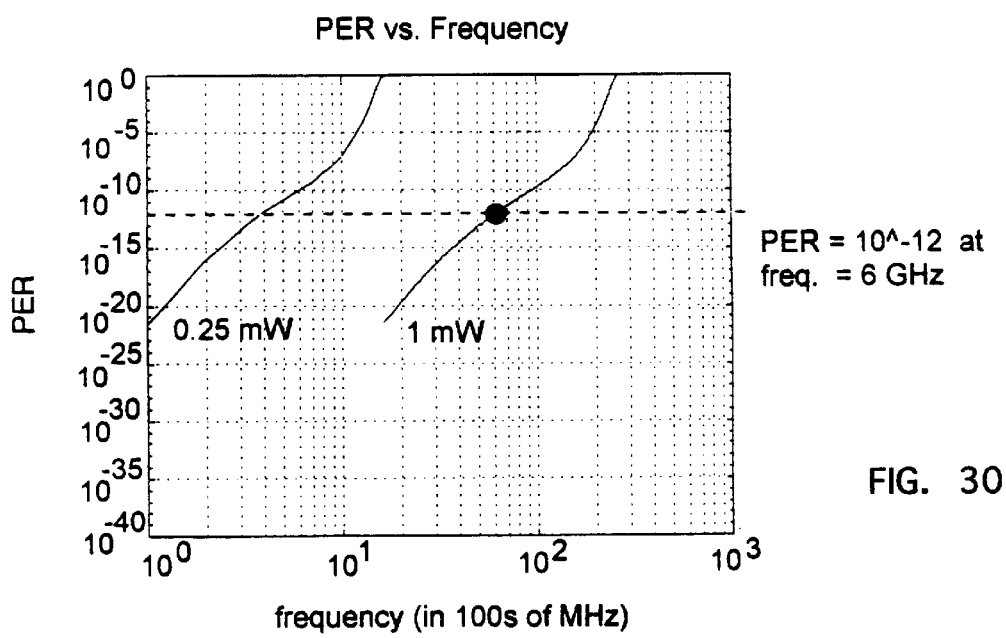

Referring to FIG. 30*b*, to maintain a specified PER of $10^{-12}$, the maximum clock frequency is approx. 7 GHz. According to FIG. 30*a*, at this frequency the effective data rate is approx. 2.8 GHz. At this frequency, the raw BER of the link is approx. 0.008. However, the FEC and retransmission protocols will detect and correct most of these bit errors, and the net result is a significant performance improvement. This data rate represents an increase by a factor of 46 when compared to the reference data link.

Basic ARQ with 512 Data Bits, with 32 Bit CRC with (31,11,5) FEC

Figure 31A:
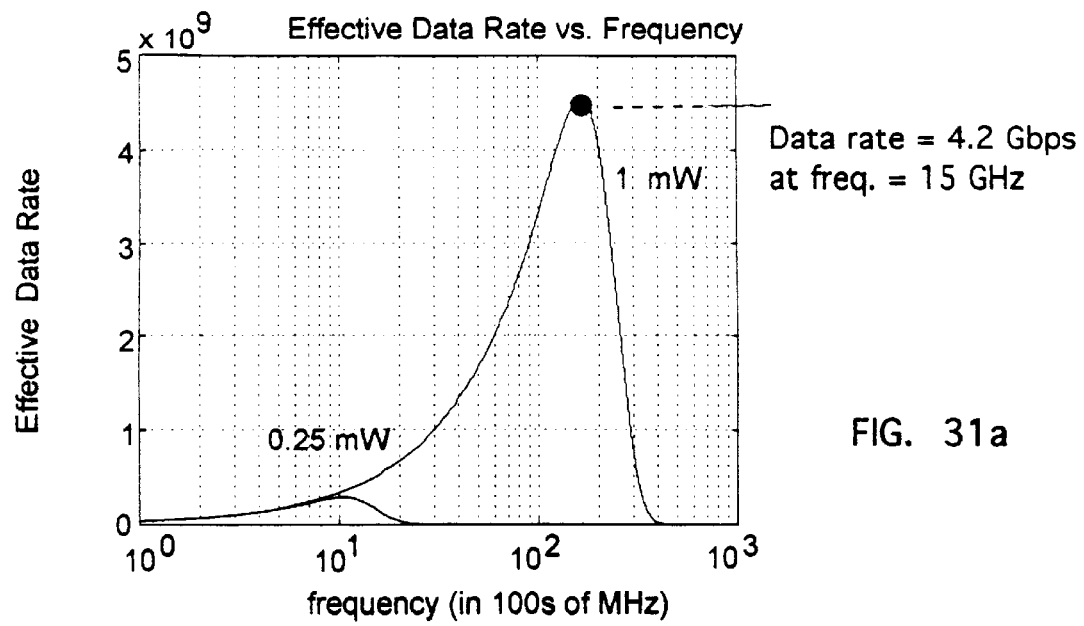
FIG. 31a, 31b illustrate link performance versus link frequency, us8ing retransmissions and (31,11) FECs.
Figure 31B:
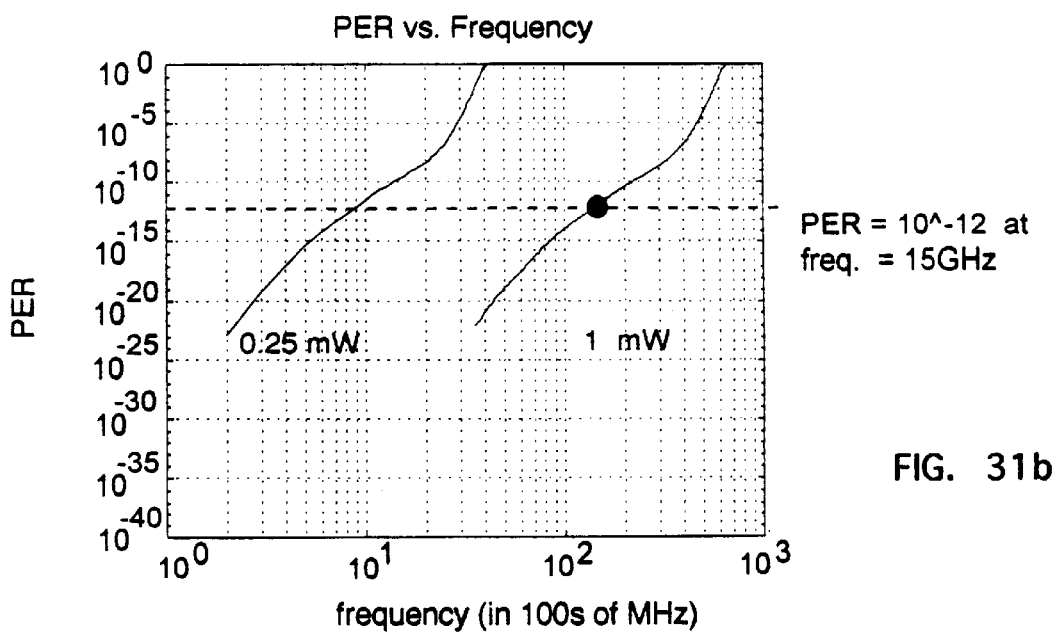

Referring to FIG. 31*b*, to maintain a specified PER of $10^{-12}$, the maximum clock frequency is approx. 15 GHz. At this frequency, the effective data rate is approx. 4.2 GHz. At this frequency, the raw BER of the link is approx. 0.035. However, the FEC and retransmission protocols will detect and correct most of these bit errors, and the net result is a significant performance improvement. This data rate represents an increase by a factor of 70 when compared to the reference data link.

Basic ARQ with 512 Data Bits, Partitioned into 8 Subsets with 32 Bit CRC Each, with (31,11,5) FEC We now combine the previous techniques: the use of FEC encoding and decoding, and the use of ARQ retransmissions to request retransmissions on subsets of a full packet.

Figure 32A:
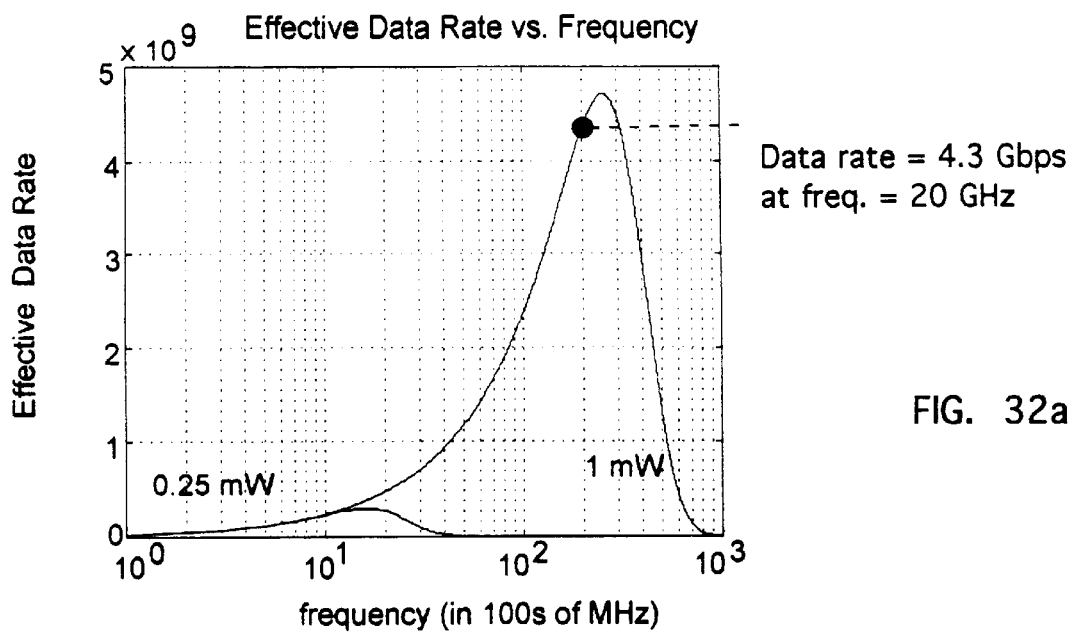
FIG. 32a, 32b illustrate link performance vs. link frequency, using retransmissions and FECs, where each retransmittable packet is further subdivided into smaller retransmittable subsets.
Figure 32B:
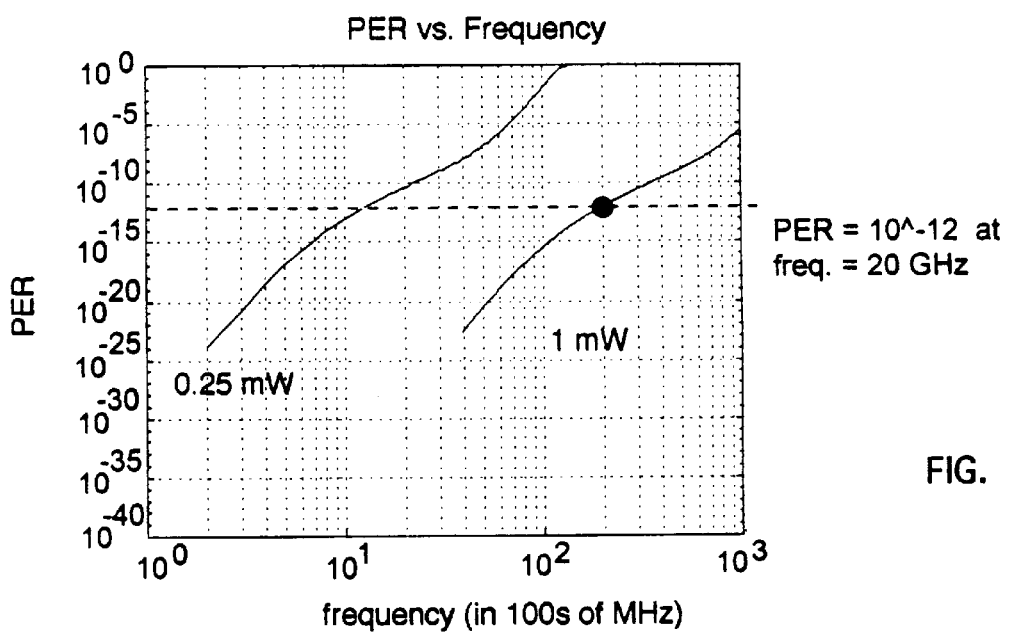

Referring to FIG. 32*b*, to maintain a specified PER of $10^{-12}$, the maximum clock frequency is approx. 20 GHz.

According to FIG. 32a, at this frequency the effective data rate is approx. 4.3 GHz. This data rate represents an increase by a factor of 71 when compared to the reference data link.

Alternative Error Detection Encoding and Decoding Schemes

In time-critical applications, the choice of error detection (ED) encoding/decoding scheme may be critical. In computer communications, excessive delays can significantly degrade system performance. In shared memory computing applications, it may be beneficial to perform error detection encoding and decoding as quickly as possible, even at the expense of using a less efficient ED coding scheme with more checkbits. In this case, the multi-dimensonal parity encoding scheme can be used.

The following graphs apply to an error detection code based on a 3 dimensional parity check. A more powerful code is based upon a 3 dimensional checksum.

Basic ARQ with 512 Bit Data, with 217 Parity Bits

Figure 33:
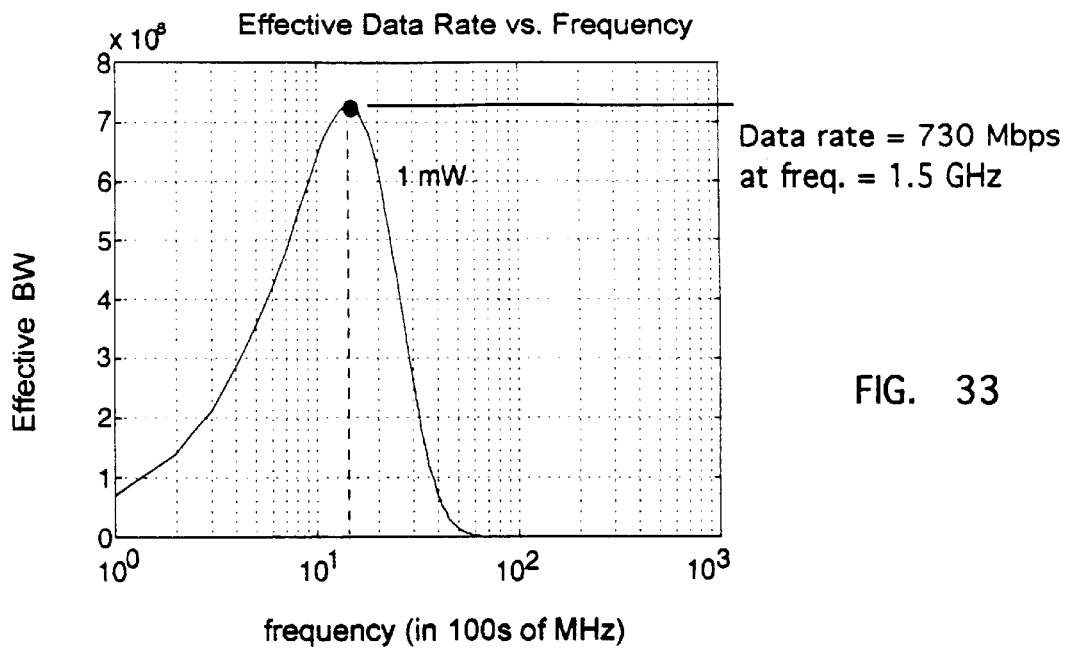
FIG. 33 illustrates the link performance using retransmissions only with a 3D parity check.

FIG. 33 illustrates the performance of a link when the Selective Repeat protocol is used, with a 3D parity checksum. In this case, an entire packet is treated as a retransmittable unit. FIG. 33 illustrates the effective data rate versus the transmission frequency. The maximum data rate occurs at a clock frequency of 1.5 GHz. The maximum data rate at this frequency is approx. 730 Mhz. This data rate represents an increase by a factor of 12 when compared to the reference data link.

Figure 34:
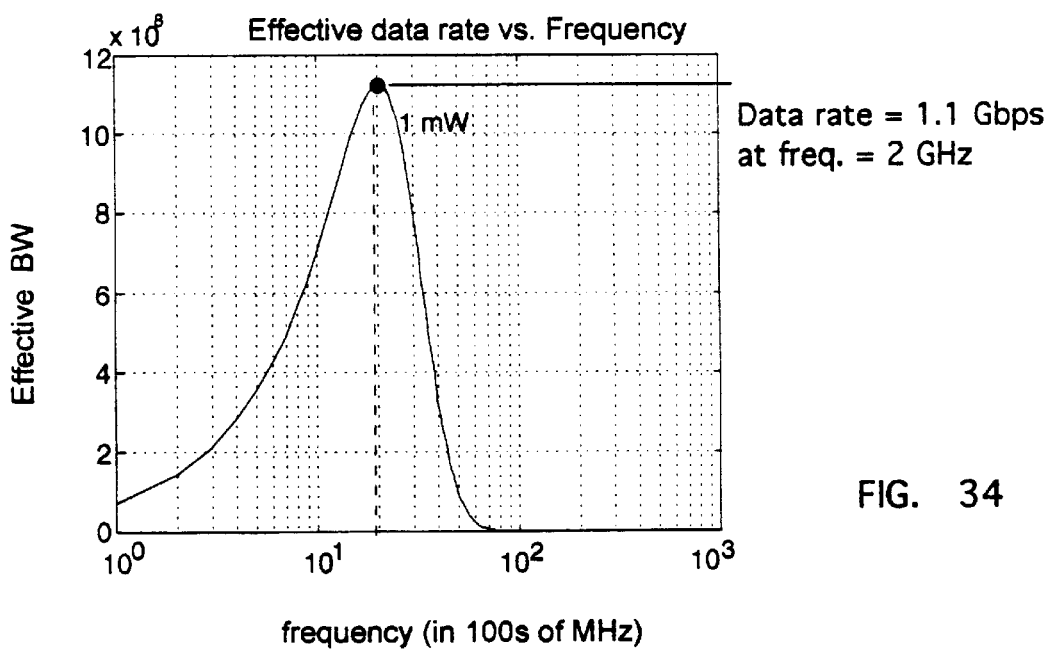
FIG. 34 illustrates the data rate vs. link frequency, for the link of FIG. 33, with the addition of a single bit forward error correction using the 3D parity check.

FIG. 34 illustrates the performance of a same system as FIG. 33, except that the 3D parity check decoder is enabled to perform single error correction (SEC) on the data when a single error is detected. A single error is detected by observing a parity error in the X, Y and Z dimensions, and is easily corrected by inverting the bit. FIG. 34 illustrates the effective data rate versus the transmission frequency. The maximum data rate occurs at a clock frequency of 2 GHz. The maximum data rate at this frequency is approx. 1.1 GHz. This data rate represents an increase by a factor of 18 when compared to the reference data link. Hence, allowing for a simple SEC scheme at the ED decoder, the data rate improves.

Figure 35:
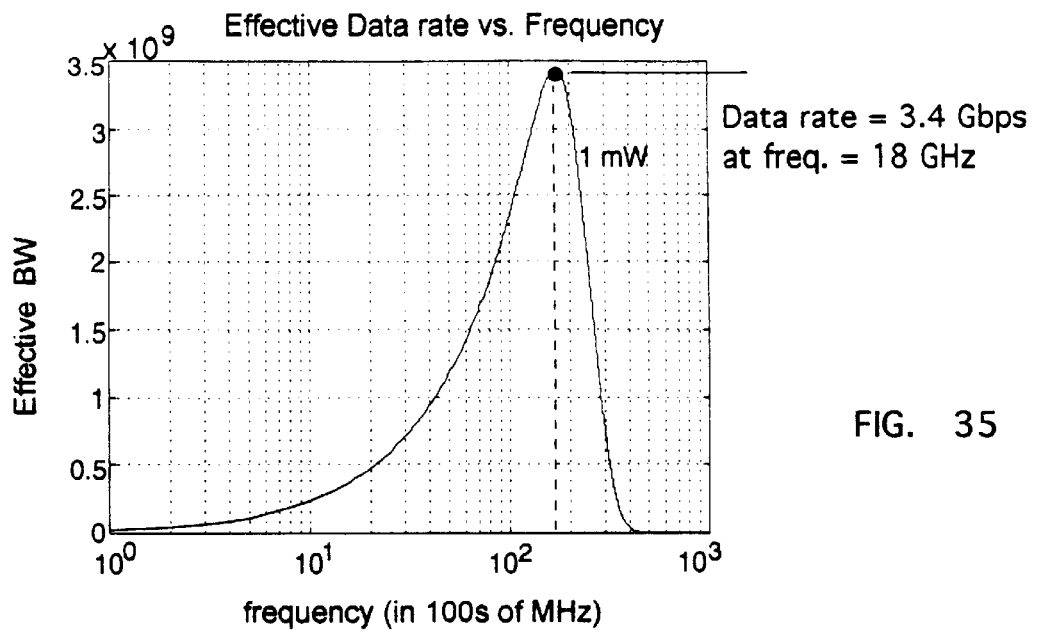
FIG. 35 illustrates the data rate vs. link frequency, for the link of FIG. 34, with the addition of (15,5) BCH FEC.

FIG. 35 illustrates the performance of a same system as FIG. 34, with the addition of FEC encoders and decoders. A (15,5,3) triple error correcting pipelined BCH encoder and decoder are used just prior to transmission, and just after reception. FIG. 35 illustrates the effective data rate versus the transmission frequency. The maximum data rate occurs at a clock frequency of 18 GHz. The maximum data rate at this frequency is approx. 3.4 GHz. This data rate represents an increase by a factor of 56 when compared to the reference data link.

FIG. 36 illustrates the performance of a same system as FIG. 35, with the following exceptions. The packet is partitioned into 9 subsets, each of which can be requested for retransmission. In addition, a pipelined (15,5,3) BCH code is used for the FEC. FIG. 36 illustrates the effective data rate versus the transmission frequency. The maximum data rate occurs at a clock frequency of 28 GHz. The maximum data rate at this frequency is approx. 5.1 GHz. This data rate represents an increase by a factor of 85 when compared to the reference data link.

This exemplary 3D system can be viewed as a multi-level error detection (ED) coding scheme. Each subset is encoded by a first ED coding scheme (2D parity check), which detects many simple error patterns. As soon as errors are detected in a subset, it can be requested for retransmission. All subsets are further encoded by a second ED coding scheme (parity check in the Z dimension). The second ED scheme on the collection of subsets lowers the undetected bit errors dramatically, by approx. $10^{\wedge}8$ in this exemplary system. Hence, this exemplary multi-level ED scheme provides the benefits of sending and receiving small subsets of data, yet it provides the error detection capability of a large ED code operating on a large set of data. This exemplary multi-level ED encoding/decoding scheme can use other coding schemes as well. For example, it is possible to have a small 8 bit CRC operate on the subsets, with a larger CRC as the second ED code.

The exemplary 3D coding scheme can also use other coding schemes. For example, a 64 byte packet can be viewed as a 16×32 array of data bits. Each 16 bit row can be ED encoded with a small 8 bit CRC, and each 32 bit column can be further encoded by a small 8 bit CRC. This example can be called an orthogonal CRC code. One advantage of this scheme is that it is faster to encode and decode small CRCs that a large CRC.

Packaging

The exemplary transmitter 12 and exemplary receiver 14 can be realized several ways. The processing logic can be realized on a CMOS integrated circuit. CMOS integrated circuits are described in N. Weste et al., Principles of CMOS VLSI Design; a System Perspective", 2nd edition, Addison Wesley.

An integrated circuit (IC) has a limited electronic Input/Output (IO) bandwidth of typically a few Terabits per second due to IC packaging constraints. Each IC package has at most a few thousand IO pins due to constraints associated with the connections between the IC substrate and the IC package. A discussion of IC packaging limitations is given in L. L. Moresco, "Electronic System Packaging: The Search for Manufacturing the Optimum in a Sea of Constraints", IEEE Transactions on Components, Hybrids, and Manufacturing Technology", Vol. 13, No. 3, September 1990. Common techniques to interconnect a integrated circuit VLSI die with a package, including flip-chip bonding, are described in R. R. Tummala and E. J. Rymaszewski (Ed.), "MicroElectronics Packaging Handbook", Reinhold, 1989. Current high density packages include Ball Grid Array (BGA) packages, Pin Grid Array (PGA) packages, and Quad Plastic Flatpack (QPF) packages, which are described by Altera Corp, California.

Laser diodes are manufacturing on III-V compound integrated circuits (ICs), such as Gallium Arsenide or Indium Phosphide. CMOS logic is often manufactured on substantially silicon based integrated circuits, which allow for higher levels of integration and higher yield than the III-V ICs.

The flip-chip bonding of optical laser diodes and photodetectors onto CMOS substrates is described in JSTQE, Louderback et al pg. 157, JSTQE, pg 184 Kosaka, JSTQE pg 193, Neyer et al, and several other papers in the aforementioned JSTQE issue. In this process, individual VCSELs and/or photodetectors, with dimensions typically of 20×20 microns or smaller, can be electrically bonded to the top of a CMOS substrate, which has appropriate electrical bonding pads and electrical connections etched onto its surface. These optical devices thereby become operably connected to the CMOS substrate.

Commercial laser diode arrays and photodetector arrays can be implemented as discrete packages. These devices can also be packaged as a single package, using a multi-chip module to house the devices. Multi-chip modules are described in Tummala et al, and Moresco et al. A multi-chip module (MCM) is a substrate with finely defined metal traces and metal bonding pads on its surface. Bare VLSI die can be flip-chip bonded or otherwise connected to the MCM, receiving power and ground from the MCM, and thereby establishing electrical contact with the finely defined metal traces. These metal traces may lead to other MCM mounted devices. An MCM supports relatively high density and high bandwidth connections between the VLSI die it packages.

Adjustable Frequency

Figure 37:
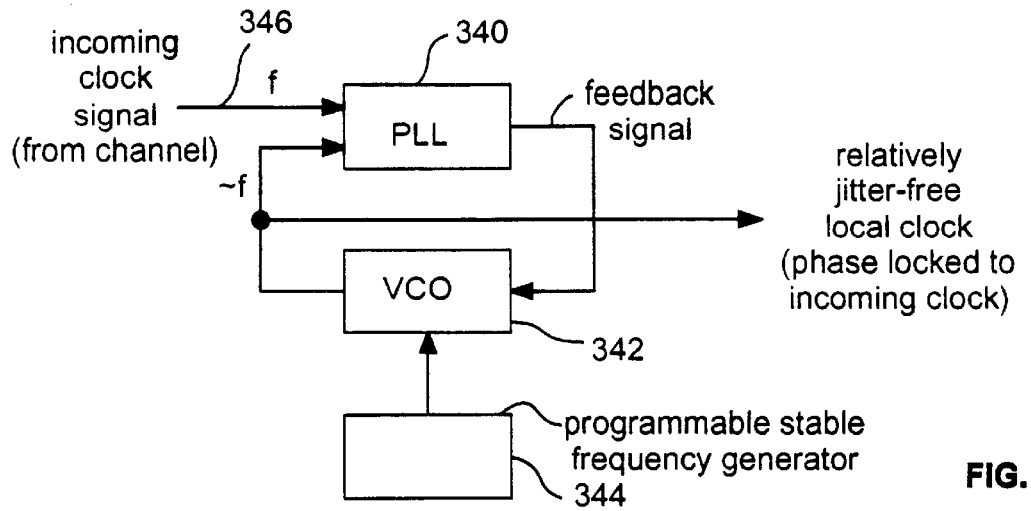
FIG. 37 illustrates exemplary programmable clock generator.

It is preferable to allow the transmission frequency of the transmitter to be adjustable, responsive to control signals. This can be accomplished by using a controllable frequency generator coupled to a Phase Locked Loop (PLL). FIG. 37 illustrates an exemplary controllable frequency generator, consisting of a Phase Locked Loop (PLL) 340 and a Voltage Controlled Oscillator (VCO) 342, which is frequency and phase locked to the incoming clock 346. The frequency is also tied to a reference frequency from a programmable frequency generator 344.

Figure 38:
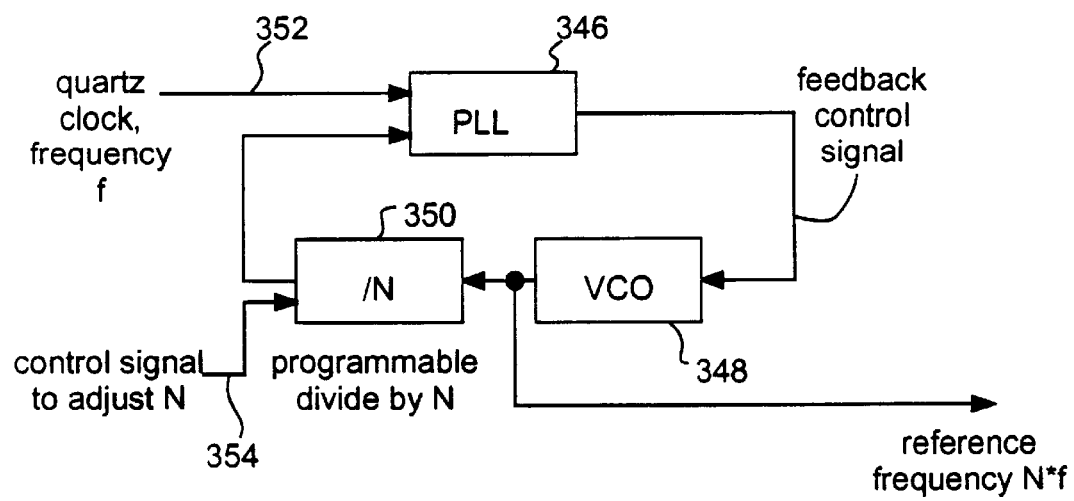
FIG. 38 illustrates exemplary programmable frequency generator.

FIG. 38 illustrates an exemplary programmable frequency generator, consisting of a PLL 346, a VCO 348, a programmable divide by N digital circuit (a modulo N up counter) 350, and a reference quartz clock 352. The divide by N circuit is controlled by control signals 354, to adjust parameter N. This circuit generates a stable reference frequency of N*f, which may be supplied to the VCO 342 in FIG. 37a.

The data link controllers can be controlled from an external source to start at an initial frequency, for example 1 GHz, until they reach synchronization. Thereafter, the frequency can be adjusted upward, under external control, in multiples of the quartz reference clock f.

Timing

It is preferable that the transmitter supply a value of the transmitter clock over the optical channel, which the receiver can lock onto using the PLL 340 in FIG. 37. The PLL 340 is used to remove excessive jitter from the incoming clock received over the channel. The clock received from the channel may incur jitter and bit errors, and should not be used directly to control the reception of data. However, it can be used as a reference, for a stable local clock to be locked onto.

It is furthermore preferable that in fiber image guide data links, several transmitter clocks be transmitted over the channel, where each transmitter clock controls the timing for a number of nearby optical transmissions. This scheme avoids the situation where a single clock controls the timing for all parallel bits being received over the image guide.

Application to an Optical Ring

Figure 39:
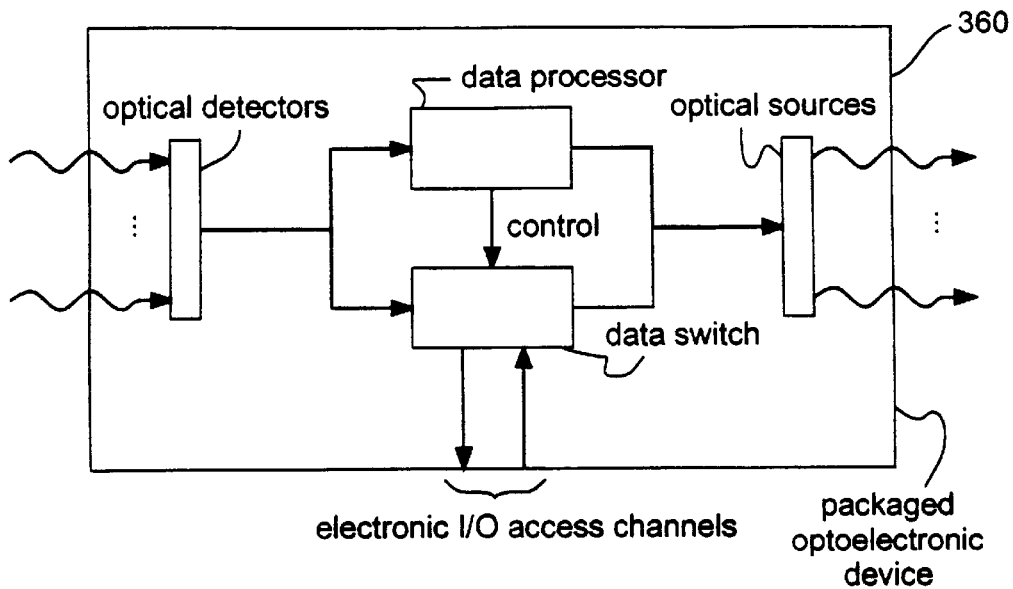
FIG. 39 illustrates an exemplary packaged optoelectronic device for an intelligent optical ring.

FIG. 39 illustrates an exemplary controllable optoelectronic data processor and data switch for an intelligent optical ring. It includes an optical detector array, an input latch, a data processor, a data switch, an output latch, an optical source array, and electrical I/O channels for access the device from an external computer. Such a device is described in U.S. Pat. No. 6,016,211, "Optoelectronic Smart Pixel Array for a Reconfigurable Intelligent Optical Interconnect", January 2000, by Szymanski and Hinton, which is hereby incorporated by reference.

Figure 40:
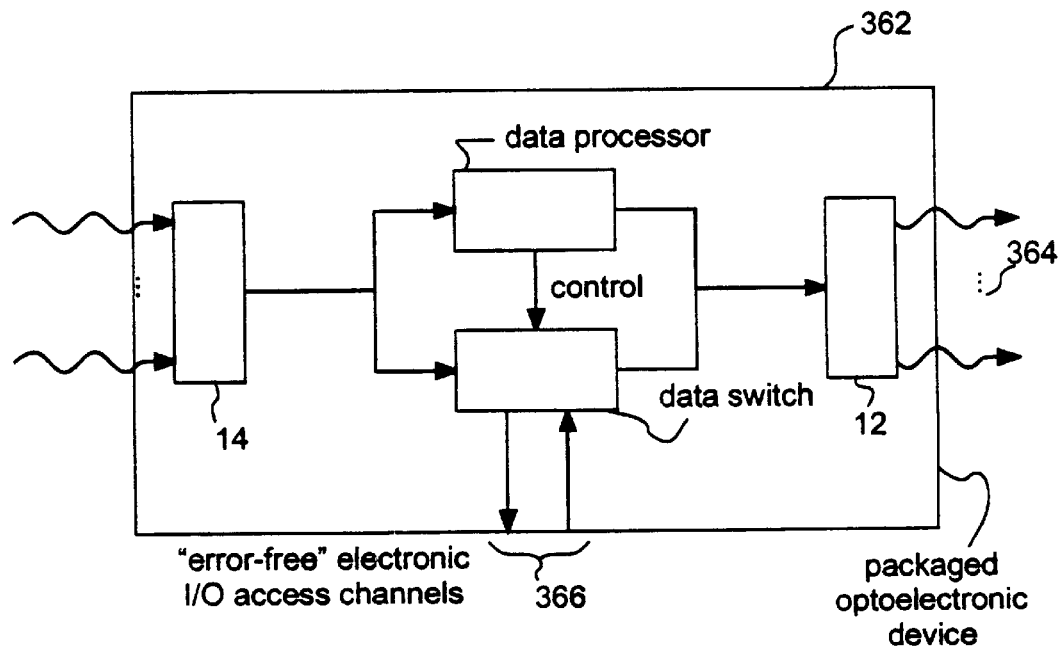
FIG. 40 illustrates the packaged optoelectronic device of FIG. 39, further comprising bandwidth enhancing optical receivers and optical transmitters. The electronic data supplied by these devices is effectively "error-free".

In one exemplary embodiment of the proposed invention, the device 360 of FIG. 39 can by modified to include an exemplary optical transmitter 12 and optical receiver 14, as illustrated in exemplary device 362 in FIG. 40. Otherwise the functionality of the device remains as specified in U.S. Pat. No. 6,016,211. Data is processed by processor 365 and data is switched by switch 367. In this embodiment, control signals sent over the reverse channel 18 in FIG. 1 are multiplexed onto the forward channel 364 on the right side of FIG. 40. The data processor in FIG. 40 filters all incoming packets, examining the packet headers and looking for packets addressed to itself, including control packets, as specified in U.S. Pat. No. 6,016,211.

This embodiment would provide a guaranteed arbitrarily low BER on the data stream received over the electronic I/O access channels 366. BERs as low as one billionth of today's prevalent BERs can be achieved. BERs as low as $10^{-30}$ can be specified. Furthermore, it is expected that substantial data rate increases will also be achieved over the optical data links by exploiting the proposed invention.

This embodiment would allow the device in FIG. 40 to be connected directly to the central processing unit (CPU) of a computer system, bypassing the protocol stack associated with typical computer communications. The CPUs of existing computers universally assume that all data exchanged to and from the CPU is error-free. In existing CPUs, whenever a bit error is detected in data received by the CPU, the CPU enters a TRAP routine and effectively ceases execution (i.e., it "crashes" in lay terminology). In the exemplary embodiment in FIG. 40, the proposed device can be directly connected to the CPU, and the protocol stack can be bypassed, since the data passing through the electronic I/O access channels of the device can be viewed as error-free, to any level of confidence. Our analysis indicates that a BER of $10^{-30}$ should be sufficiently low to allow a computer to operated for years before an undetected bit error occurs.

Figure 41:
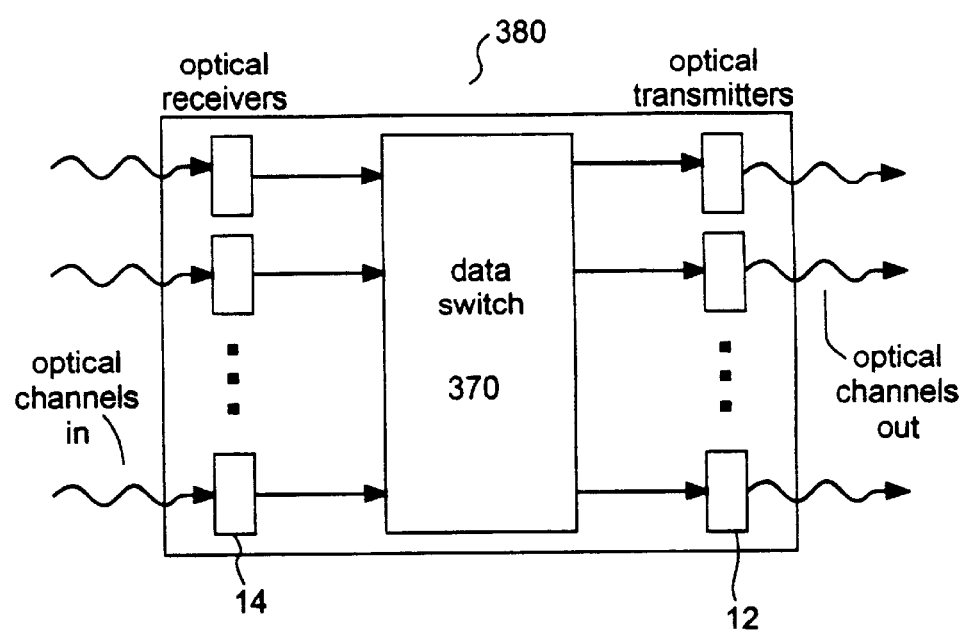
FIG. 41 illustrates an optoelectronic switching device, with bandwidth enhancing optical receivers and optical transmitters.

An alternative exemplary embodiment is shown in FIG. 41. This optoelectronic device 380 consists of several incoming optical channels coupled to several exemplary optical receivers 14. The received data is processed and switched by data switch 370. The switched data is then transmitted by exemplary optical transmitters 12. By incorporating the FEC and retransmission protocols and their hardware embodiments described previously, the aggregate data switching capacity of this device 380 will be increased considerably. Alternatively, the power dissipation required to achieve a given data rate will be minimised.

Advantages and Benefits

The proposed transmitter, receiver and encoding and decoding schemes have modest hardware cost, and can be incorporated onto current CMOS integrated circuits with little overhead. These schemes allow for the creation of integrated optoelectronic data link controllers with a significant level of error processing at the lowest level of the protocol stack. BERs as low as one billionth of today's prevalent BERs (i.e., $10^{-30}$ compared to $10^{-12}$) can be achieved.

The proposed data link controller and encoding and decoding schemes allow for an increase in the data rate of thermal noise limited optical data links by factors of 10–100 times, while guaranteeing that the BER on the decoder data is below an arbitrary and specifiable threshold.

The proposed data link controller and encoding and decoding schemes allows for a reduction in optical transmitter power to achieve a comparable bit error rate and throughput over an unencoded link.

The proposed FEC encoding and decoding schemes allow for an increase in the distance between signal regenerators in long distance fiber optic networks. Typically signal power decreases with distance of fiber traversed, such that repeaters are required after every several hundred miles. The proposed encoding schemes can achieve the Terabit per second throughputs required by high speed bit serial links used in long distance communications, with relatively low hardware overhead.

The proposed pipelined cyclic BCH encoders and decoders allows a significant reduction in hardware over conventional forward error correcting codes, such as Reed-Solomon codes.

The proposed pipelined cyclic BCH encoders and decoders allows a significant reduction in processing time over conventional forward error correcting codes, such as Reed-Solomon codes. The degree of pipelining can be adjusted as required: a pipelined decoder for a (K,n) code may have K pipeline stages, or K/m or K*m pipeline stages, for integer m.

The proposed pipelined CRC encoders and decoders allows a significant increase in throughput over conventional bit-serial CRC processors. The degree of pipelining can be adjusted as required; a pipelined decoder for a (n,k) code may have n pipeline stages, or n/m or n*m pipeline stages.

The proposed circuits and encoding/decoding schemes are compatible with the packaged optoelectronic smart pixel arrays described in U.S. Pat. No. 6,016,211 by T. Szymanski & H. S. Hinton. Therefore, the schemes allows for high bandwidth and virtually error-free interconnections between remote optoelectronic integrated circuits, over fiber-based optical data links. The advantages of the optoelectronic devices in U.S. Pat. No. 6,016,211 are retained, with the added feature of virtually error-free operation, which allows the devices to be connected to secure parts of a computing system, bypassing the protocol stack.

The optoelectronic devices can be optically interconnected using relatively standard optical techniques such as the use of 1 dimensional and 2 dimensional fiber bundles, and 2 dimensional fiber image guides. Processing modules which are physically separated meters apart can be interconnected using the proposed devices with a optical data links over 1 or 2 dimensional fiber ribbons.

As should now be appreciated use of system 10 may eliminate the need for any further error control to be performed, in higher levels of any protocol stack used in association with the link 16. Because of the exceptionally low error rates which can be achieved, received data can be viewed as "error-free"; external electronic processing modules can use this data with the same confidence as they use data from any other error-free electronic IC. As such large scale computing systems using system 10 may not need not maintain a protocol stack to process data received over link 16. This, in turn may save considerable expense and improve the speed of operation of the computing system substantially by eliminating unnecessary data transfers between unnecessary integrated circuits.

System 10 may be used to form a very high bandwidth optical interconnect in a computing system, with bandwidth increases over conventional interconnects. Moreover, such interconnects may also be viewed as virtually error-free. Such high bandwidth links can, for example, reside between the microprocessor and computer memory. The data from these links could be exchanged directly between the microprocessor and the computer memory, since the data can be treated as error free. Usually, network data is received in a computer system over its Input/Output (I/O) bus, where it is processed by the protocol stack to ensure that it is error-free. The proposed data link controller eliminates the need to transmit and receive data over the network I/O bus.

The ability of the proposed data link controller to process Terabits/sec of data will improve the performance of large parallel computing systems. Currently, many critical basic functions are implemented in hardware in a large computing system to improve the performance. Such functions include data transfer acknowledgment, synchronization primitives, resource allocation, flow control and error control, and media access control. All of these critical functions can be implemented in optoelectronic devices for intelligent optical interconnects as described in the U.S. patent by Szymanski and Hinton, and can use the optical data link controller proposed herein to improve the bandwidth substantially, while also providing a guaranteed bit error rate.

System 10 may further be used in the creation of new optoelectronic functional modules which process error-free data, and which are connected directly to a CPU or computer memory systems, bypassing the conventional protocol stack and conventional I/O through the I/O bus. By including new functions directly into optoelectronic devices which communicate using the proposed error free optical data links, with clock rates faster than with prior systems, the performance of the computing system will increase. Such functions may include error-free synchronization or error-free direct memory access between remote systems.

The proposed controller allows for creation of a new functional module which performs error-free distributed shared memory cache systems over remote memory, with clock rates faster than with prior systems, and which is connected directly to the CPU or computer memory systems, bypassing the conventional protocol stack and conventional I/O through the I/O bus. Shared memory cache functions are very important in large computer systems.

The above described embodiments are intended to be illustrative only, and in no way limiting. The embodiments are susceptible to many modifications of form, size, arrangement of parts and details of operation. The invention, rather, is intended to encompass all such modifications within its scope as defined by the claims.

What is claimed, is:

1. A high-speed pipelined forward error correcting (FEC) encoder, for encoding k bit blocks of data into n bit blocks, each of said n bit blocks comprising one of said k bit blocks of data and (n−k) parity bits, said encoder comprising Q latches, wherein $Q \geq 3$;

Q−1 combinational logic circuits, each of said combinational logic circuits interconnected between two of said latches, to receive an input of at least k bits from an upstream one of said latches, and provide an output of n bits to a downstream one of said latches, each output comprising (n−k) output bits representing said (n−k) parity bits in various stages of computation, each of said combinational logic circuits arranged to compute said (n−k) output bits in accordance with a defined generator polynomial, with said defined generator polynomial being identical for each of said combinational logic circuits.

2. The encoder of claim 1, wherein said defined generator polynomial is a generator polynomial for a cyclic code.

3. The encoder of claim 2, wherein said defined generator polynomial is a generator polynomial for a Reed-Solomon code.

4. The encoder of claim 1, wherein said defined generator polynomial generates one of a cyclic BCH code, or a cyclic Hamming code.

5. The encoder of claim 4, wherein said defined generator polynomial is a generator polynomial for one of a (7,4) Hamming code, a (15,11) Hamming code, a (15,7,2) Hamming code, a (15,7,2) BCH code, a (15,5,3) BCH code, a (31,16) BCH code, a (31,11) BCH code, a (23,12) Golay code.

6. The encoder of claim 1, wherein said FEC code is one of a (15,7), (15,5), (31,16), (63,48), (63,51), (63,45), (63,42), (63,37), (63,13), (127,113), (127,99), (127,106), and (127,64) majority-logic decodable cyclic FEC code.

7. A method of encoding k bit blocks of data into n bit blocks, each of said n bit blocks comprising one of said k bit blocks of data and (n−k) parity bits, said method comprising providing said k bits to a first latch,
feeding said k bits through Q−1 pipeline stages, with each of said pipeline stages,
receiving at least k bits;
computing (n−k) output bits representing said (n−k) parity bits in various stages of computation, in accordance with a defined generator polynomial, with said defined generator polynomial being identical for each of said pipeline stages;
latching its (n−k) output bits;
providing its (n−k) output bits.

8. A high-speed pipelined forward error correcting encoder, for encoding k bit blocks of data into n bit blocks, each of said n bit blocks comprising one of said k bit blocks of data and (n−k) parity bits, said encoder comprising
Q latches, $Q \geq 3$;
Q−1 combinational logic circuits, each of said combinational logic circuits interconnected between two of said latches, to receive an input of at least said k data bits from an upstream one of said latches, and provide an output comprising said k data bits and at least one additional bit representing said (n−k) parity bits in various stages of computation, to a downstream one of said latches;
wherein said Q−1 combinational logic circuits are arranged to compute said (n−k) parity bits in Q−1 stages.

9. The encoder of claim 8, wherein said Q−1 combinational logic circuits are arranged to calculate parity bits for one of a Cyclic BCH code, or a Cyclic Hamming code.

10. An optical transmitter comprising
a pipelined FEC encoder as claimed in claim 9, for receiving data and providing an FEC encoded serial output stream of said n bit bocks;
an optical generator for generating at least one optical signal corresponding to said FEC encoded serial output stream for transmission across an optical link and receipt as at least one received optical signal, said optical generator operating at a clock rate in excess of a nominal rate that causes errors to be introduced into said at least one received optical signal, at a rate in excess of a first bit error rate (BER), but that are correctable using said FEC code so that data may be received at a rate in excess of said nominal rate with less than a second BER.

11. The optical transmitter of claim 10, wherein said pipelined FEC encoder and said optical generator are contained on a single integrated circuit substrate, and wherein said optical generator is one of a vertical cavity surface emitting laser or a light emitting diode.

12. The optical transmitter of claim 10, wherein said optical generator operates so that said first BER is greater than $10^{-4}$ and said second BER is lower than $10^{-12}$.

13. The encoder of claim 8, wherein said Q−1 combinational logic circuits are arranged to calculate parity bits for one of a (7,4) Hamming code, a (15,11) Hamming code, a (15,7,2) Hamming code, a (15,7,2) BCH code, a (15,5,3) BCH code, a (31,16) BCH code, a (31,11) BCH code, a (23,12) Golay code.

14. An optical transmitter comprising
a pipelined FEC encoder as claimed in claim 8, for receiving data and providing an FEC encoded serial output stream of said n bit bocks;
an optical generator for generating at least one optical signal corresponding to said FEC encoded serial output stream for transmission across an optical link and receipt as at least one received optical signal, said optical generator operating at a clock rate in excess of a nominal rate that causes errors to be introduced into said at least one received optical signal, at a rate in excess of a first bit error rate (BER), but that are correctable using said FEC code so that data may be received at a rate in excess of said nominal rate with less than a second BER.

15. The optical transmitter of claim 14, wherein said pipelined FEC encoder and said optical generator are contained on a single integrated circuit substrate.

16. The optical transmitter of claim 15, wherein said optical link is one of a parallel fiber array, a parallel fiber ribbon, a fiber image guide and free space.

17. The optical transmitter of claim 16, wherein said optical generator comprises one of a vertical cavity surface emitting laser a light emitting diode.

18. The optical transmitter of claim 14, wherein said optical generator operates so that said first BER is greater than $10^{-7}$ and said second BER is lower than $10^{-12}$.

19. The optical transmitter of claim 14, wherein said parameter n is less than 128.

20. The optical transmitter of claim 14, wherein said optical generator generates said optical signals at a power level at its operating clock rate, so that said errors are introduced into said at least one received optical signal, at a rate in excess of said first bit error rate (BER).

21. An opto-electronic integrated circuit comprising at least two optical transmitters, each as claimed in claim 14, formed on a single integrated circuit substrate.

22. An optical transmitter comprising
a plurality of pipelined FEC encoders each as claimed in claim 8, for receiving data and providing FEC encoded serial output streams of said n bit blocks;
at least one optical generator for generating at least one optical signal corresponding to said FEC encoded serial output streams for transmission across an optical link and receipt as at least one received optical signal, said at least one optical generator operating at a clock rate that causes errors to be introduced into said at least one received optical signal, at a rate in excess of a first bit error rate (BER), but that are correctable using said FEC code so that data may be received with less than a second BER.

23. The optical transmitter of claim 22, wherein said plurality of pipelined FEC encoders and said at least one optical generator are contained on a single integrated circuit substrate.

24. The optical transmitter of claim 23, wherein said optical link is one of a parallel fiber array, a parallel fiber ribbon, a fiber image guide and free space.

25. The optical transmitter of claim 24, wherein said at least one optical generator comprises one of a vertical cavity surface emitting laser a light emitting diode.

26. The optical transmitter of claim 23, wherein said optical generator comprises one of a two dimensional array of vertical cavity surface emitting lasers or a two dimensional array of light emitting diodes and said optical link is one of a two dimensional parallel fiber array and a fiber image guide and free-space.

27. The optical transmitter of claim 23, wherein said plurality of pipelined FEC encoders are clocked at clock rates in excess of 500 MHz and wherein each one of said plurality of pipelined FEC encoders occupies less than 2 square millimeters of integrated circuit area.

28. A method of transmitting data across a data link with a less than nominal bit error rate (BER), comprising:

encoding said data using a pipelineable BCH forward error correction (FEC) code to form forward error correctable data;

transmitting said forward error correctable data within a bit stream across said link operating at a speed that introduces errors into said bit stream at a rate that is in excess of said nominal BER but allows for correction of errors within said forward error correctable data so that said data may be received with less than said nominal BER.

29. A transmitter for transmitting data across a data link with a less than nominal bit error rate (BER), comprising:

a forward error correcting (FEC) encoder for encoding said data using a pipelineable majority logic decodable code to form forward error correctable data;

an output stage for outputting said forward error correctable data within a bit stream across said link operating at a speed that introduces errors into said bit stream at a rate that is in excess of said nominal BER but allows for correction of errors within said forward error correctable data so that said data may be received with less than said nominal BER.

30. A pipelined FEC decoder for decoding k data bits from an n-bit block of bits, encoded with an (n,k) FEC code, said decoder comprising:

Q latches, $Q \geq 3$;

Q−1 combinational logic circuits, each of said combinational logic circuits interconnected between two of said latches, to receive an input of at least k bits representing said k data bits in various stages of decoding from an upstream one of said latches, and provide an output comprising k bits to a downstream one of said latches;

wherein said Q−1 combinational logic circuits are arranged to decode said k data bits in Q−1 stages.

31. The decoder of claim 30, wherein the (Q−1)th one of said Q−1 combinational logic circuits computes (n−k) bits indicative of the presence or absence of an uncorrectable error in said n bit block.

32. The decoder of claim 31, wherein each of the Q−1 combinational logic circuits calculates at least one of said (n−k) bits.

33. The decoder of claim 30, wherein said combinational logic circuits are arranged to decode one of a Cyclic BCH code and a Cyclic Hamming code.

34. The decoder of claim 33, wherein said Q−1 combinational logic circuits are arranged to decode said k data bits using one of a (7,4) Hamming code, a (15,11) Hamming code, a (15,7) Hamming code, a (15,7) BCH code, a (15,5) BCH code, a (31,16) BCH code, and a (31,11) BCH code.

35. The decoder of claim 34, wherein said Q−1 combinational logic circuits are arranged to decode said k data bits using one of a (7,4) Hamming code, a (15,11) Hamming code, a (15,7) Hamming code, a (15,7) BCH code, a (15,5) BCH code, a (31,16) BCH code, and a (31,11) BCH code.

36. An optical receiver for receiving a plurality of forward error correctable optical data streams, encoded using an (n,k) code, said receiver comprising:

an optical regenerator, for regenerating a serial electrical stream of at least one bit from an optical stream of at least one bit, said optical stream containing bit errors at a first bit error rate (BER), at least one pipelined FEC decoder as claimed in claim 33, coupled to said optical regenerator, for decoding said electrical stream into a plurality of k bit blocks using said (n,k) code, with a resulting final BER.

37. The optical receiver of claim 36, wherein said first BER is greater than $10^{-7}$ and said final BER is less than $10^{-12}$.

38. The optical receiver of claim 36, wherein said pipelined FEC decoder and said optical regenerator are contained on a single integrated circuit substrate.

39. The optical receiver of claim 36, wherein said pipelined FEC decoder and said optical regenerator are contained on a single integrated circuit substrate, and wherein said optical regenerator is one of a photodetector, a PIN diode photodetector and an MSM photodetector.

40. An optical receiver for receiving a forward error correctable optical data stream, encoded using an (n,k) code, said receiver comprising:

at least one optical regenerator for regenerating a serial electrical stream from said optical data stream, a pipelined FEC decoder as claimed in claim 30, coupled to said at least one optical regenerator, for decoding said stream in n bit blocks using said (n,k) code to form k bit data blocks.

41. An opto-electronic integrated circuit comprising a plurality of optical receivers as claimed in claim 40, formed on a single integrated circuit substrate.

42. The decoder of claim 40, wherein said defined FEC code is one of a (7,4) Hamming code, a (15,11) Hamming code, a (15,7) Hamming code, a (15,7) BCH code, a (15,5) BCH code, a (31,16) BCH code, and a (31,11) BCH code.

43. The optical receiver of claim 42, wherein said first BER is greater than $10^{-4}$ and said final BER is less than $10^{-12}$.

44. The optical receiver of claim 40, wherein said pipelined FEC decoder and said optical regenerator are contained on a single integrated circuit substrate, and wherein said regenerator comprises a two dimensional array of photodetectors.

45. An optical receiver for receiving a forward error correctable optical data stream, encoded using an (n,k) code, said receiver comprising:

an optical regenerator for regenerating a serial electrical stream from said optical data stream, a plurality of pipelined FEC decoders as claimed in claim 30, coupled to said optical regenerator, each for decoding a portion of said electrical stream in n bit blocks using said (n,k) code to form k bit data blocks.

46. The optical receiver of claim 45, wherein said plurality of pipelined FEC decoders are clocked at clock rates in excess of 500 MHz and wherein each one of said plurality of pipelined FEC decoders occupies less than two square millimeters on an integrated circuit.

47. A pipelined FEC decoder for decoding a k-bit datablock from an n-bit datablock encoded with an (n,k) majority-logic decodable FEC code, said decoder comprising:

Q stages of latches, each of said latches with n data bits,

Q−1 combinational logic circuits, each of said combinational logic circuits interconnected between two of said latches, to receive an input of at least k bits representing said k data bits in various stages of decoding from an upstream one of said latches, and provide an output comprising k bits to a downstream one of said latches;

wherein each of said Q−1 combinational logic circuits comprises a majority logic gate;

and wherein said Q−1 combinational logic circuits are arranged to decode said k data bits in Q−1 stages.

48. A pipelined FEC decoder for decoding a k-bit datablock from an n-bit datablock encoded with an (n,k) majority-logic decodable FEC code, said decoder comprising:

Q stages of latches, each of said latches with n data bits,

Q−1 combinational logic circuits, each of said combinational logic circuits interconnected between two of said latches, to receive an input of at least k bits representing said k data bits in various stages of decoding from an upstream one of said latches, and provide an output comprising k bits to a downstream one of said latches;

wherein when said Q−1 combinational logic circuits connected in series without said latches comprise at least one majority logic gate.

49. The decoder of claim 48, wherein said Q−1 combinational logic circuits are arranged to decode said k data bits using one of a (7,4) Hamming code, a (15,11) Hamming code, a (15,7) Hamming code, a (15,7) BCH code, a (15,5) BCH code, a (31,16) BCH code, a (31,11) BCH code.

50. An optical receiver for receiving a forward error correctable optical data stream, encoded using an (n,k) code, said receiver comprising:

at least one optical regenerator for regenerating a serial electrical stream from said optical data stream, a pipelined FEC decoder as claimed in claim 48, coupled to said at least one optical regenerator, for decoding said stream in n bit blocks using said (n,k) code to form k bit data blocks.

51. A optical communications system comprising:

a transmitter;

a receiver;

an optical link communicatively coupling said transmitter to said receiver;

said transmitter, comprising:
  a forward error correcting (FEC) encoder for encoding data using a pipelineable BCH error correcting code to form forward error correctable data;
  an output stage for outputting said forward error correctable data within a bit stream across said link, said output stage operating at a power and a speed in excess of a first nominal rate, so that errors are introduced in said stream and received at said receiver at a BER that is in excess of a nominal BER;

said receiver comprising
  a pipelined FEC decoder, operable to correct errors within said forward error correctable data from said receiver using said BCH error correcting code, received on said link so that said data may be received with less than said nominal BER, at a data rate above said first nominal rate, thereby increasing the capacity of said optical link at said power.

52. An optical transmitter comprising:

an input for receiving data to be transmitted, comprising:
  a buffer for buffering received data;
  a packet former for encoding data from said buffer into packets;
  a error detection (ED) encoder adding error detection codes to said packets, said error detection codes allowing detection of at least one error in a packet;
an electrical to optical (E/O) generator in communication with said ED encoder to receive data from said ED encoder and produce at least one optical output signal corresponding thereto for transmission across an optical link and receipt as at least one received optical signal, said optical generator operating at a clock rate in excess of a nominal clock rate, and at a power level that causes errors to be introduced into said at least one received optical signals that are in excess of a first bit error rate (BER); and a controller in communication with said buffer to cause retransmission of said retransmission blocks within said buffer in response to retransmission requests, so that data may be received at a data rate in excess of said nominal clock rate with less than a second BER.

53. The optical transmitter of claim 52, wherein said ED encoder and said E/O generator are contained on a single integrated circuit substrate.

54. The optical transmitter of claim 53, wherein said optical generator is one of a Vertical Cavity Surface Emitting Laser or a Light Emitting Diode.

55. The optical transmitter of claim 52, wherein said first BER is greater than $10^{-7}$ and said second BER is lower than $10^{-12}$.

56. An optical transmitter comprising:

an input for receiving data to be transmitted, comprising:

a buffer for buffering received data;

a packet former for encoding data from said buffer into packets, a plurality of error detection (ED) encoders adding error detection codes to said packets, said error detection codes allowing detection of at least one error in a packet;

at least one electrical to optical (E/O) generator in communication with said plurality of encoders to receive data from said encoders and produce at least one optical output signal corresponding thereto for transmission across an optical link and receipt as at least one received optical signal, each of said at least one optical generators operating at a nominal clock rate and at a power level that causes errors to be introduced into said received optical signals(s) that are in excess of a first bit error rate (BER); and a controller in communication with said buffer to cause retransmission of packets within said buffer in response to retransmission requests, so that data may be received with less than a second BER, at a data rate in excess of said nominal clock rate.

57. The optical transmitter of claim 56, wherein said plurality of ED encoders and said at least one optical generator are contained on a single integrated circuit substrate.

58. The optical transmitter of claim 57, wherein said plurality of optical generators is at least one of a Vertical Cavity Surface Emitting Laser array or a Light Emitting Diode array.

59. The optical transmitter of claim 58, wherein said first BER is greater than $10^{-7}$ and said second BER is lower than $10^{-12}$.

60. An optical receiver comprising:

an optical to electrical (O/E) regenerator, for receiving an optical stream from a transmitter and generating a corresponding electrical stream;

an error detection (ED) decoder for decoding data from said electrical stream generating a decoded data stream, and detecting errors in said decoded stream;

a retransmission request controller in communication with said ED decoder for generating retransmission requests for requesting retransmission of retransmission blocks to be retransmitted by said transmitter within said optical stream, wherein said regenerator, said decoder, said retransmission request controller are formed on a single integrated circuit.

61. An optical receiver comprising:

an optical to electrical (O/E) regenerator, for receiving an optical stream from a transmitter and generating a corresponding electrical stream, said optical stream containing bit errors at a first bit error rate (BER);

a pipelined error detection (ED) decoder for decoding data from said electrical stream generating a decoded data stream, and detecting errors in said decoded data stream;

a retransmission request controller in communication with said ED decoder for generating retransmission requests for requesting retransmission of retransmission blocks to be retransmitted by said transmitter within said optical stream, so that data may be received from said optical stream with a second BER, less than said first BER.

62. The optical receiver of claim 61, wherein said first BER is greater than $10^{-7}$ and said second BER is less than $10^{-12}$.

63. The optical receiver of claim 61, wherein said pipelined ED encoder and said optical generator are contained on a single integrated circuit substrate.

64. An optical transmitter comprising:

an input for receiving data to be transmitted;

a buffer for buffering received data;

a packet former for encoding data from said buffer into retransmission blocks, an error detection (ED) encoder adding error detection codes to said retransmission blocks, said ED codes allowing detection of at least one error in a retransmission block;

a forward error correction (FEC) encoder adding forward error correction codes to said retransmission blocks including said ED codes, said FEC codes allowing detection and correction of at least one error in a retransmission block;

an electrical to optical (E/O) converter in communication with said FEC encoder to receive said retransmission blocks including said ED codes and said FEC codes from said FEC encoder and produce an optical output corresponding thereto; and a controller in communication with said buffer to cause retransmission of said retransmission blocks in response to retransmission requests.

65. The optical transmitter of claim 64, wherein said ED encoder is pipelined and said FEC encoder is pipelined.

66. An optical transmitter comprising:

an input for receiving data to be transmitted;

a buffer for buffering received data;

a packet former for encoding data from said buffer into retransmission blocks, a pipelined error detection (ED) encoder adding error detection codes to said retransmission blocks, said error detection codes allowing detection of at least one error in a retransmission block;

a forward error correction (FEC) encoder adding forward error correction codes to said retransmission blocks including ED codes, said FEC codes allowing detection and correction of at least one error in a retransmission block;

an electrical to optical (E/O) generator in communication with said FEC encoder to receive retransmission blocks from said FEC encoder including FEC and ED codes and to produce at least one optical output signal corresponding thereto for transmission across an optical link and receipt as at least one received optical signal, said optical generator operating at a clock rate that causes errors to be introduced into said at least one received optical signal that are in excess of a first bit error rate (BER); and a controller in communication with said buffer to cause retransmission of said retransmission blocks in response to retransmission requests, so that data may be received with less than a second BER.

67. The optical transmitter of claim 66, further comprising a second error detection (ED) encoder operable to add a second error detection code within said optical output signal, said second detection code spreading over a plurality of said retransmission blocks to detect at least one error in said plurality of retransmission blocks.

68. The optical transmitter of claim 66, wherein said pipelined ED encoder, said pipelined FEC encoder and said optical generator are contained on a single integrated circuit substrate.

69. The optical transmitter of claim 68, wherein said optical generator is one of a Vertical Cavity Surface Emitting Laser or a Light Emitting Diode.

70. The optical transmitter of claim 66, wherein said first BER is greater than $10^{-7}$ and said second BER is lower than $10^{-12}$.

71. The optical transmitter of claim 66, wherein said FEC encoder comprises a majority logic decodable FEC code encoder.

72. The optical transmitter of claim 71, wherein said FEC encoder comprises a pipelined FEC encoder.

73. The optical transmitter of claim 66, wherein said generator comprises one of a plurality of light emitting diodes and a plurality of vertical cavity surface emitting lasers.

74. An optical receiver comprising:

an optical to electrical (O/E) regenerator, for receiving an optical stream from a transmitter and generating a corresponding electrical stream;

a forward error correction (FEC) decoder for decoding data from said electrical stream generating a first decoded data stream, an error detection (ED) decoder for decoding data from said first decoded data stream generating a second decoded data stream;

a retransmission request controller in communication with said ED decoder for generating retransmission requests for requesting retransmission of retransmission blocks to be retransmitted by said transmitter within said optical stream.

75. The optical receiver of claim 74, wherein said FEC decoder decodes a majority logic decodable FEC code.

76. An optical receiver comprising:

an optical to electrical (O/E) regenerator, for receiving an optical stream from a transmitter and generating a corresponding electrical stream, said optical stream containing bit errors at a first bit error rate (BER);

a forward error correction (FEC) decoder for decoding data from said electrical stream and generating a decoded data stream, an error detection (ED) decoder for decoding data from said first decoded data stream;

a retransmission request controller in communication with said ED decoder for generating retransmission requests for requesting retransmission of retransmission blocks to be retransmitted by said transmitter within said optical stream, so that data may be received from said optical stream at a second BER, less than said first BER.

77. The optical receiver of claim 76, wherein said electrical stream comprises a plurality of FEC encoded vectors each representing a data vector, and said ED decoder detects errors over a plurality of said data vectors.

78. The optical receiver of claim 76, wherein said FEC decoder comprises a majority logic decodable FEC decoder.

79. The optical receiver of claim 76, wherein said regenerator comprises a plurality of photodectors or PIN diodes.

80. The optical receiver of claim 76, wherein said first BER is greater than $10^{-7}$ and said second BER is lower than $10^{-12}$.

81. The optical receiver of claim 76, wherein said regenerator, said FEC decoder, said ED decoder and said controller are contained on a single integrated circuit substrate.

82. The optical receiver of claim 81, wherein said FEC decoder occupies less than two square millimeters on said integrated circuit substrate.

83. An opto-electronic switch formed on an integrated circuit substrate, comprising a plurality of optical receivers, each of said optical receivers comprising an optical regenerator in communication with a pipelined FEC decoder for decoding a received data stream;

a plurality of optical transmitters, each of said transmitters comprising: an optical generator and a pipelined forward error correcting code (FEC) encoder, for encoding an output datastream to include FEC codes, a electric switch fabric in communication with said plurality of receivers and said plurality of transmitters, to switch FEC decoded data from selected ones of said receivers to selected ones of said transmitters, for transmission as FEC encoded data.

84. The opto-electronic switch of claim 83, further wherein each of said FEC encoders encodes, and each of said FEC decoders decodes using a majority logic decodable FEC code.

* * * * *